US010285513B2

(12) United States Patent
Lee

(10) Patent No.: US 10,285,513 B2
(45) Date of Patent: May 14, 2019

(54) REFRIGERATOR

(71) Applicant: LG Electronics Inc., Seoul (KR)

(72) Inventor: Sangmyung Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/838,534

(22) Filed: Dec. 12, 2017

(65) Prior Publication Data

US 2018/0160824 A1 Jun. 14, 2018

(30) Foreign Application Priority Data

Dec. 12, 2016 (KR) ........................ 10-2016-0169002

(51) Int. Cl.

| | |
|---|---|
| ***H05K 7/00*** | (2006.01) |
| ***A47F 3/04*** | (2006.01) |
| ***F25D 23/02*** | (2006.01) |
| ***F25D 27/00*** | (2006.01) |
| ***F25D 11/00*** | (2006.01) |
| *F25D 23/04* | (2006.01) |

(52) U.S. Cl.

CPC ............ *A47F 3/0434* (2013.01); *F25D 11/00* (2013.01); *F25D 23/025* (2013.01); *F25D 23/028* (2013.01); *F25D 27/00* (2013.01); *F21V 2200/20* (2015.01); *F25D 23/04* (2013.01); *F25D 2400/361* (2013.01); *F25D 2400/40* (2013.01); *F25D 2700/04* (2013.01)

(58) Field of Classification Search

CPC ................................................. G02F 1/133377

See application file for complete search history.

(56) References Cited

U.S. PATENT DOCUMENTS

2014/0078407 A1* 3/2014 Green ........................ G09F 9/35 348/836
2014/0144083 A1 5/2014 Artwohl et al.
2015/0276302 A1* 10/2015 Roh .................. G02F 1/133377 62/56
2015/0362792 A1 12/2015 Dunn et al.

FOREIGN PATENT DOCUMENTS

DE 202016103026 7/2016
EP 3053487 8/2016

OTHER PUBLICATIONS

European Extended Search Report in European Application No. 17204373.9, dated May 8, 2018, 11 pages.

* cited by examiner

*Primary Examiner* — Jerry Wu
(74) *Attorney, Agent, or Firm* — Fish & Richardson P.C.

(57) ABSTRACT

A refrigerator includes a cabinet, a door, the door, and a transparent display covering an opening of the door through which an inner space of the refrigerator is visible. The transparent display assembly includes a front panel, a rear panel, an outer spacer defining a circumferential surface of the transparent display assembly and a sealed space between the front panel and the rear panel, a display disposed inside the sealed space, a light guide plate, a display light configured to emit light to an end of the light guide plate, and a first spacer mounted on a rear surface of the front panel and configured to support the light guide plate and maintain a predetermined distance between the light guide plate and the front panel.

20 Claims, 40 Drawing Sheets

REFRIGERATOR

CROSS-REFERENCE TO RELATED APPLICATIONS

The present application claims priority under 35 U.S.C. 119 and 35 U.S.C. 365 to Korean Patent Application No. 10-2016-0169002 (Dec. 12, 2016), which is hereby incorporated by reference in its entirety.

BACKGROUND

The present disclosure relates to a refrigerator.

In general, refrigerators are home appliances for storing foods at a low temperature in a storage space that is covered by a door. For this, refrigerators cool the inside of the storage space by using cool air generated by being heat-exchanged with a refrigerant circulated through a refrigeration cycle to store foods in an optimum state.

In recent years, refrigerators tend to increase in size more and more, and multi-functions are applied to refrigerators as dietary life changes and high-quality is pursued, and accordingly, refrigerators of various structures for user convenience and efficient use of an internal space are being brought to the market.

A storage space of such a refrigerator may be opened and closed by a door. Also, refrigerators may be classified into various types according to an arranged configuration of the storage space and a structure of the door for opening and closing the storage space.

Generally, the refrigerator has a limitation that foods stored therein are not confirmed unless the door is not opened. That is, the door has to be opened to confirm that a desired food is stored in the refrigerator or in a separate storage space provided in the door. In addition, if the stored position of the food is not known precisely, an opened time of the door may increase, or the number of times for opening the door increases. In this case, there is a limitation that unnecessary leakage of cool air occurs.

In recent years, to solve such a limitation, a refrigerator has been developed while allows a portion of a door thereof to be transparent or allows the inside thereof to be seen from the outside.

SUMMARY

Embodiments provide a refrigerator in which at least a portion of a refrigerator door is selectively transparent by user's manipulation to allow the user to see the inside of the refrigerator even though the refrigerator door is closed, and simultaneously, to selectively output a screen.

Embodiments also provide a refrigerator in which a see-through part constituting a portion of a door is capable of being transparent or opaque or outputting a screen according to selective turn-on/off of a door light or a display light.

Embodiments also provide a refrigerator in which a PCB and a cable connected to the PCB are disposed in a door, which is capable of seeing through the inside of the refrigerator by a transparent display assembly, without being exposed through the transparent display.

Embodiments also provide a refrigerator that is capable of having a stable support structure even though a light guide plate is deformed.

Embodiments also provide a refrigerator having a structure in which prevents scratches from occurring in a surface of a light guide plate even though the light guide plate is expanded and contracted to prevent light guide performance from being deteriorated.

Embodiments also provide a refrigerator in which direct heat transfer to a light guide plate is blocked to minimize thermal deformation of the light guide plate.

Embodiments also provide a refrigerator in which a mounted position of a light guide plate is maintained by a spacer.

In one embodiment, a refrigerator includes: a refrigerator includes: a cabinet defining a storage space; a door opening and closing the cabinet; and a transparent display assembly which covers an opening of the door and through which an inner space of the refrigerator is seen, wherein the transparent display assembly includes: a front panel defining at least a portion of a front surface of the door; a rear panel defining at least a portion of a rear surface of the door; an outer spacer defining a circumferential surface of the transparent display assembly and having both ends coming into contact with the front panel and the rear panel to provide a sealed space between the front panel and the rear panel; a display disposed inside the sealed space; a light guide plate disposed to be spaced apart from the display inside the sealed space; a display light emitting light to an end of the light guide plate; and a first spacer mounted on the rear surface of the front panel to support the light guide plate so as to allow the light guide plate to be maintained at a predetermined distance from the front panel.

A support member defining a surface coming into contact with the light guide plate may be provided on the first spacer.

The support member may be made of a material having hardness less than that of the light guide plate.

The support member may be made of a thermal insulation material.

The first spacer may be provided in a pair on both left and right sides of the light guide plate, a light guide plate seating part on which the support member is disposed to respectively support both left and right ends of the light guide plate may be disposed on the pair of first spacers, and a light guide plate support part protruding inward to support upper and lower ends of the light guide plate may be disposed on each of upper and lower ends of the outer spacer.

The light guide plate support part may have the same height as the light guide plate seating part to support a circumference of the light guide plate at the same time.

The display light may be mounted on an inner surface of the outer spacer and disposed on the same extension line as the end of the light guide plate.

The support member may further include the light guide plate support part.

The first spacer may extend from an upper end to a lower end of the inside of the outer spacer.

The first spacer may be spaced apart from the outer spacer, and a source board connected to the display may be disposed to be perpendicular to the front panel between the first spacer and the outer spacer.

A wire connecting the display to the source board may pass between the front panel and an adhesion member of the outer spacer.

The first spacer may include: a light guide plate seating part on which the end of the light guide plate is seated; and a stop rib protruding from an outer end of the light guide plate seating part in a direction crossing the light guide plate to restrict transversal movement of the light guide plate.

The stop rib may protrude at a position spaced apart from the end of the light guide plate to correspond to deformation of the light guide plate.

The refrigerator may further include a display accommodation groove in which one surface facing the front panel is stepped to accommodate an outer end of the display.

The first spacer may include: a side part supporting each of both left and right ends of the light guide plate; and upper and lower parts connecting an upper end to the lower end of the side part to support upper and lower ends of the light guide plate, wherein a support member providing a surface coming into contact with the light guide plate may be disposed along the side part and the upper and lower parts.

The display light may be mounted on one surface of the outer spacer, which is disposed to be spaced apart from the upper and lower parts, to face the end of the light guide plate supported by the upper and lower parts.

The refrigerator may further include a second spacer disposed between the rear panel and the light guide plate and provided along a circumference of the light guide plate to maintain a distance between the rear panel and the light guide plate.

A support member providing a surface coming into contact with the light guide plate may be disposed on one end of each of the first and second spacers, and an adhesion member adhering to the rear panel may be disposed on the other end of the second spacer.

Both ends of the outer spacer may be mounted on the front panel and the rear panel, respectively, and the support members of the first and second spacers may press and support the light guide plate in opposite directions.

A space between the rear panel and the light guide plate may be sealed by the second spacer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. The invention may, however, be embodied in many different forms and should not be construed as being limited to the embodiments set forth herein; rather, that alternate embodiments included in other retrogressive inventions or falling within the spirit and scope of the present disclosure will fully convey the concept of the invention to those skilled in the art.

Figure 1:
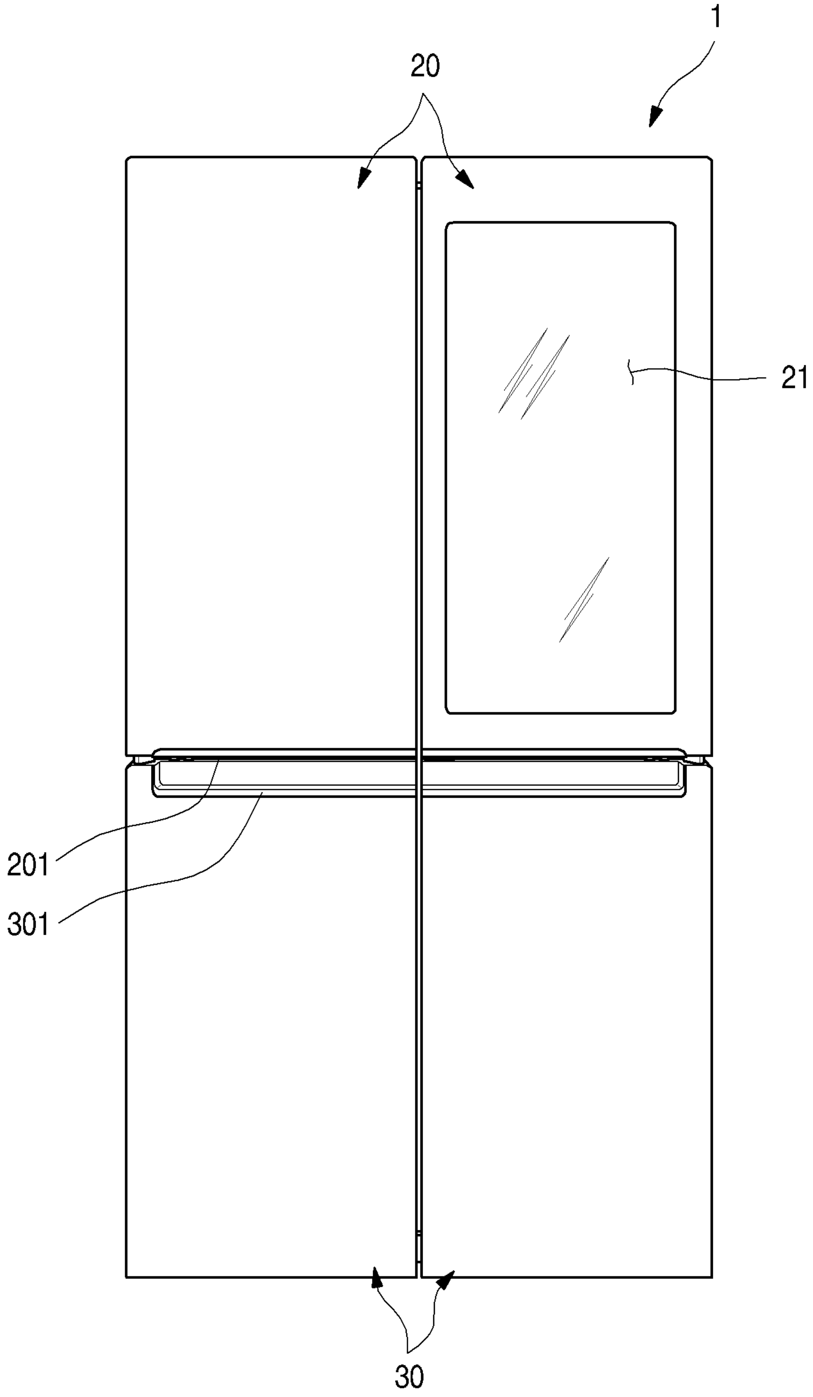
FIG. 1 is a front view of a refrigerator according to a first embodiment.

FIG. 1 is a front view of a refrigerator according to a first embodiment. Also, FIG. 2 is a perspective view of the refrigerator.

Figure 2:
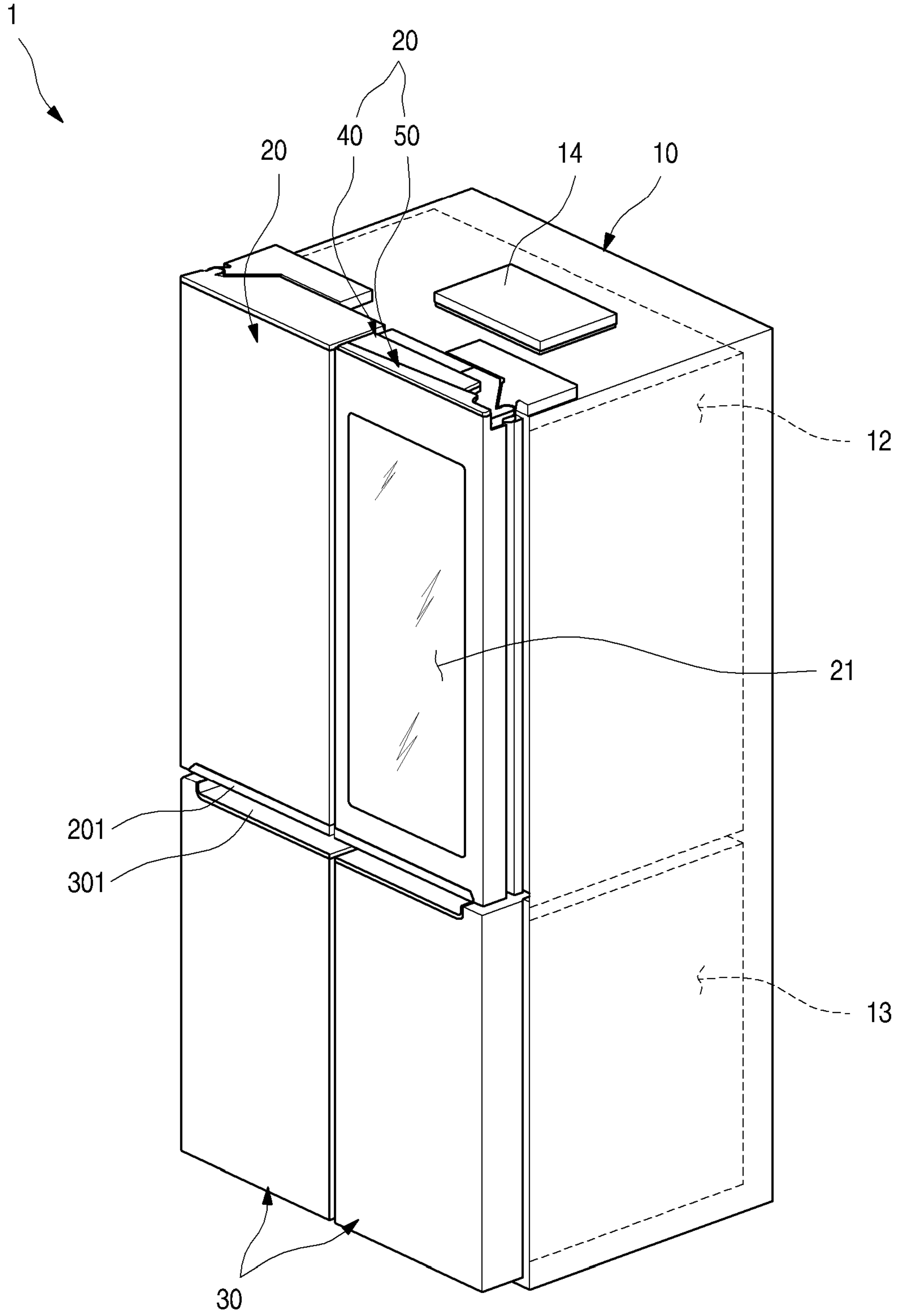
FIG. 2 is a perspective view of the refrigerator.

Referring to FIGS. 1 and 2, a refrigerator 1 according to a first embodiment includes a cabinet 10 defining a storage space and a door that opens or closes the storage space. Here, an outer appearance of the refrigerator 1 may be defined by the cabinet 10 and the door.

Figure 11:
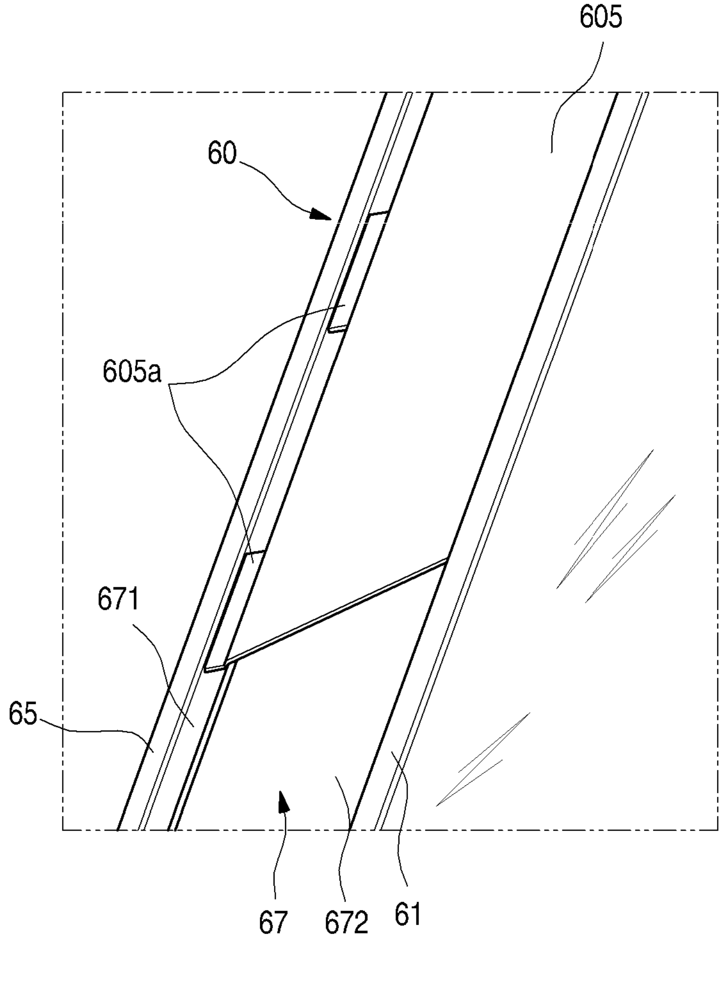
FIG. 11 is a partial perspective view illustrating an arranged state of a display cable of the transparent display assembly.

The inside of the cabinet 10 is partitioned into upper and lower portions by a barrier (see FIG. 11). A refrigerating compartment 12 may be defined in the upper portion of the cabinet 10, and a freezing compartment 13 may be defined in the lower portion of the cabinet 10.

Also, a control unit 14 for controlling an overall operation of the refrigerator 1 may be disposed on a top surface of the cabinet 10. The control unit 14 may be configured to control a cooling operation of the refrigerator as well as electric components for selective see-through and screen output of a see-through part 21.

The door may include a refrigerating compartment door and a freezing compartment door 30. The refrigerating compartment door 20 may be opened and closed by rotating an opened front surface of the refrigerating compartment 12, and the freezing compartment door 30 may be switched by rotating an opened front surface of the freezing compartment 13.

Also, the refrigerating compartment door 20 may be provided in a pair of left and right doors. Thus, the refrigerating compartment 12 is covered by the pair of doors. The freezing compartment door 30 may be provided in a pair of left and right doors. Thus, the freezing compartment 13 may be opened and closed by the pair of doors. Alternatively, the freezing compartment door 30 may be withdrawable in a draw type as necessary and provided as one or more doors.

Although a refrigerator in which, a French type door in which a pair of doors rotate to open and close one space is applied to a bottom freezer type refrigerator in which the freezing compartment 13 is provided at a lower portion, is described as an example in this embodiment, the present disclosure may be applied to all types of refrigerators including door without being limited to shapes of the refrigerators.

Also, recessed handle grooves 201 and 301 may be provided in a lower end of the refrigerating compartment door 20 and an upper end of the freezing compartment door 30. A user may insert a his/her hand into the handle groove 201 or 301 to open and close the refrigerating compartment door 20 or the freezing compartment door 30.

At least one door may be provided so that the inside of the refrigerator is seen through the door. A see-through part 21 that is an area, through which the storage space in the rear surface of the door and/or the inside of the refrigerator are seen, may be provided in the refrigerating compartment door 20. The see-through part 21 may constitute at least a portion of a front surface of the refrigerating compartment door 20. The see-through part 21 may be selectively transparent or opaque according to user's manipulation. Thus, foods accommodated in the refrigerator may be accurately identified through the see-through part 21.

Also, although the structure in which the see-through part 21 is provided in the refrigerating compartment door 20 is described as an example in this embodiment, the see-through part 21 may be provided in different types of refrigerator doors such as the freezing compartment door 30 according to a structure and configuration of the refrigerator.

Figure 3:
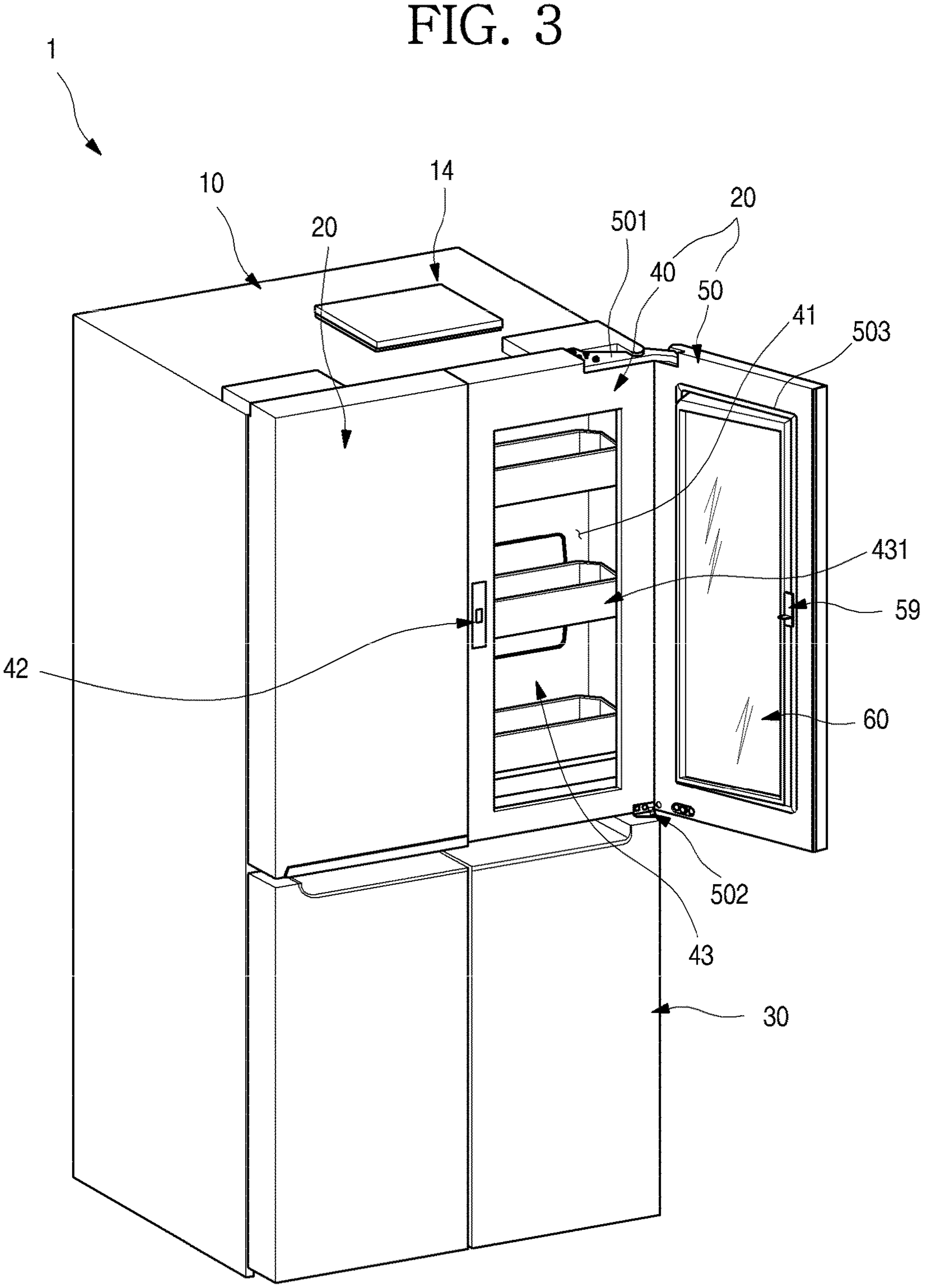
FIG. 3 is a perspective view of the refrigerator with a sub door opened.

FIG. 3 is a perspective view of the refrigerator with a sub door opened. Also, FIG. 4 is a perspective view of the refrigerator with a main door opened.

Figure 4:
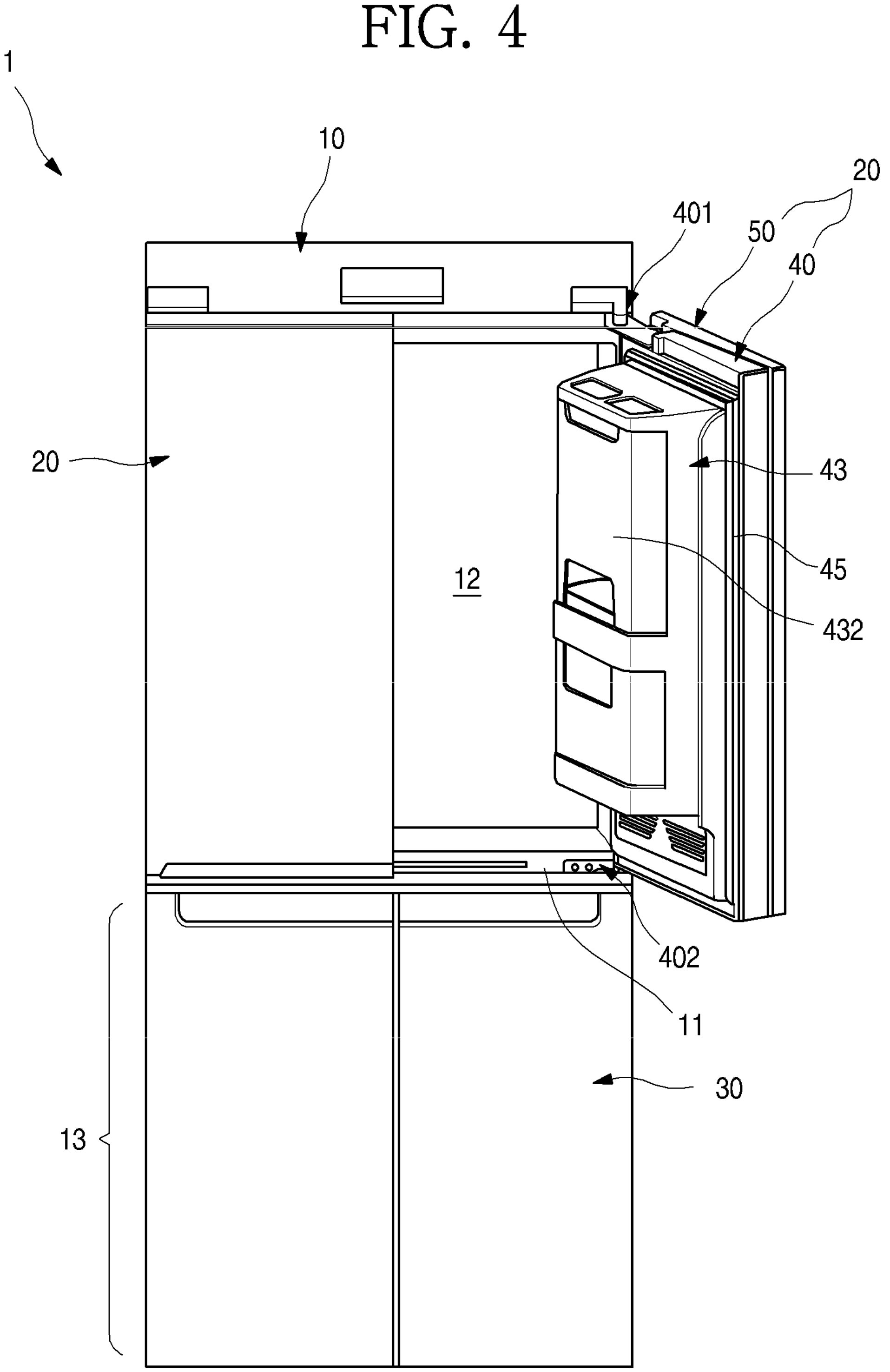
FIG. 4 is a perspective view of the refrigerator with a main door opened.

As illustrated in FIGS. 3 and 4, the refrigerating compartment door 20, which is disposed at the right side (when viewed in FIG. 3), of the pair of refrigerating compartment doors 20 may be doubly opened and closed. In detail, the refrigerating compartment door 20, which is disposed at the right side, may include a main door 40 that opening and closing the refrigerating compartment 12 and a sub door 50 rotatably disposed on the main door 40 to open and close an opening defined in the main door 40.

The main door 40 may have the same size as that of the refrigerating compartment door 20, which is disposed at the left side (when viewed in FIG. 1), of the pair of refrigerating compartment doors 20. The main door 40 may be rotatably mounted on the cabinet 10 by an upper hinge 401 and a lower hinge 402 to open at least a portion of the refrigerating compartment door 20.

Also, an opening 41 that is opened with a predetermined size is defined in the main door 40. A door basket 431 may be mounted on the rear surface of the main door 40 as well as the inside of the opening 41. Here, the opening 41 may have a size that occupies most of the front surface of the main door 40 except for a portion of a circumference of the main door 40.

Also, a main gasket 45 may be disposed on a circumference of the rear surface of the main door 40 to prevent cool air within an internal space of the cabinet 10 from leaking when the main door 40 is opened.

The sub door 50 may be rotatably mounted on the front surface of the main door 40 to open and close the opening 41. Thus, the sub door 50 may be opened to expose the opening 41.

The sub door 50 may have the same size as the main door 40 to cover the entire front surface of the main door 40. Also, when the sub door 50 is closed, the main door 40 and the sub door 50 may be coupled to each other to provide the same size and configuration as those of the left refrigerating compartment door 20. Also, a sub gasket 503 may be disposed on the rear surface of the sub door 50 to seal a gap between the main door 40 and the sub door 50.

A transparent display assembly 60 that selectively sees the inside and outputs a screen may be disposed at a center of the sub door 50. Thus, even though the sub door 50 is closed, the inside of the opening 41 may be selectively seen, and also an image inside the opening 41 may be outputted. The see-through part 21 may be a portion of the sub door 50, through which the inside of the refrigerator 1 is seen. However, the see-through part 21 may not necessarily match the entirety of the transparent display assembly 60.

The transparent display assembly 60 may be configured to be selectively transparent or opaque according to user's manipulation. Thus, only when the user desires, the transparent display assembly 60 may be transparent so that the inside of the refrigerator 1 is visualized, otherwise, be maintained in the opaque state. Also, the transparent display assembly 60 may output a screen in the transparent or opaque state.

A sub upper hinge 501 and a sub lower hinge 502 may be respectively provided on upper and lower ends of the sub door 50 so that the sub door 50 is rotatably mounted on the front surface of the main door 40. Also, an opening device 59 may be provided on the sub door 50. A locking unit 42 may be provided on the main door 40 to correspond to the opening device 59. Thus, the sub door 50 may be maintained in the closed state by the coupling between the opening device 59 and the locking unit 42. When the coupling between the opening device 59 and the locking unit 42 is released by manipulation of the opening device 59, the sub door 50 may be opened with respect to the main door 40.

Also, a damping device 504 may be provided on a lower end of the sub door 50. The damping device 504 may be disposed on edges of the lower end and lateral end of the sub door 50, which are adjacent to the sub lower hinge 502, so that an impact is damped when the sub door 50 having a relatively heavy weight by the transparent display assembly 60 is closed.

An accommodation case 43 may be provided in the rear surface of the main door 40. A plurality of door baskets 431 may be disposed on the accommodation case 43, and a case door 432 may be provided on the accommodation case 43.

Figure 5:
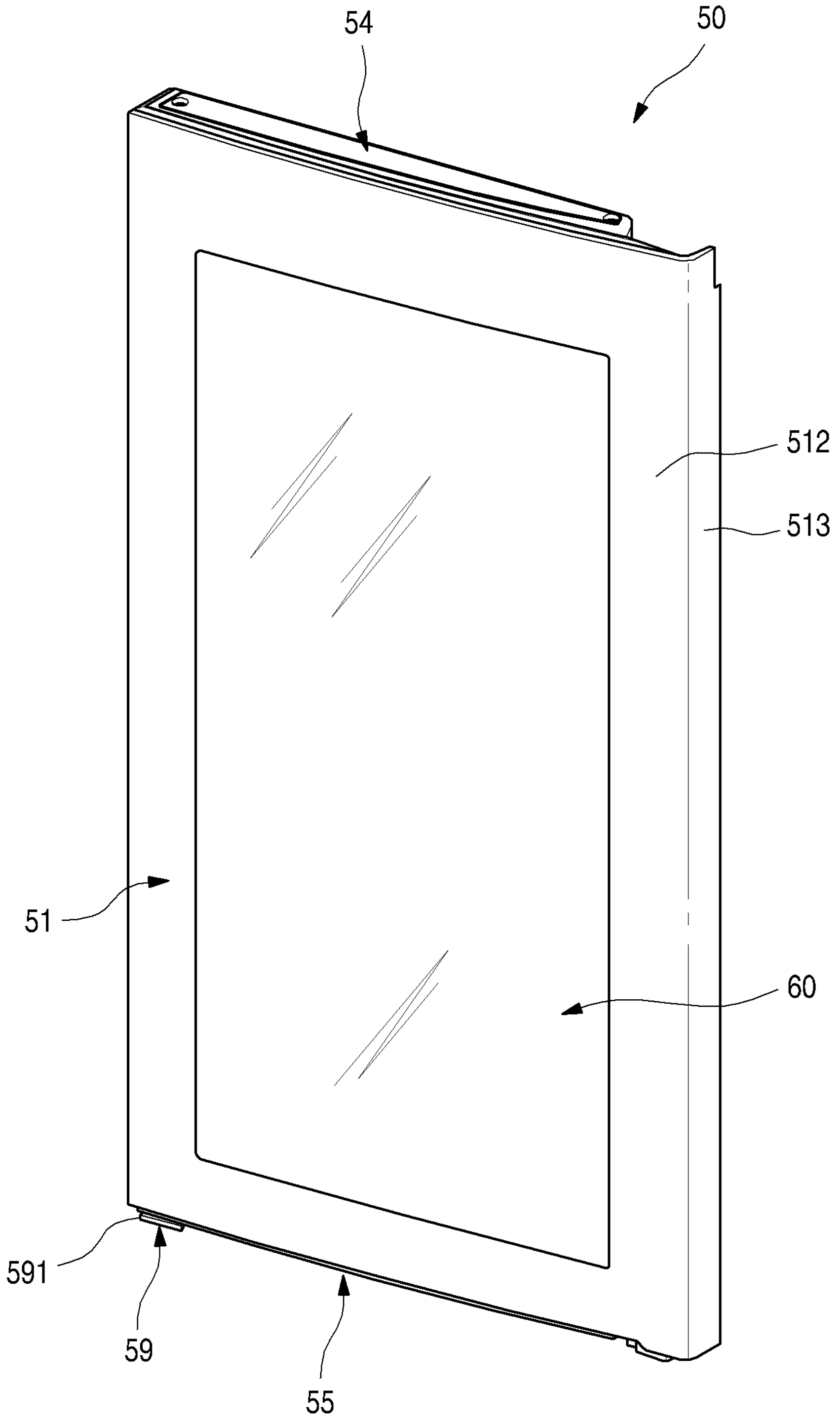
FIG. 5 is a perspective view of the sub door when viewed from a front side.
Figure 6:
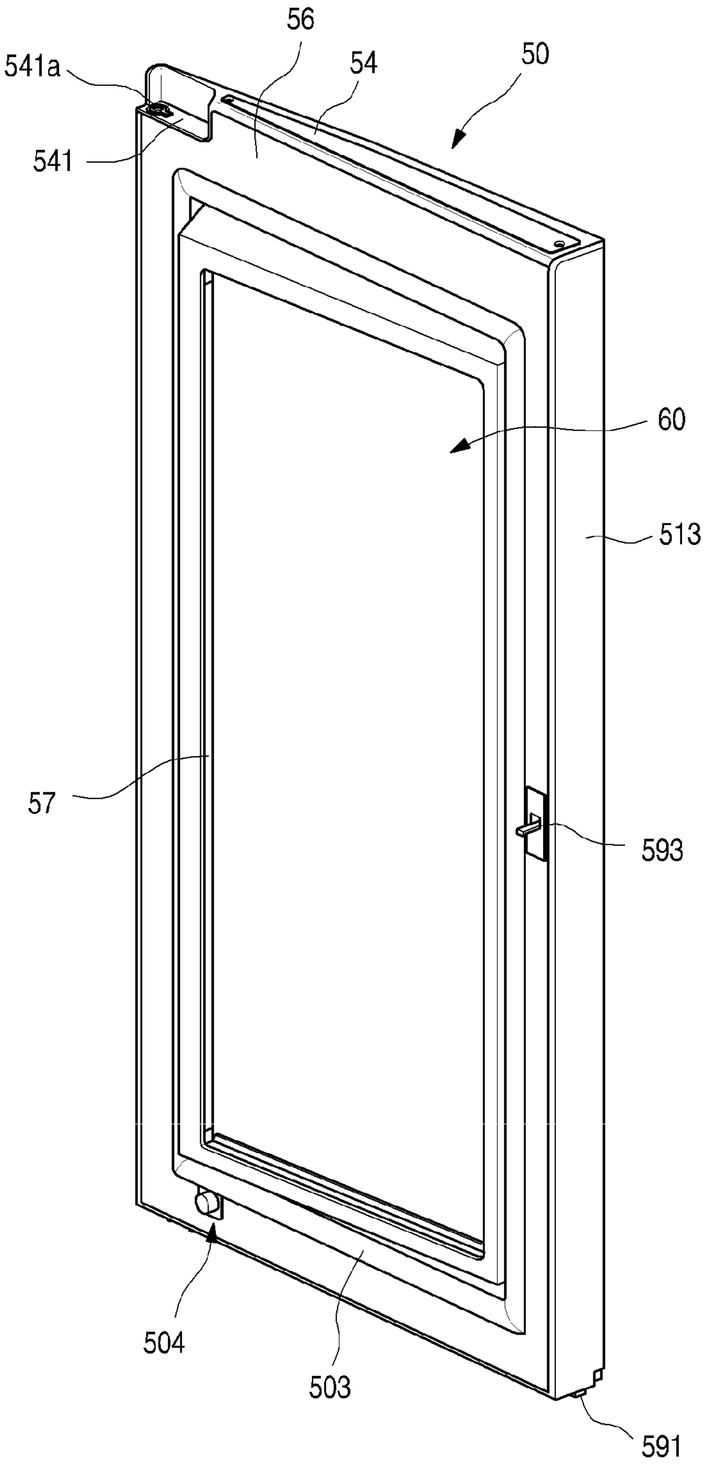
FIG. 6 is a perspective view of the sub door when viewed from a rear side.
Figure 7:
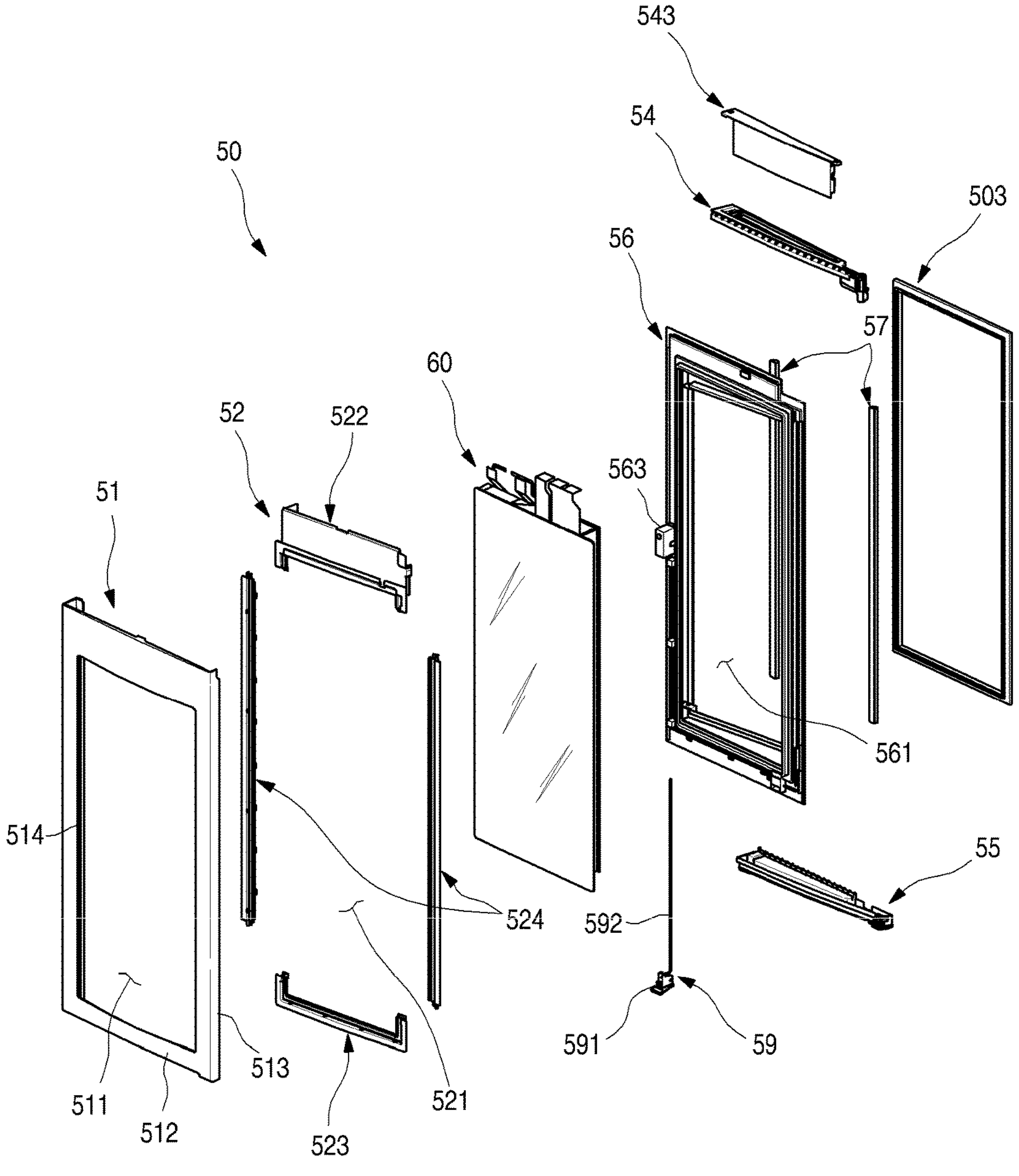
FIG. 7 is an exploded perspective view of the sub door.

FIG. 5 is a perspective view of the sub door when viewed from a front side. FIG. 6 is a perspective view of the sub door when viewed from a rear side. Also, FIG. 7 is an exploded perspective view of the sub door.

As illustrated in the drawings, the sub door 50 may include an outer plate 51 defining an outer appearance of the sub door 50, a door linear 56 mounted to be spaced apart from the outer plate 51, the transparent display assembly 60 mounted on an opening of the outer plate 51 and the door linear 56, and upper and lower cap decos 54 and 55 defining the top and bottom surfaces of the sub door 50. The above-described constituents may be coupled to define the whole outer appearance of the sub door 50.

The outer plate 51 may constitute an outer appearance of the front surface of the sub door 50 and a portion of a circumferential surface of the sub door 50 and be made of a stainless steel material. The outer plate 51 may constitute a portion of the outer appearance of the sub door 50 as well as the front surface of the sub door 50. Also, the outer plate 51 may be made of the same material of the front surface of each of the refrigerating compartment door 20 and the freezing compartment door 30. Various surface treatments such as coating or film attachment so as to realize anti-fingerprint coating, hair lines, colors, or patterns may be performed on the front surface of the outer plate 51.

The outer plate 51 may include a front part 512 defining the outer appearance of the front surface and a side part 513 defining an outer appearance of the side surface that is exposed to the outside. Also, a plate opening 511 may be defined at a center of the front part 512. Here, the plate opening 511 may be covered by the transparent display assembly 60. Also, since the inside of the refrigerator 1 is seen through the transparent display assembly 60 covering the plate opening 511, the inside of the plate opening 511 is called the see-through part 21.

The front part 512 may have a curvature that gradually decreases outward from a central side of the refrigerator 1 as a whole. The front part 512 may be rounded to correspond to the front surface of the refrigerating compartment door 20, which is adjacent to the front part 512. Thus, the outer appearance of the front surface of the refrigerator 1 may be three-dimensionally viewed as a whole.

Also, an opening bent part 514 that is bent backward may be disposed on a circumferential surface of the plate opening 511. The opening bent part 514 may be disposed along a circumference of the plate opening 511 and extend by a predetermined length so as to be inserted into and fixed to an inner frame 52 that will be described below. Thus, the plate opening 511 may be defined by the opening bent part 514.

The side part 513 that is bent backward may be disposed on each of both ends of the front part 512. The side part 513 may define an outer appearance of the side surface of the sub door 50. Also, an end of the side part 513 may also be bent inward to be coupled to the door linear 56.

Upper and lower ends of the outer plate 51 may also be bent to be coupled to the upper cap deco 54 and the lower cap deco 55. Thus, the outer plate 51 may define the outer appearance of the sub door 50 by being coupled to the door linear 56 and the upper and lower cap decos 54 and 55.

The door linear 56 defines the rear surface of the sub door 50 and has a door linear opening 561 in the area on which the transparent display assembly 60 is disposed. Also, a sub gasket 503 for sealing a gap between the sub door 50 and the main door 40 may be mounted on the rear surface of the door linear 56.

Also, a door light 57 may be provided on each of both sides of the door linear opening 561. The door light 57 may illuminate the rear surface of the sub door 50 and a rear side of the transparent display assembly 60.

Thus, the door light 57 may illuminate an inner space of the accommodation case 43, and simultaneously, serve as an auxiliary backlight function of the transparent display assembly 60 to more clearly output a screen of the transparent display assembly 60. When the door light 57 is turned on, the inside of the accommodation case 43 may be brightened up, and thus, the inside of the refrigerator 1 may be more brightened up than the outside of the refrigerator 1 so that the inside of the refrigerator 1 may be visualized through the transparent display assembly 60.

The door light 57 may be disposed on both sides of the transparent display assembly 60 in directions facing each other. The mounted position of the door light 57 may variously vary as long as the door light 57 has sufficient brightness at the rear side of the sub door.

Also, the opening device 59 may be mounted on the door linear 56. The opening device 59 may include a manipulation member 591 exposed to the lower end of the sub door 50, a load 592 extending from the manipulation member 591, and a locking member 593 protruding from the rear surface of the door linear 56. The user may manipulate the manipulation member 591 to allow the load 592 to move the locking member 593 so that the sub door 50 is selectively restricted by the main door 40 and also to manipulate the opening and closing of the sub door 50.

The upper cap deco 54 may define a top surface of the sub door 50 and be coupled to upper ends of the outer plate 51 and the door linear 56. Also, a sub upper hinge mounting part 541 may be disposed on one end of the upper cap deco 54, and a hinge hole 541*a* into which a hinge shaft of the upper hinge 401 is inserted may be defined in the sub upper hinge mounting part 541. A structure of the upper cap deco 54 will be described below in more detail.

The lower cap deco 55 may define a bottom surface of the sub door 50 and be coupled to lower ends of the outer plate 51 and the door linear 56.

The transparent display assembly 60 may be disposed between the outer plate 51 and the door linear 56. Also, the transparent display assembly 60 may be configured to cover the plate opening 511 and the door linear opening 561. Also, the transparent display assembly 60 may be selectively manipulated to one state of transparent, translucent, opaque, and screen output states by the user.

Thus, the user may selectively see through the inner space of the sub door 50 through the transparent display assembly 60 and see the screen outputted through the transparent display assembly 60.

The inner frame 52 for supporting the transparent display assembly 60 is mounted on a circumference of the plate opening 511 of the outer plate 51. The transparent display assembly 60 may be fixed and mounted on the outer plate 51 by the inner frame 52. Particularly, a front surface of the outer plate 51 and the front surface of the transparent display assembly 60 may be disposed on the same extension line so that the front surface of the sub door 50 has a sense of unity.

A frame opening 521 is defined at a center of the inner frame 52. The frame opening 521 has a size somewhat less than that of the plate opening 511 and has a structure in which the transparent display assembly 60 is seated thereon. Also, the frame opening 521 may have a size less than that of the front panel 61 and greater than that of the rear panel 65. Thus, when the transparent display assembly 60 is mounted, the rear panel 65 may successively pass through the plate opening 511 and the frame opening 521 and then be seated on the door linear 56.

Also, the inner frame 52 may have a coupling structure with the outer plate 51. Here, the outer plate 51 and an end of the transparent display assembly 60 may be mounted on the inner frame 52 in a state in which the outer plate 51 and the end of the transparent display assembly 60 are closely attached to each other.

Thus, in the transparent display assembly 60 is mounted, the inner frame 52 may support a rear surface of the plate opening 511 of the outer plate 51 and a rear surface of the circumference of the transparent display assembly 60 at the same time. Also, in the state in which the transparent display assembly 60 is mounted, the front surface of the outer plate 51 and the front surface of the transparent display assembly 60 may be disposed on the same plane without being stepped with respect to each other.

Figure 8:
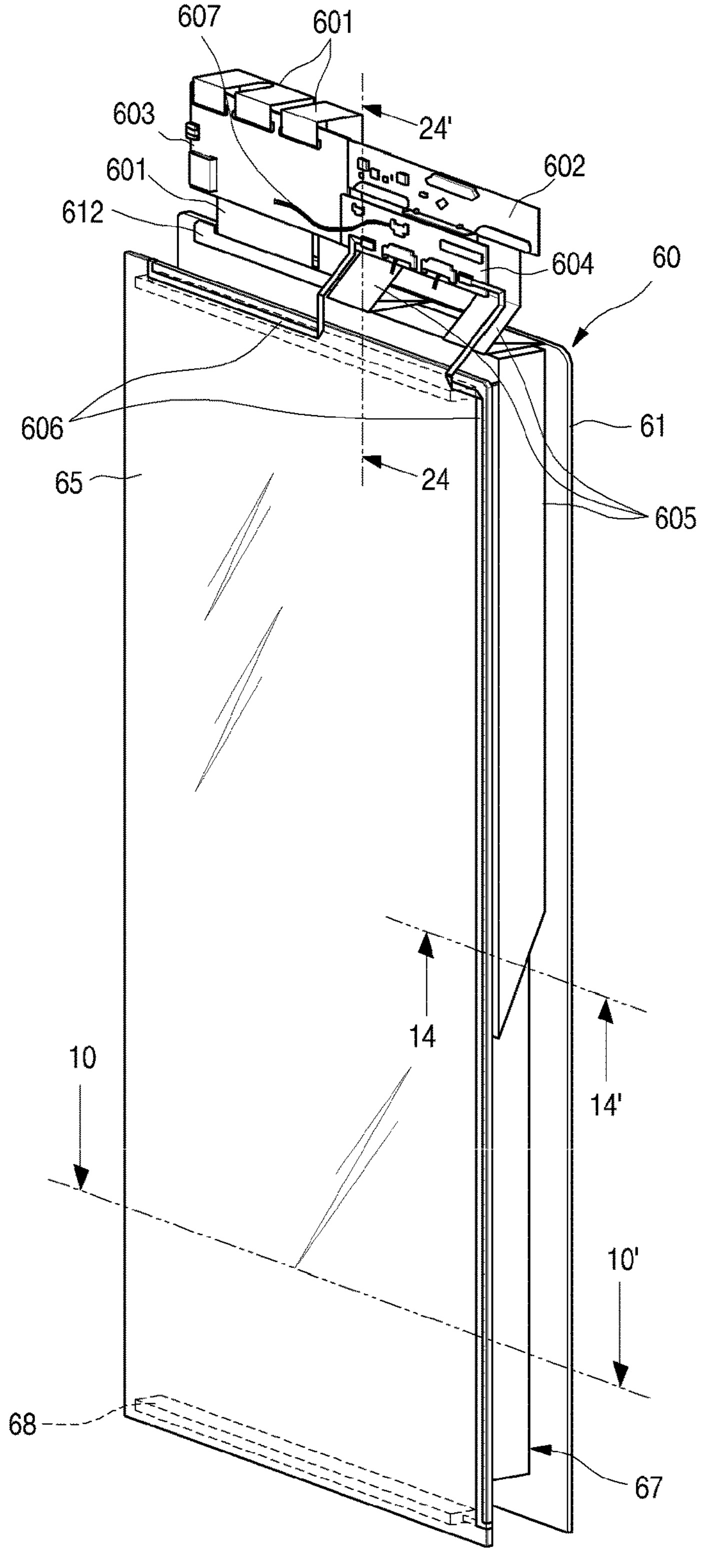
FIG. 8 is a perspective view of a transparent display assembly according to the first embodiment.
Figure 9:
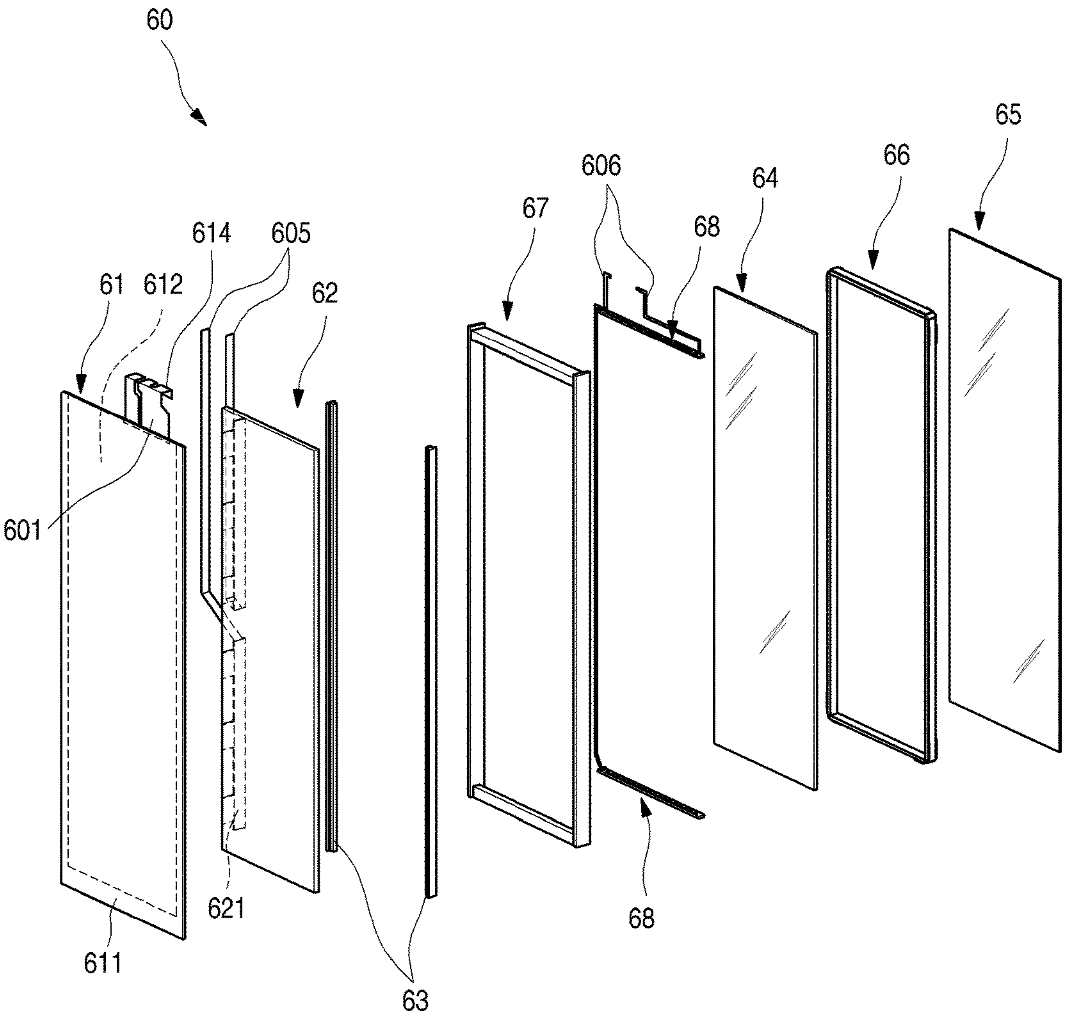
FIG. 9 is an exploded perspective view of the transparent display assembly.
Figure 10:
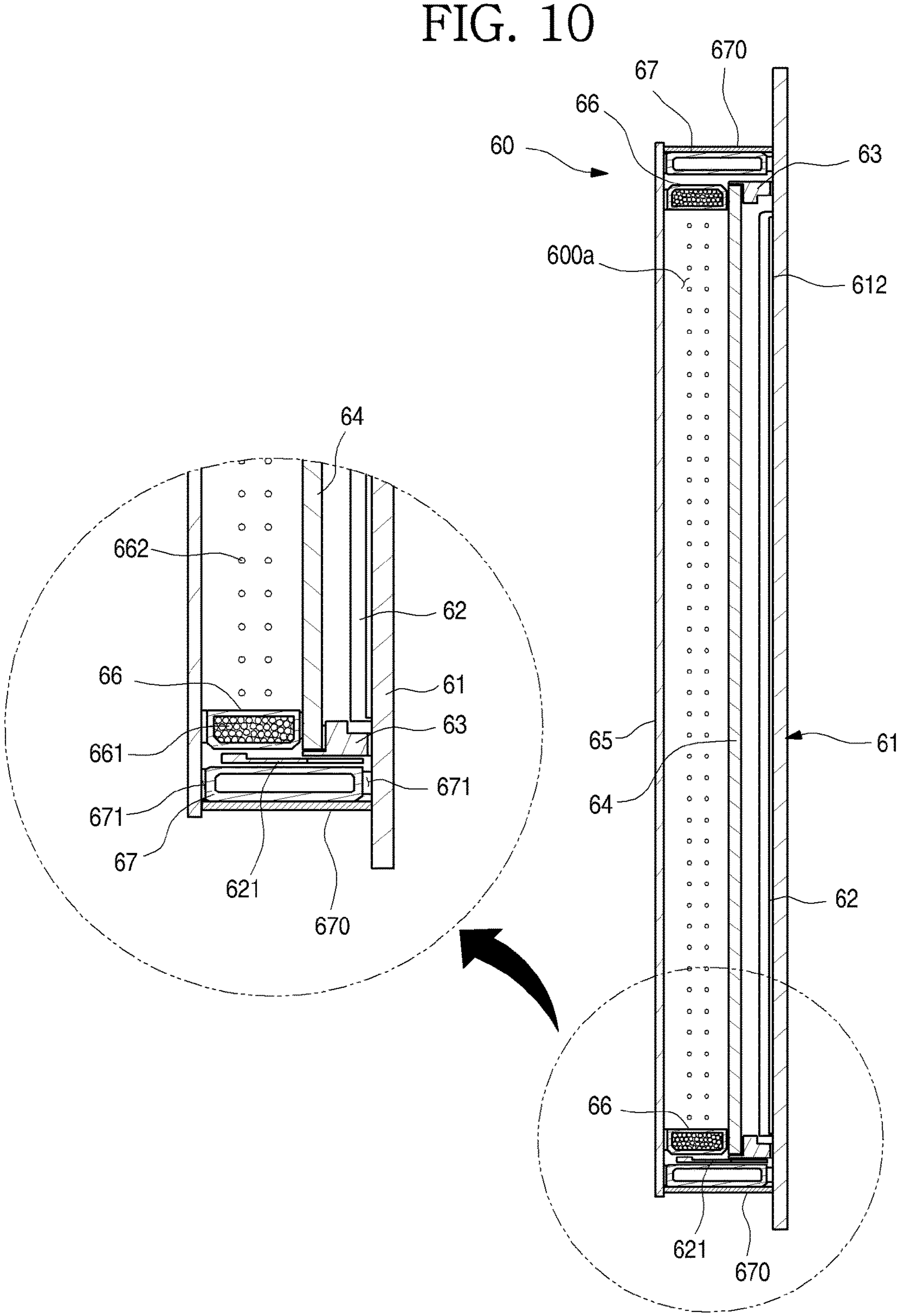
FIG. 10 is a cross-sectional view taken along line 10-10' of FIG. 8.

FIG. 8 is a perspective view of the transparent display assembly according to the first embodiment. Also, FIG. 9 is an exploded perspective view of the transparent display assembly. Also, FIG. 10 is a cross-sectional view taken along line 10-10' of FIG. 8.

As illustrated in the drawings, the transparent display assembly 60 may have a size that is enough to cover the plate opening 511 and the linear opening 561 inside the sub door 50. Also, the see-through part 21 may be provided in the transparent display assembly 60 so that the inner space of the refrigerator is selectively seen, and a screen is outputted.

In more detail with respect to the transparent display assembly 60, the transparent display assembly 60 may have an outer appearance that is defined by the front panel 61 and the rear panel 65, which define the front and rear surfaces of the transparent display assembly 60, and the outer spacer 67 connecting the front panel 61 to the rear panel 65.

Also, a display 62 and a light guide plate 64 may be disposed between the front panel 61 and the rear panel 65. In addition, a first spacer 63 for supporting the display 62 and the light guide plate 64 may be further provided, and a display light 68 for emitting light to the light guide plate 64 may be provided.

In more detail, the front panel 61 may be made of a transparent glass material that defines an outer appearance of the front surface of the transparent display assembly 60. The front panel 61 may be made of a different material through which the inside of the front panel 61 is seen, and a touch input is enabled.

The front panel 61 may have a size greater than that of the frame opening 521 and be supported by the inner frame 52. That is, when the transparent display assembly 60 is assembled and mounted from the rear side, a circumferential portion of the front panel 61 may be supported by the rear surface of the inner frame 52.

In detail, a front protrusion 613 that further protrudes outward than the rear panel may be disposed on the front panel 61. The front protrusion may have a length greater than that of the rear panel 65 in all directions. Also, the front panel 61 defining the front surface of the transparent display assembly 60 may further extend outward from the frame opening 521 and then be stably fixed and mounted on the inner frame 52 due to characteristics of the transparent display assembly 60 mounted on at the rear side of the outer plate 51.

Thus, when the transparent display assembly 60 is mounted, each of the extending ends of the front panel 61, i.e., the front protrusion 613 may be supported by the inner frame 52, and thus, the transparent display assembly 60 may be stably maintained in the mounted state without being separated.

A bezel 611 may be disposed on a circumference of the rear surface of the front panel 61. The bezel 611 may be printed with a black color and have a predetermined width so that the outer spacer 67 and the first spacer 63 are covered without being exposed to the outside.

A touch sensor 612 may be disposed on an inner area of the bezel 611. The touch sensor 612 may be formed on the rear surface of the front panel 61 in a printing manner and be configured to detect user's touch manipulation of the front panel 61. Alternatively, the touch sensor 612 may be formed in various manners such as a film adhesion manner, rather than the printing manner, so that the user touches the front panel 61 to perform the touch input.

A touch cable 601 connected to the touch sensor 612 may be disposed on the upper end of the front panel 61. The touch cable 601 may be provided as a flexible film type cable such as a flexible flat cable (FFC) or a flexible print cable or flexible print circuit board (FPC). A printed circuit may be printed on the touch cable 601 to constitute at least a portion of a touch PCB 603. Also, the touch cable 601 may be connected to the touch PCB 603.

The display 62 may be disposed on the rear surface of the front panel 61. The display 62 may be provided as an LCD module for outputting a screen. Also, the display 62 may be transparent so that the user sees the inside through the display 62 when the screen is not outputted.

A source board 621 may be disposed on one end of both left and right sides of the display 62. The source board 621 may be configured to output a screen through the display 62 and provided as one assembly with the display 62. Also, a portion of the source board 621 may include the flexible film type cable structure and extend upward along a side surface of the transparent display assembly 60 in the bent state.

Also, the source board 621 may have a width less than a thickness of the transparent display assembly 60 and be bent while the transparent display assembly 60 is assembled. Here, a position at which the source board 621 is disposed may be defined between the inside of the outer spacer 67 and the first spacer 63 and come into contact with an inner surface of the outer spacer 67 in the bent state.

Also, the source board 621 may be connected to a display cable 605. The display cable 605 may be connected to a T-CON board 623 at an upper portion of the sub door 50.

In detail, when the source board 621 is disposed on the rear surface of the display 62, the source board 621 may be exposed to the outside through the see-through part 21 due to the characteristics of the display 62 that is transparent. Also, when the source board 621 has a structure that protrudes laterally, the sub door 50 may increase in size.

Thus, the source board 621 may be disposed on an end of a circumferential side of the display 62 and bent to come into contact with the inner surface of the outer spacer 67 inside the outer spacer 67. Also, the source board 621 may have a size corresponding to that of the outer spacer 67 without getting out of a region of the outer spacer 67 in a state of being closely attached to the outer spacer 67.

The source board 621 may be constituted by two upper and lower boards 621 and respectively connected to the pair of display cables 605. The display cable 605 may have a flexible and flat structure like the touch cable 601 and also have a structure that is freely bendable.

The display cable 605 may extend along the circumferential surface of the transparent display assembly 60 and pass through a sealant 670 defining the side surface of the transparent display assembly 60 to extend to the outside of the transparent display assembly 60.

Also, the display cable 605 may be bent to extend along the circumferential surface of the transparent display assembly 60, i.e., be bent so that an end thereof extends upward from the transparent display assembly 60. Thus, the display cable 605 may be coupled to the T-CON board 602 at the upper side of the sub door 50.

Both ends of the display 62 may be supported by the first spacer 63. The first spacer 63 may have a rod or stick shape extending from an upper end to the lower end of the display 62, and the display 62 and the light guide plate 64 may be maintained at a preset distance therebetween.

The light guide plate 64 may be disposed at a rear side of the display, supported by the pair of first spacers 63 disposed at both left and right sides, and disposed to be spaced a predetermined distance from the display 62. There is a difference in depth feeling of the screen outputted from the display 62 according to the position of the light guide plate 64.

Thus, the light guide plate 64 may be disposed further forward than an intermediate point between the front panel 61 and the rear panel 65 so that the screen outputted by the display 62 is felt closer to the front panel 61. As a result, a height of the first spacer 63 may be determined.

The light guide plate 64 may diffuse or scatter light emitted from the display light 68 and be made of various materials. For example, the light guide plate 64 may be made of a polymer material or formed by forming a pattern or attaching a film on a surface thereof. The light guide plate 64 may illuminate the display 62 from the rear side of the display 62 when the display light 68 is turned on. For this, the light guide plate 64 may have a plate shape having a size equal to or somewhat greater than that of the display 62. The display light 68 may be disposed at a position corresponding to each of upper and lower ends of the light guide plate 64.

The rear panel 65 may be disposed at a rear side of the light guide plate 64. The rear panel 65 may define the rear surface of the transparent display assembly 60 and have a size greater than that of the light guide plate and less than that of the front panel 61. Also, the rear panel 65 may have a size greater than that of the linear opening 561 to cover the linear opening 561.

A circumference of the rear panel 65 may further protrude outward from the outer spacer 67 to provide a rear panel protrusion 651. The rear panel protrusion 651 may be seated on the door linear 56 when the transparent display assembly 60 is mounted and provide a space in which a foaming solution is filled when the insulation material 531 is molded in the sub door 50.

A second spacer 66 may be disposed between the rear panel 65 and the light guide plate 64. The second spacer 66 may have a rectangular frame shape disposed along a circumference of the light guide plate 64 and adhere to the light guide plate 64 and the rear panel 64 to maintain a predetermined distance between the light guide plate 64 and the rear panel 65.

The distance between the front panel 61 and the light guide plate 64 may be maintained in fixed distance so as to output the screen of the display 62. Also, the distance between the light guide plate 64 and the rear panel 65 may be determined according to a thickness of the sub door 50 or the total thickness of the transparent display assembly 60. That is, the second spacer 66 may be adjusted in thickness to determine the total thickness of the transparent display assembly 60 so as to be mounted to match a specification of the sub door 50.

The second spacer 66 may be made of an aluminum material, and a moisture absorbent 661 may be filled into the second spacer 66. Also, a plurality of punched holes 662 may be defined in an inner surface of the second spacer 66. Thus, moisture in the space between the rear panel 65 and the light guide plate 64 may be absorbed by the moisture absorbent 661 so that the space is maintained in dry condition. Thus, an occurrence of dew condensation or blurring of the inside due to moisture may be prevented.

The second spacer 66 may adhere to the light guide plate 64 and the rear panel 65 by using an adhesion member 663. Thus, a sealed close space may be provided between the light guide plate 64 and the rear panel 65. Also, the light guide plate 64 and the rear panel 65, which are sealed by the second spacer 66, may be in a vacuum state, or an argon gas may be filled to form an insulation layer 600*a*. Thus, heat exchange between the inside of the rear surface of the rear panel 65 of the refrigerator and an external space of the front surface of the front panel 61 may be more effectively blocked.

The rear panel 65 may come into contact with the door light 57. Thus, a distance between the display 62 and the door light 57 may be determined according to the position of the rear panel 65. The door light 57 may serve as an auxiliary backlight of the display 62 in the turn-on state.

In detail, a distance between the display 62 and the door light 58 may range from about 5 cm to about 15 cm. When the distance between the display 62 and the door light 57 is less than about 5 cm, a shade may occur. When the distance between the display 62 and the door light 57 exceeds about 5 cm, the door light may not serve as the backlight. Thus, to maintain the distance between the display 62 and the door light 57, the rear panel 65 may also be maintained to be spaced a predetermined distance from the display 62, and thus, the width of the second spacer 66 may be determined.

In the state in which the rear panel 65 adheres to the second spacer 66, an outer end of the rear panel 65 may further extend outward from the second spacer 66. Also, the outer spacer 67 may be mounted on the rear panel 65 so that the rear panel 65 and the front panel 61 are fixed to each other.

The outer spacer 67 may connect the rear surface of the front panel 61 to the front surface of the rear panel 65 and also define the circumferential surface of the transparent display assembly 60. Also, a space in which the display light 68 is mounted may be provided in an inner surface of the outer spacer 67.

The outer spacer 67 may have a rectangular frame shape. Also, the outer spacer 67 may have a size in which the light guide plate 64 and the first and second spacers 63 and 66 are accommodated.

Although the spacers 63, 66, and 67 have structures different from each other in this embodiment, the spacers 63, 66, and 67 may maintain a distance between the adjacent panels 61 and 65 and the light guide plate 64 and have various shapes such as a shape in which the moisture absorbent is accommodated into a shape such as a rod.

In the transparent display assembly 60, the front panel 61 and the rear panel 65 may be connected to each other by the outer spacer 67, and thus, the sealed close space may be defined between the front panel 61 and the rear panel 65. Thus, the front panel 61 and the rear panel 65 may fundamentally have a thermal insulation effect by using an air layer. When the argon gas is injected into the close space inside the outer spacer 67, the whole space between the front panel 61 and the rear panel 65 may form an insulation layer.

Thus, the transparent display assembly 60 coming into contact with the inside and the outside of the refrigerator, which have a high temperature difference therebetween, may insulate the inner space of the refrigerator from the outside of the refrigerator. Also, the transparent display assembly 60 may prevent dew condensation from occurring by a temperature difference between the surface and the inside thereof.

When explaining the outer spacer 67 in more detail, the outer spacer 67 may define a circumference of an outer portion of the transparent display assembly 60 and also have a connection structure that is capable of allowing the front panel 61 to be maintained at a certain distance.

The space between the front panel 61 and the rear panel 65, i.e., the inner space of the outer spacer may be completely sealed by the coupling of the outer spacer 67. Also, the inside of the outer spacer 67 may be more sealed by the sealant 670 applied to the circumference of the outer spacer 67.

The display 62 and the light guide plate 64 may be spaced apart from each other in a front and rear direction within the inside of the space that is sealed by the outer spacer 67. The first and second spacers 63 and 66 for maintaining the distance of the light guide plate 64 may be also provided in the inner space of the outer spacer 67.

An additional insulation panel may be further provided in the outer spacer 67, or a multilayered glass structure may be provided in the outer spacer 67. All of the above-described constituents may be provided in the space defined by the outer spacer 67.

That is, the overall outer appearance of the transparent display assembly 60 may be defined by the front panel 61, the rear panel 65, and the outer spacer 67, and all of the remaining constituents may be provided in the outer spacer 67. Thus, the sealing may be performed only between the outer spacer 67, the front panel 61, and the rear panel 65 to completely seal the multilayered panel structure.

Particularly, even through a plate-shaped structure such as the light guide plate 64 is further provided in the outer spacer 67, when only the outer spacer 67 adheres to the front panel 61 and the rear panel 65, the sealed structure of the transparent display assembly 60 may be achieved. The sealed structure may maintain a minimal sealing point even in the multilayered structure due to the plurality of panel including the light guide plate 64.

Thus, introduction of external air into the transparent display assembly 60 or the dew condensation in the transparent display assembly 60 due to introduction of moisture may be minimized. Also, when the inside of the outer spacer 67 becomes in a vacuum state, or a gas for the thermal insulation is injected, the insulation layer may be provided in the whole multilayered structure within the transparent display assembly 60 to more improve the thermal insulation performance.

The transparent display assembly 60 may be disposed in the sub door 50 so that the inside of the refrigerator is seen, and the screen is outputted, and also, the thermal insulation structure may be achieved in the multilayered panel structure at the minimum sealing point to secure the thermal insulation performance.

Also, the display light 68 may be mounted on each of the upper and lower ends of the outer spacer 67. The light guide plate 64 may be disposed between the display lights 68 disposed on the upper and lower ends of the outer spacer 67. Thus, light emitted through the display light 68 may be directed to an end of the light guide plate 64 and then travel along the light guide plate 64 so that the entire surface of the light guide plate 64 emits light.

As illustrated in the drawings, a plurality of PCBs 602, 603, and 604 for driving the transparent display assembly 60 may be disposed on an upper end of the transparent display assembly 60. The plurality of PCBs 602, 603, and 604 may be disposed above the transparent display assembly 60 and provided in a space between the top surface of the sub door 50 and the upper end of the transparent display assembly 60. Thus, in the state in which the sub door 50 is assembled, the PCBs 602, 603, and 604 may be disposed so that the PCBs 602, 603, and 604 are not exposed to the outside through the transparent display assembly 60.

The PCBs mounted on the PCB mounting part 545 may include the T-CON board 602, the touch PCB 603, and the docking PCB 604. The T-CON board 602 may include a display cable 605 for driving the display 62. The touch PCB 603 may process a touch input signal of the touch sensor 612 and include a touch cable 601 connected to the touch sensor 612. The docking PCB 604 may connect the touch PCB 603 and/or the T-CON board 602, and the control unit 14 on the cabinet 10 to the wire type connection cable 607.

Also, the docking PCB 604 may be connected to an end of the door light cable 609 that extends from the door light 57. The door light 57 may be provided as a separate part with respect to the transparent display assembly 60 and mounted on the door linear 56.

The docking PCB 604 may be connected to at least one of the touch PCB 603 and the T-CON board 602 and also be connected to the control unit 14 via the sub door 50 by the wire type connection cable 607.

Thus, the plurality of flat cables 601, 605, and 606 may be connected to the docking PCB 604, and the less number of connection cables 607 connected to the docking PCB 604 may be guided to the outside of the sub door 50 and then be connected to the control unit 14. Thus, the control unit 14 and the electric components of the transparent display assembly 60 may communicate with each other by the connection cable 607 and the cables 601, 605, and 606 to transmit information for operation.

The cables 601, 605, and 606 connecting the plurality of cables 602, 603, and 604 to each other may be provided as the flexible film type FFC or FPC. Thus, the touch cable 601, the display cable 605, and the display light cable 606 may occupy a large space within the sub door 50 and be disposed to be closely attached to each other along the outside of the transparent display assembly 60. Also, the connection structure with the PCBs 602, 603, and 604 may also be simply provided and may not be exposed to the outside through the see-through part 21. In addition, when the insulation material 531 is foamed to be molded in the sub door 50, the PCBs 602, 603, and 604 may not interfere with the insulation material 531.

FIG. 11 is a partial perspective view illustrating an arranged state of the display cable of the transparent display assembly.

As illustrated in the drawing, the display cable 605 may be connected to the source board 621 to extend upward. Then, the display cable 605 may extend along the circumference of the side surface of the transparent display assembly 60 and then be connected to the T-CON board 602.

The display cable 6-5 may be connected to the source board 621 inside the transparent display assembly 60. As illustrated in FIG. 11, the display cable 605 may be guided to the outside of the outer spacer 67 through the space between the rear panel 65 and the outer spacer 67.

In detail, a cable connection part **605*a* is provided on the display cable 605. The cable connection part 605*a* may be introduced into the transparent display assembly 60 through the space defined by the rear panel 65 and the end of the outer spacer 67 and then be connected to the source board 621 in the inner space of the transparent display 62**.

The cable connection part **605*a* may be guided to an outer surface of the transparent display assembly 60 through a gap of an adhesion member 671 for allow the rear panel 65 and the outer spacer 67 to adhere to each other. In this state, the display cable 605 may be bent to be closely attached to an outer surface of the transparent display assembly 60, i.e., an outer surface of the outer spacer 67. Also, the display cable 605 may extend upward in the state of coming into contact with the outer surface of the outer spacer 67 and then be bent again and connected to the T-CON board 602**.

Figure 12:
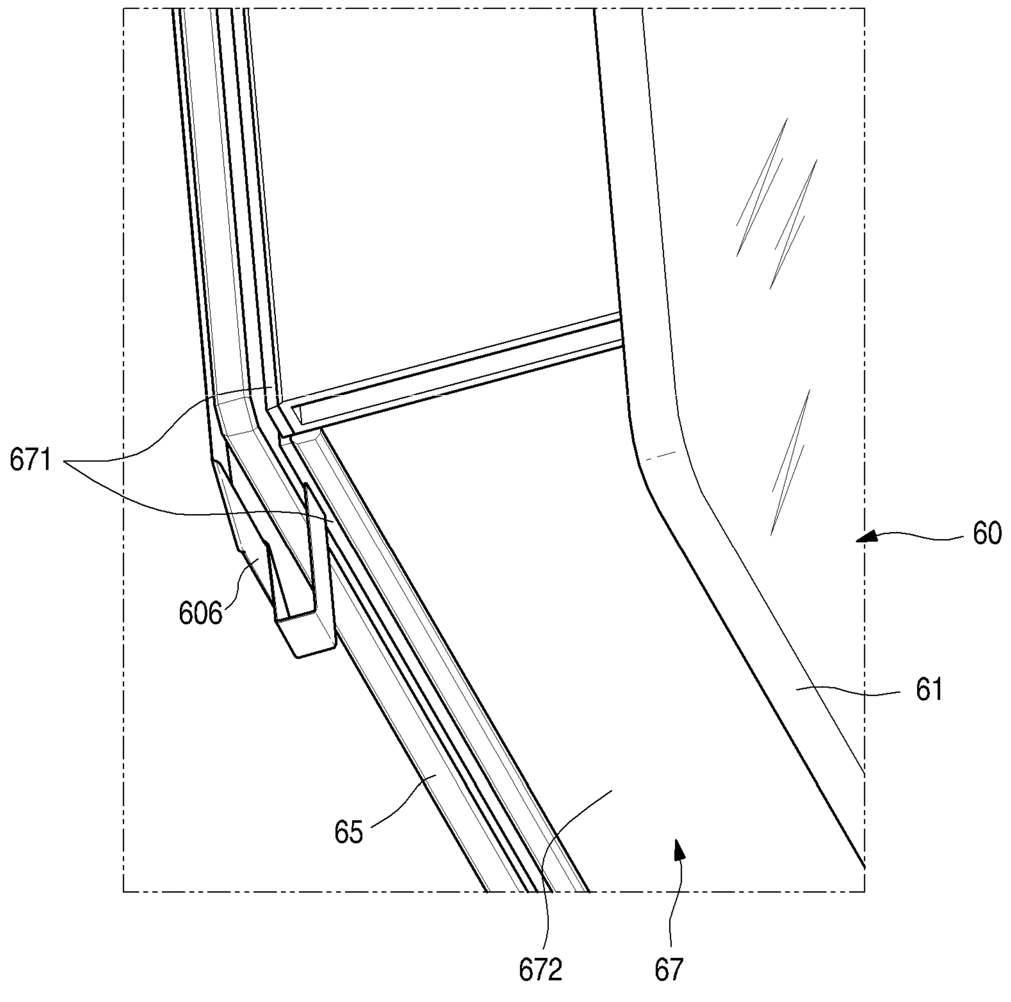
FIG. 12 is a partial perspective view illustrating an arranged state of a display light cable of the transparent display assembly.

FIG. 12 is a partial perspective view illustrating an arranged state of the display light cable of the transparent display assembly.

As illustrated in FIG. 12, the display lights 68 disposed on the inner upper and lower ends of the transparent display assembly 60 may be connected to a display light cable 606. The display light cable 606 may have a flexible and flat shape like the touch cable 601 and the display cable 605.

The display light cable 606 may be connected to the display light 68 disposed on each of the upper and lower portions of the transparent display assembly 60 to extend upward along the outer circumference of the transparent display assembly 60 and then be connected to the docking PCB 604.

In detail, as illustrated in FIG. 12, the display light cable 606 may be introduced into the transparent display assembly 60 through the space between the rear panel 65 and the outer spacer 67 and then be connected to the display light 68 disposed inside the outer spacer 67.

The display light cable 606 may pass through the adhesion member 671 for allowing the outer spacer 67 and the rear panel 65 to adhere to each other and then be exposed to the outside. Then, the display light cable 606 may be bent to face the docking PCB 604 and extend along a circumference of the rear panel 65.

The display light cable 606 may extend along the circumference of the transparent display 62 so that the display light cable 606 is not exposed through the transparent display 62. Also, the display light cable 606 may extend upward in a state of being closely attached to the rear surface of the rear panel 65. As occasion demands, the display light cable 606 may be bent in the state of adhering to the rear surface of the rear panel 65 and then may be connected to a docking PCB 604 disposed on the upper portion of the sub door 50.

Here, since the display light cable 606 extends in the state of being closely attached to the circumference of the rear panel 65, when the sub door 50 is viewed from the outside, the display light cable 606 may be covered by the bezel 611 and thus may not be exposed through the transparent display assembly 60.

As illustrated in FIG. 10, the sealant 670 may be applied to the circumference of the outer spacer 67. The sealant 670 may be applied to form the circumferential surface of the transparent display assembly 60. That is, the sealant 670 may form a circumferential surface between the front panel 61 and the rear panel 65.

The sealant 670 may seal the transparent display assembly 60 to prevent air from being introduced into the transparent display assembly 60 and be made of a polysulfide (that is called a thiokol) material. As occasion demands, the sealant 691 may be made of a different sealant material such as silicon or urethane so that the sealant 691 comes into direct contact with the foaming solution that is injected to mold the insulation material 531.

The sealant 670 may maintain the coupling of the outer spacer 67, the front panel 61, and the rear panel 65 and completely seal the connected portions of the components to prevent water or moisture from being introduced. Also, the sealant 670 may be a portion, which comes into directly contact with the foaming solution when the insulation material 531 is molded, and protect the circumference of the transparent display assembly 60.

Also, the sealant 670 may allow cables 601, 605, and 606 connected to the touch sensor 612, the display panel 62, and the display light 68 within the transparent display assembly 60 to be accessible therethrough. The sealant 670 may cover outer surfaces of the cables 601, 605, and 606 to prevent water or moisture from being introduced through spaces through which the cables 601 605, and 606 are accessible when the cables 601 605, and 606 extent through the circumferential surface of the transparent display assembly 60. Thus, the inside of the outer spacer 67 may be completely sealed by the sealant 670.

Hereinafter, constituents of the first and second spacers 63 and 67 within the transparent display assembly 60 will be described in more detail.

Figure 13:
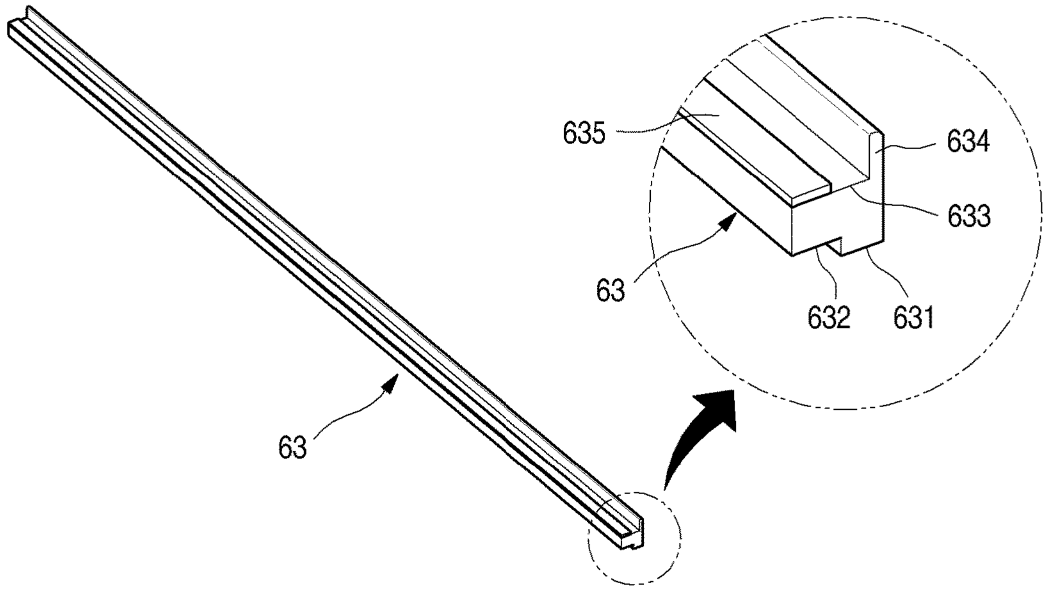
FIG. 13 is a perspective view of a first spacer according to the first embodiment.
Figure 14:
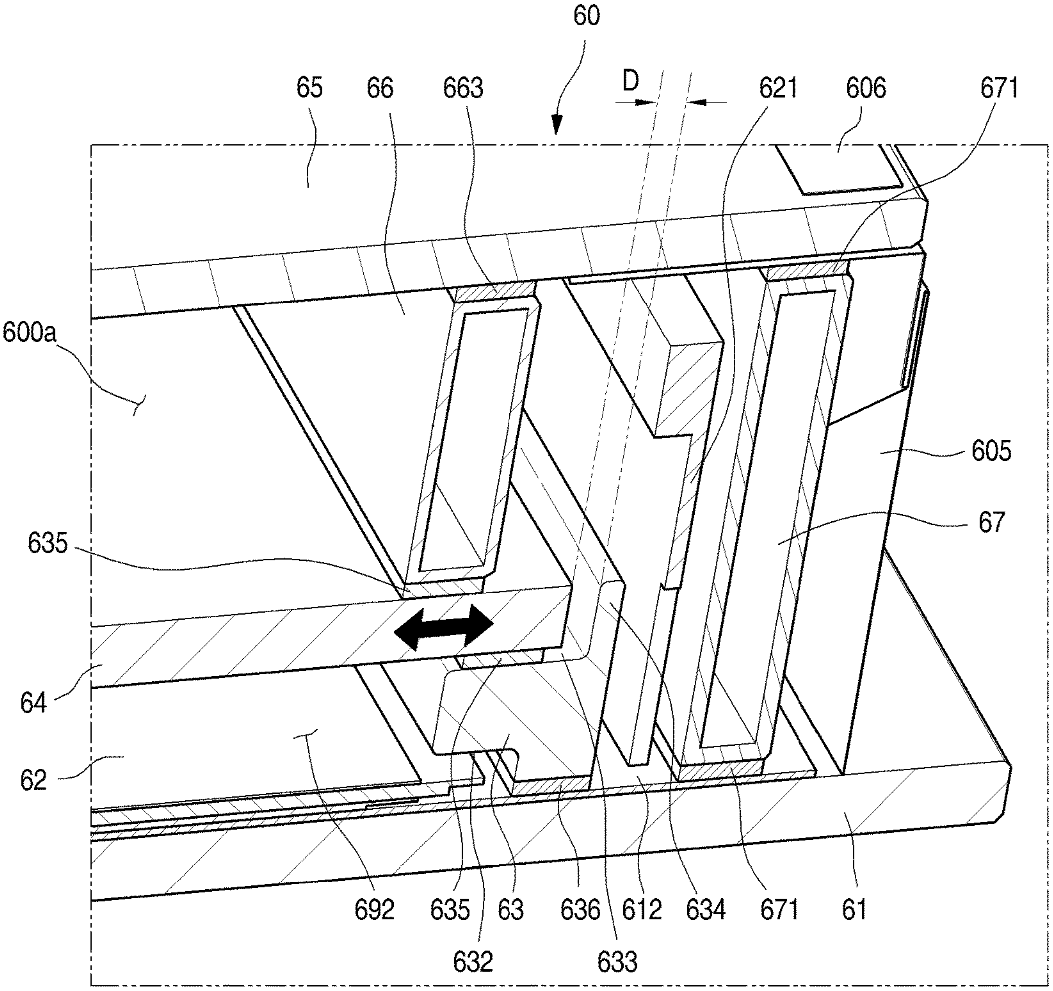
FIG. 14 is a cutaway perspective view taken along line 14-14' of FIG. 8.

FIG. 13 is a perspective view of the first spacer according to the first embodiment. Also, FIG. 14 is a cutaway perspective view taken along line 14-14' of FIG. 8.

As illustrated in the drawings, in the transparent display assembly 60, the first spacer 63 may be disposed on each of both sides of the front panel 61 to support the light guide plate 64. The first spacer 63 may have a length corresponding to a vertical length of the light guide plate 64 and have a rod shape.

Also, the first spacer 63 may include a display accommodation groove 632, a light guide plate seating part 633, and a stop rib 634 in a longitudinal direction of the first spacer 63. Thus, the first spacer 63 may be manufactured through extrusion processing and have a structure that is capable of accommodating and supporting the display 62 and the light guide plate 64.

In more detail, an adhesion part 631 is disposed on one side of a bottom surface of the first spacer 63, and an adhesion member 636 is disposed on the adhesion part 631. The adhesion member 636 may be provided as a double-sided tape or adhesive having a sheet shape. Thus, the first spacer 63 may be maintained in a state of being completely adhered and fixed to the rear surface of the front panel 61.

The light guide seating part 633 may be disposed on a top surface of the first spacer 63. The light guide plate seating part 633 may be disposed in a longitudinal direction of the first spacer 63 to support the entire front side of both ends of the light guide 64.

Also, the light guide plate seating part 633 may be stepped to support both left and right ends of the light guide plate 64. Here, the light guide plate seating part 633 may have a width that further extends from the outside of the light guide plate 64. Thus, the light guide plate seating part 633 may not completely restrict a side end of the light guide plate 64, but define a predetermined space.

Also, a support member 635 may be disposed on a top surface of the light guide plate seating part 633. The support member 635 may support the light guide plate 64 in a state in which the light guide plate 64 does not completely adhere to the first spacer 63, but is seated on the first spacer 63. The support member 635 may has a sheet or pad shape having a predetermined thickness. Also, the support member may extend from an upper end to a lower end of the light guide plate seating part 633.

Also, the support member 635 may be made of an elastic material so that the light guide plate 64 is stably fixed, and when the light guide plate 64 is deformed, the deformation of the light guide plate 64 is buffered. Also, the support member 635 may be made of a material having low hardness than that of the light guide plate 64 to prevent the scratches from occurring in the surface of the light guide plate 64 even though the light guide plate 64 moves in the state of coming into contact with the support member 635. For example, the support member 635 may be made of a silicon material to prevent heat from be transferred to the light guide plate 64 by the first and second spacers 63 and 66.

The support member 635 may be disposed between the light guide plate seating part 633 and the first light guide plate 64. Also, a front surface of the support member 635, which corresponds to the light guide plate seating part 633, may be adhered and fixed to the light guide plate seating part 633.

The support member 637 may be disposed on only the first spacer 63 to support both ends of the light guide plate. If necessary, the support member 637 may be disposed on the first spacer 63 and the outer spacer 67 to support both left and right ends and upper and lower ends of the light guide plate 64.

Figure 15:
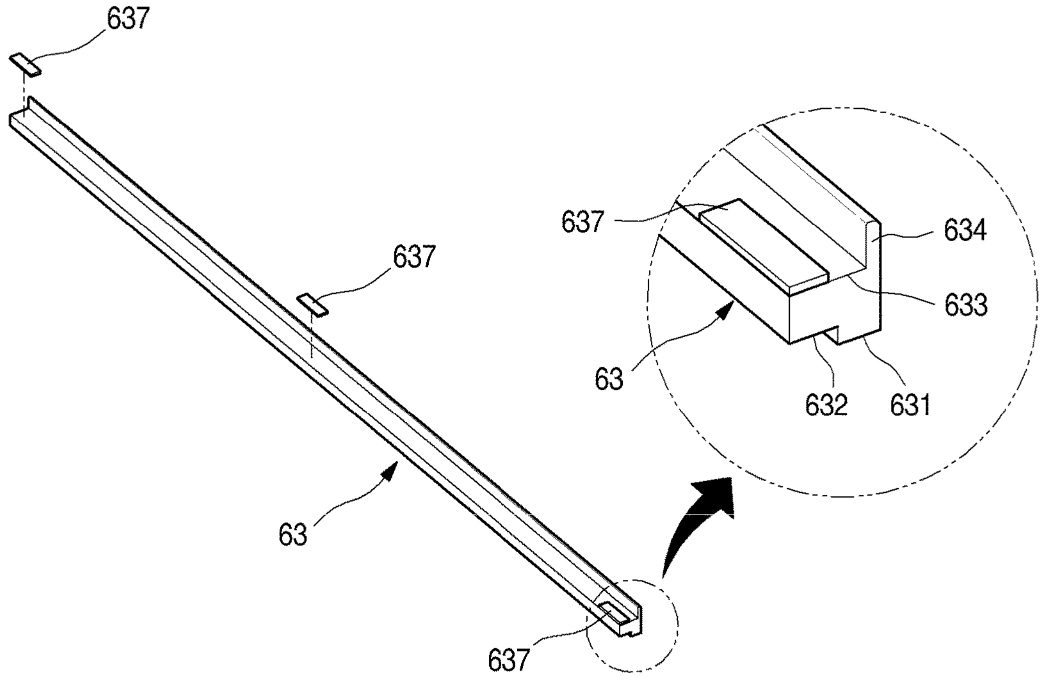
FIG. 15 is a perspective view illustrating another example of a support member disposed on the first spacer.

FIG. 15 is a perspective view illustrating another example of the support member disposed on the first spacer.

As illustrated in FIG. 15, the support member 637 may be disposed on both ends of the light guide plate seating part 633 of the first spacer and between both the ends. The support member 637 may have a predetermined length and be provided in plurality along the light guide plate seating part 633. The support member 637 may be variously changed in length and arranged position so that the light guide plate 64 is supported on the light guide plate seating part 633.

Also, a stop rib 634 extending upward may be disposed on an outer end of the top surface of the first spacer 63, i.e., an end of the light guide plate seating part 633. The stop rib 634 may extend in a longitudinal direction of the first spacer 63 to protrude to a height greater than a thickness of the light guide plate 64.

Thus, in a state in which the light guide plate 64 is seated on the light guide plate seating part 633, the stop rib 634 may further protrude from the rear surface of the light guide plate 64 to restrict the light guide plate 64 in a lateral direction so that the light guide plate 64 does not come out of the first spacer 63 even through the light guide plate 64 moves in a left and right direction.

Also, the stop rib 634 may be finely deformed due to the expansion and contraction of the light guide plate 64 in a state in which the stop rib 634 is spaced apart from an end of the light guide plate 64 when the light guide plate 64 is mounted on the light guide plate seating part 633.

In a state in which the light guide plate 64 is not expanded, an end of the light guide plate 64 and the stop rib 634 may be spaced a preset distance D from each other. A distance D between the light guide plate 64 and the stop rib 634 may provide a space in which the light guide plate 64 is expandable and range from about 1 mm to about 5 mm.

When a distance D between the light guide plate 64 and the stop rib 634 is less than 1 mm, the light guide plate 64 may be restricted by the stop rib 634 when the light guide plate 65 is expanded, and thus, the light guide plate 64 may not be further expanded. In this case, the light guide plate 64 may be permanently deformed or damaged. Also, when a distance D between the light guide plate 64 and the stop rib 634 is greater than 5 mm, the distance D between the light guide plate 64 and the stop rib 634 may be too large. Thus, the light guide plate 64 that is not adhered and fixed may largely move in a left and right direction to cause noises and damage of the first spacer 63. Thus, a distance between the light guide plate 64 and the stop rib 634 may range from about 1 mm to about 5 mm.

Also, the display accommodation groove 632 may be defined in a side of the adhesion part 631 in the longitudinal direction of the first spacer 63. The display accommodation groove 632 may be mounted to form an opening that is directed inward in a state in which the first spacers 63 are respectively mounted on both left and right sides to face each other.

The display accommodation groove 632 may accommodate one end of both left and right sides of the display 62. The display accommodation groove 632 may be stepped to form a space spaced apart from the front panel 61 in the state in which the first spacer 63 is mounted on the front panel 61. Also, in the state in which the display 62 is mounted on the front panel 61, both ends of the display 62 may be disposed inside the display accommodation groove 632.

Thus, the display 62 may be fixed in the state of being accommodated into the display accommodation groove 632, and thus, even though the sub door 50 is opened and closed, the mounted state of the display 62 may be stably maintained. If necessary, an additional adhesive or sealing material for more effectively fixing the display 62 may be further provided inside the display accommodation groove 632.

Figure 16:
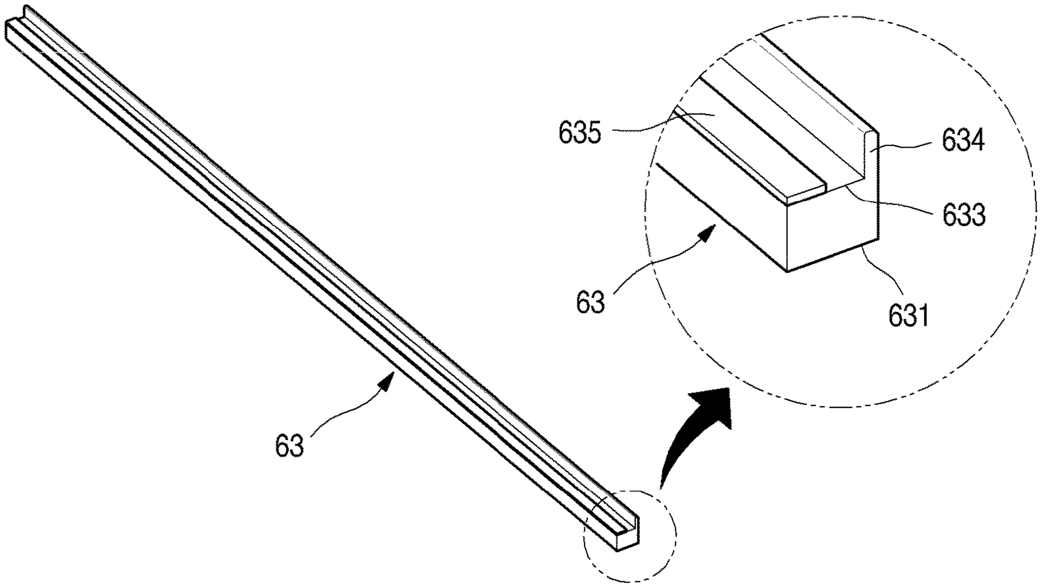
FIG. 16 is a perspective view illustrating another example of the first spacer.

FIG. 16 is a perspective view illustrating another example of the first spacer. Also, FIG. 17 is a cutaway perspective view of the transparent display assembly to which another example of the first spacer is mounted.

Figure 17:
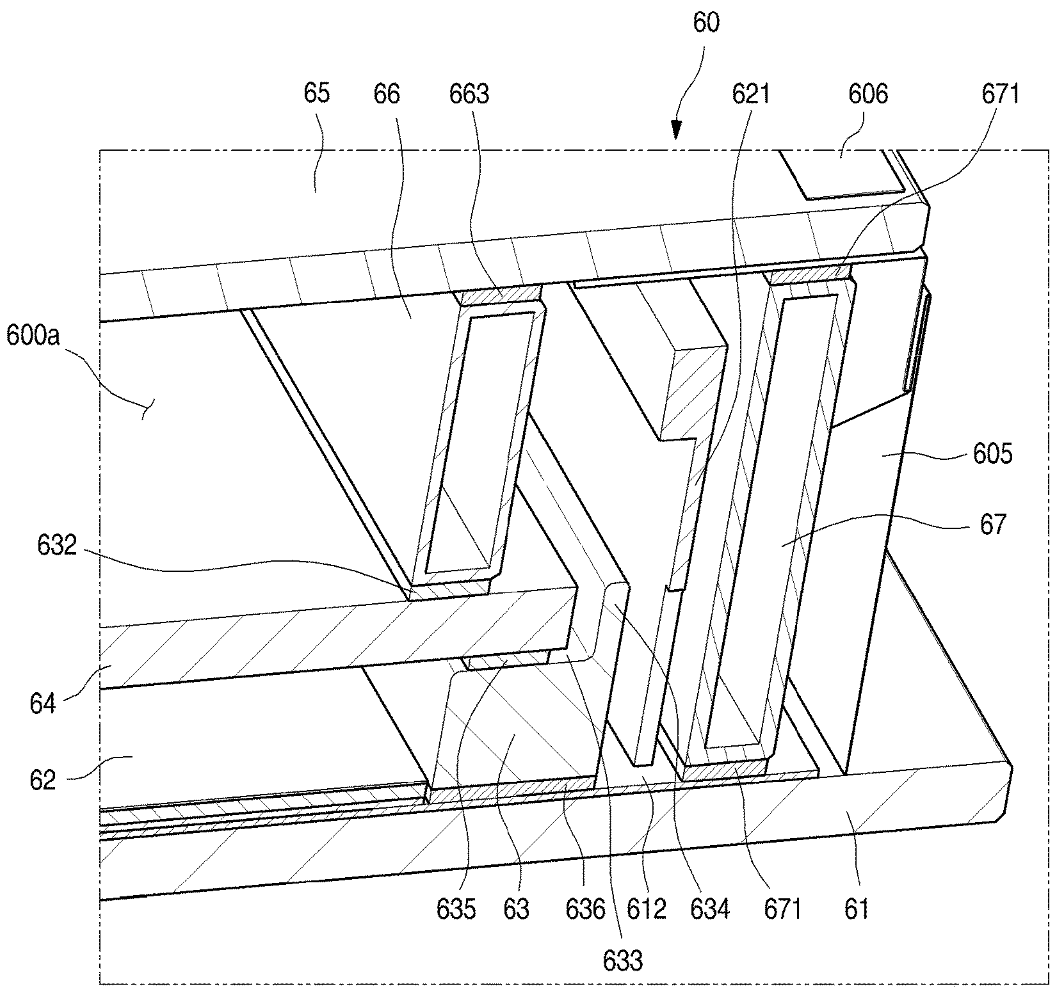
FIG. 17 is a cutaway perspective view of the transparent display assembly to which another example of the first spacer is mounted.

As illustrated in FIGS. 16 and 17, the display accommodation groove 632 may not be defined in a bottom surface of the first spacer 63, and the entire bottom surface of the first spacer 63 facing the front panel 61 may be provided as the adhesion part 631 having a flat shape. Thus, the entire bottom surface of the first spacer 63 may adhere to the rear surface of the front panel 61 by the adhesion member 636.

In this case, each of both the left and right ends of the display 62 may adhere to the inner surface of the first spacer 63. Both the left and right ends of the display 62 may be restricted by the first spacer 63 and thus do not move in the left and right directions. As a result, the display 62 may be maintained in the stably mounted state.

The support member 635 may also be disposed on a bottom surface of the second spacer 66 disposed on the top surface of the light guide plate 64. The second spacer 66 may support the light guide plate 64 downward so that the light guide plate 64 is pushed and fixed by the support member 635. The support member 635 may support the light guide plate 64 in a simple contact state and adhere to the second spacer 66 through an adhesive. Thus, even though the light guide plate 64 is contracted or expanded or finely elastically deformed by heat, the light guide plate may be fixed without being damaged.

The adhesion member 663 may be disposed on a top surface of the second spacer to adhere to the rear panel 65. The light guide plate 64 may be maintained at a preset distance with respect to the rear panel 65 by the second spacer 66.

Also, the outer spacer 67 is mounted outside the first spacer 63. The adhesion member 671 may be disposed on each of upper and lower ends of the outer spacer 67. The outer spacer 67 may be fixed to the front panel 61 and the rear panel 65 by the adhesion member 671 to define a circumferential surface of the transparent display 62.

The first spacer 63, the second spacer 66, and the light guide plate 64 may be spaced apart from the inner surface of the outer spacer 67 to define a space therein. Thus, the source board 621 may be disposed inside the outer spacer 67. That is, the source board 621 may be disposed in a space defined by the inside the outer spacer 67 and the first spacer 63 and also be disposed to extend in a direction perpendicularly crossing the front panel 61.

An end of the source board 621 may extend up to a position adjacent to the rear surface of the front panel 61, and one side of the source board 621 may be connected to the display through a space between the first panel 61 and the first spacer 63.

Here, a space may be defined between the front panel 61 and the first spacer 63. In detail, a wire constituting a portion of the source board 621, which passes between the first spacer 63 and the front panel 61, may exist. The wire may pass through the adhesion member 636.

Also, the source board 621 disposed between the outer spacer 67 and the first spacer 63 may be connected to the display cable 605. The cable connection part 605*a* of the display cable 605 may be connected to the source board 621 by passing through the outer spacer 67, and the display cable 605 may extend to an upper side of the transparent display assembly 60 in which the T-CON board 602 is disposed along the outer surface of the outer spacer 67. Also, the source board 621 may be connected to the T-CON board 602 by the display cable 605.

Figure 18:
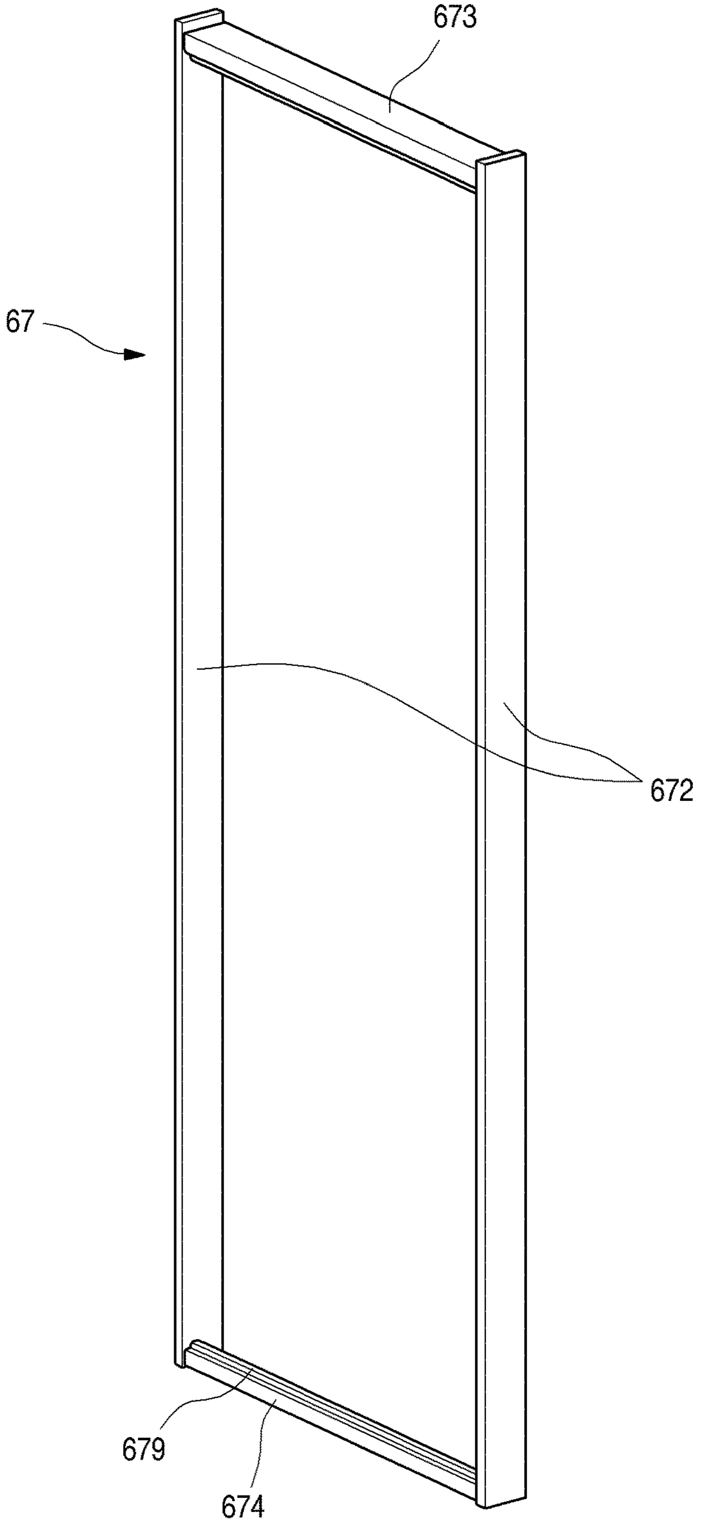
FIG. 18 is a perspective view of an outer spacer according to the first embodiment.

FIG. 18 is a perspective view of the outer spacer according to the first embodiment.

As illustrated in the drawing, the outer spacer 67 may have a rectangular frame shape. Also, the outer spacer 67 may have a sufficient size in which the light guide plate 64 and the first spacer 63 are accommodated. The outer spacer 67 includes a pair of frame sides 672 spaced apart from each other to define both left and right surfaces thereof and a frame upper 673 and a frame lower 674 connecting upper and lower ends of the pair of frame sides 672 to each other.

The frame side 672 may connect the front panel 61 to the rear panel 65 and also define both the side surfaces of the transparent display assembly 60. Both the left and right sides of the frame side 672 may have the same structure and shape. Also, the frame side 672 may have a hollow therein to reduce a weight thereof and be made of a lightweight metal material such as aluminum.

The frame upper 673 and the frame lower 674 may connect the front panel 61 to the rear panel 65 together with the frame side 672 and be coupled to the frame side 672 to define a close space between the front panel 61 and the rear panel 65.

The frame upper 673 and the frame lower 674 may define shapes of the top and bottom surfaces of the transparent display assembly 60, respectively. Also, the frame upper 673 and the frame lower 674 may have the same shape except for vertical mounted positions thereof.

The frame upper 673 and the frame lower 674 may support the light guide plate 64 in the state of being mounted on the front panel 61. The display light 68 may be disposed to emit light to the end of the light guide plate 64.

Figure 19:
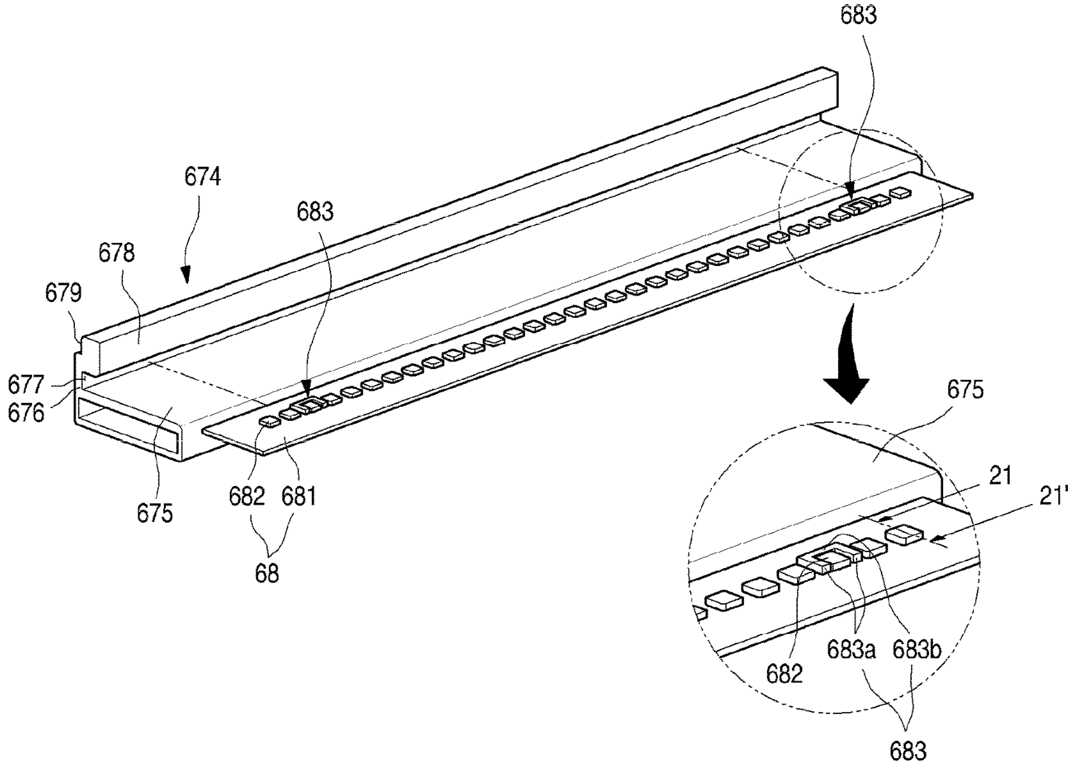
FIG. 19 is an exploded perspective view illustrating a coupled structure between the outer spacer and the display light.

FIG. 19 is an exploded perspective view illustrating a coupled structure between the outer spacer and the display light.

As illustrated in the drawing, the frame lower 674 may include a light mounting part 675, a light guide support part 678, and a connection part 676 connecting the light mounting part 675 to the light guide plate support part 678.

The light mounting part 675 connects the front panel 61 to the rear panel 65 and also provides a surface on which the display light 68 is mounted. Thus, the light mounting part 675 may have a plane facing the light guide plate 64, and thus, the display light 68 may be mounted on the light mounting part 675.

The connection part 676 extending upward may be disposed on one end of the light mounting part 675. The connection part 676 extends perpendicularly from an end of the light mounting part 675 and has a predetermined height. Thus, the light guide plate support part 678 may be disposed above the light mounting part 675 in a state of being spaced apart from the light mounting part 675.

A light accommodation part 677 may be further provided in a space between the light mounting part 675 and the light guide plate support part 678 by the connection part 676. The light accommodation part 677 may provide a space in which an LED board 681 of the display light 68 is accommodated and also guide the display light 68 so that the display light 68 is fixed and mounted in place.

That is, when an end of the LED board 681 of the display light 68 is disposed to be closely attached to the connection part 676 in the state of being accommodated in the light accommodation part 677, the display light 68 may be disposed at an accurate position. When the display light 68 is disposed at the accurate position, an LED 682 of the display light 68 may be disposed at a position corresponding to the end of the light guide plate 64.

The light guide plate support part 678 protrudes from the connection part 676 to define the light accommodation part 677. Also, the light guide plate support part 678 supports a lower end of the light guide plate 64. Here, a support member 636 disposed on the first spacer 63 may be disposed on the light guide plate support part 678. Thus, the light guide plate 64 may be supported by the light guide plate support part in the state of coming into contact with the support member 635.

The light guide plate support part 678 may have the same height as the light guide plate seating part 633 of the first spacer 63. Thus, both left and right ends of the circumference of the light guide plate 64 may be supported by the light guide plate seating part 633 of the first spacer 63, and upper and lower ends of the light guide plate 64 may be supported by the light guide plate support part 678 of the frame upper 673 and the frame lower 674. That is, the entire circumference of the light guide plate 64 may be supported by the first spacer 63 and the outer spacer 67.

A stepped part 679 may be provided on an outer end of the light guide plate 678, which is adjacent to the front panel 61. The stepped part 679 may be spaced apart from the front panel 61 in the state in which the outer spacer 67 is mounted on the front panel 61 to provide a space in which the end of the display 62 is accommodated.

Thus, the first spacer 63 and the outer spacer 67 may be fixed and mounted on the front panel 61, and the circumference of the display 62 may also be restricted by the first spacer 63 and the outer spacer 67.

The display light 68 may be longitudinally disposed along the light mounting part 675 and include a plurality of LEDs 681 and the LED board 682 on which the LEDs 681 are continuously mounted at a predetermined interval. The display light 68 may have a different structure for emitting light except for the LED.

The LED 681 may be disposed at a position corresponding to a lower end of the light guide plate 64. Thus, light emitted through the LED 681 may be directed to an end of the light guide plate 64 and then travel along the light guide plate 64 so that the entire surface of the light guide plate 64 emits light.

When the display light 68 is mounted, the LED board 682 may be closely attached to the light accommodation part 677 so that the LED 681 is accurately disposed at the lower end of the light guide plate 64. That is, in the state in which the LED board 682 is closely attached to the light accommodation part 677, the LED 681 may be disposed right below the light guide plate 64.

Also, a light guide plate stopper 683 protruding upward to support the light guide plate 64 upward in the state in which the light guide plate 64 is mounted may be disposed on the LED board 681. The light guide plate stopper 683 may protrude from the LED board 681 and be disposed at a position corresponding to the lower end of the light guide plate 64.

The light guide plate stopper 683 may protrude between the plurality of LEDs 682. Here, the light guide plate stopper 683 may protrude to the lower end of the light guide plate 64 by a height greater than that of the LED 682. Thus, although the light guide plate 64 moves downward by the impact when the sub door 50 is opened and closed, the light guide plate 64 may not more move downward by coming into contact with the light guide plate stopper 683 to protect the LEDs 682. The light guide plate stopper 683 may be disposed on both left and right sides of the display light 68. If necessary, a plurality of light guide plate stoppers 683 may be disposed at a predetermined interval.

Also, the light guide plate stopper 683 may include a pair of stopper parts 683*a* disposed in a space between the LEDs 682 and a stopper connection part 683*b* connecting ends of the pair of stopper parts 683*a* to each other. The stopper part 683*a* and the stopper connection part 683*b* may be disposed along the outside of the LED 682, and the end of the light guide plate 64 may substantially come into constant contact with the stopper part 683*a*.

The light guide plate stopper 683 may be integrally molded when the LED board 681 is molded. If necessary, the light guide plate stopper 683 may be separately molded and then attached to the LED board 681. Also, the light guide plate stopper 683 may have various structures and shapes that are capable of supporting the end of the light guide plate 64.

Also, since the light guide plate 64 is mainly movable downward by a self-weight thereof, when the display light 68 are disposed at all of upper and lower sides, the light guide plate stopper 683 may be disposed on the lower display light 68, i.e., only the display light 68 mounted on the frame lower 674.

Figure 20:
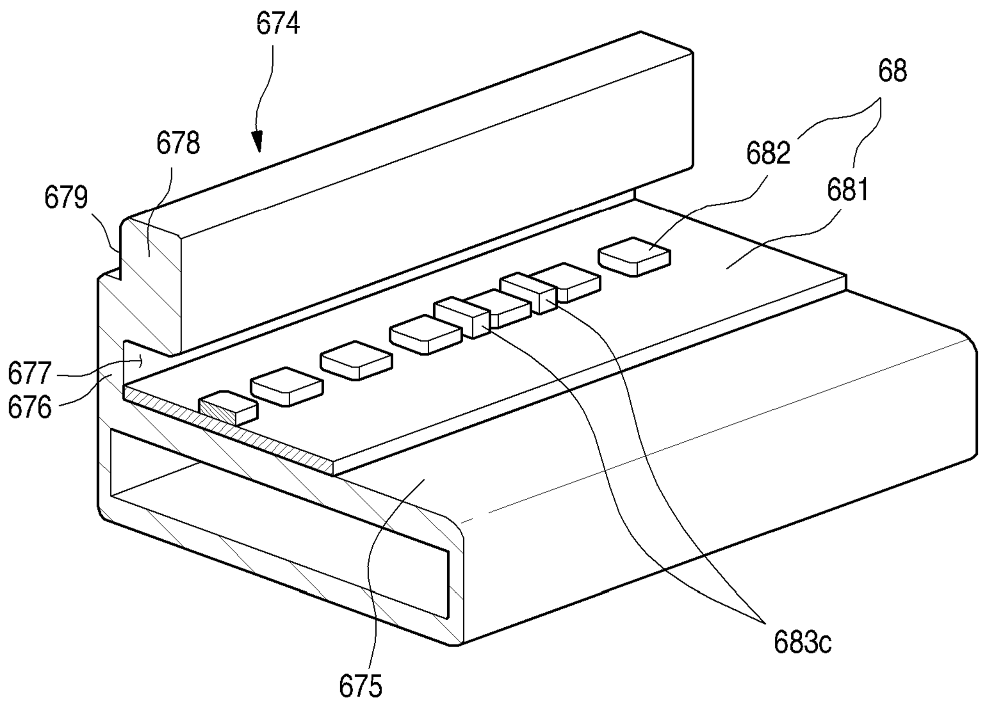
FIG. 20 is a perspective view illustrating another example of the display light.

FIG. 20 is a perspective view illustrating another example of the display light.

As illustrated in the drawing, a light guide plate stopper 683*c* protruding from the LED board 681 may have a projection shape between the LEDs 682. The light guide plate stopper 683*c* may be disposed on both left and right ends of the whole display light 68. Also, a plurality of light guide plate stoppers 683*c* may protrude between the plurality of LEDs 682.

The light guide plate stopper 683*c* may be integrated with the LED board 681 and have a length greater than a width in a front and rear direction of at least the LED board 681 to protrude by a height greater than that of the LED 682.

Thus, when the light guide plate 64 moves in a vertical direction or droops, the light guide plate stopper 683*c* may come into contact with the lower end of the light guide plate 64 before coming into contact with the LED 682 to support the light guide plate.

Figure 21:
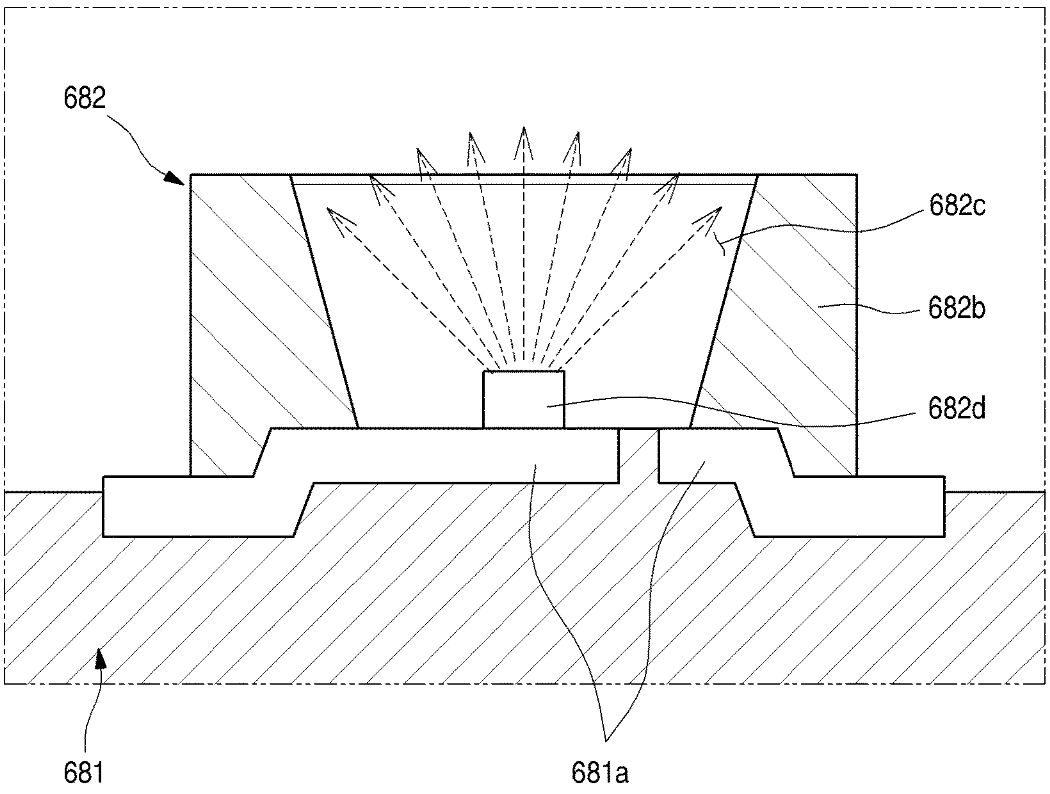
FIG. 21 is a cross-sectional view taken along line 21-21' of FIG. 19.

FIG. 21 is a cross-sectional view taken along line 21-21' of FIG. 19.

When a structure of the display light 68 is described in more detail with reference to the drawing, the LED 682 constituting the display light 68 may be mounted on a top surface of the LED board 681.

An electrode terminal 681*a* may be printed on the LED board 681. An LED chip 682*d* having a semiconductor P-N junction structure may be disposed on the electrode terminal 681*a*. Also, a case 682*b* accommodating the LED chip 682*d* may be disposed on the top surface of the LED board 681, and a chip accommodation part 682*c* having a cup shape may be provided in an inner surface of the case 682*b*. Also, a phosphor may be filled into the chip accommodation part 682*c*. Also, a top surface of the case 682*b* may have a lens structure.

Also, when power is applied to the LED chip 682*d* to emit light, the phosphor may absorb light emitted from the LED chip 682*d* to emit light. Here, brightness and a color temperature may be adjusted according to optical conversion efficiency and an optical color of the phosphor.

In this structure, when the light guide plate 64 moves, the end of the light guide plate 64 may collide with the case 682*b*, and thus, the case 682*b* may be damaged by the impact. When the phosphor within the case 682*b* leaks or is damaged by the damage of the case 682*b*, the display light 68 may abnormally operate.

Thus, the light guide plate stopper 675*b* may further protrude than the LED 682 between the LEDs 682 to prevent the light guide plate 64 from coming into contact with the LED case 682*b* even through the light guide plate 64 moves, thereby preventing the LED 682 from being damaged and securing a normal operation of the display light 68.

Figure 22:
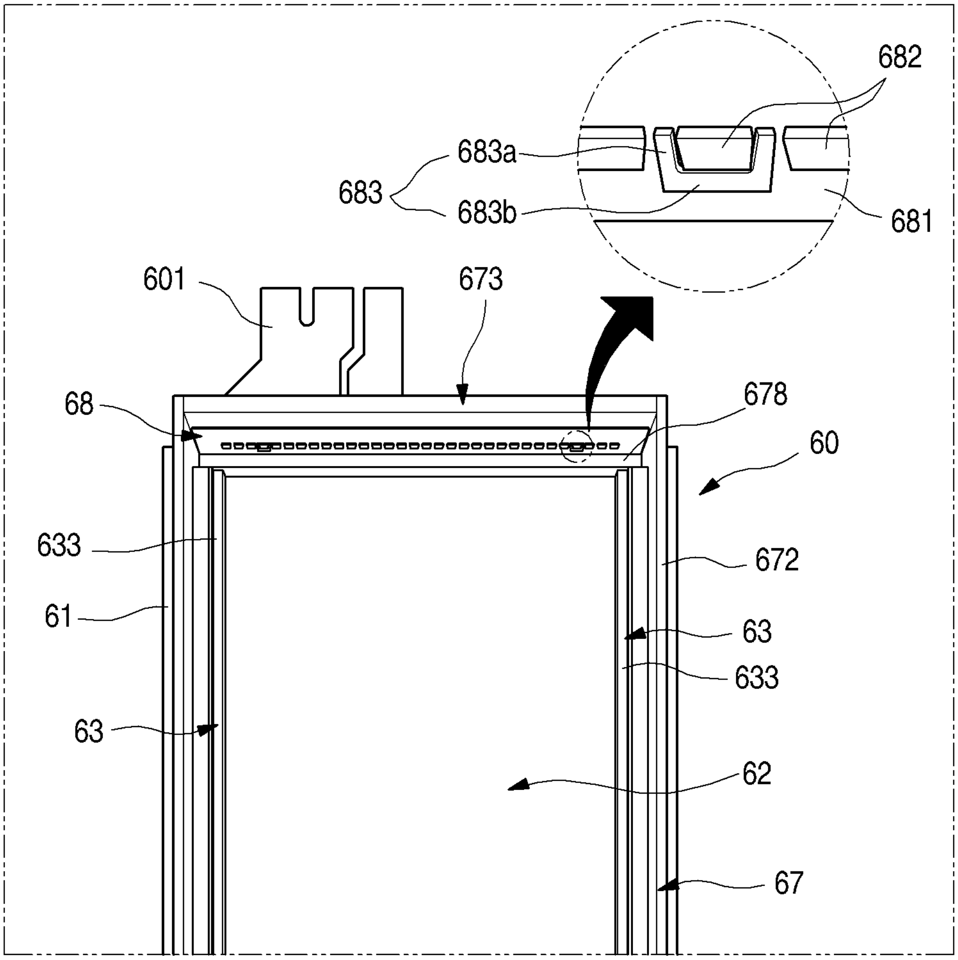
FIG. 22 is a partial perspective view illustrating a state before a light guide plate is mounted on the transparent display assembly.
Figure 23:
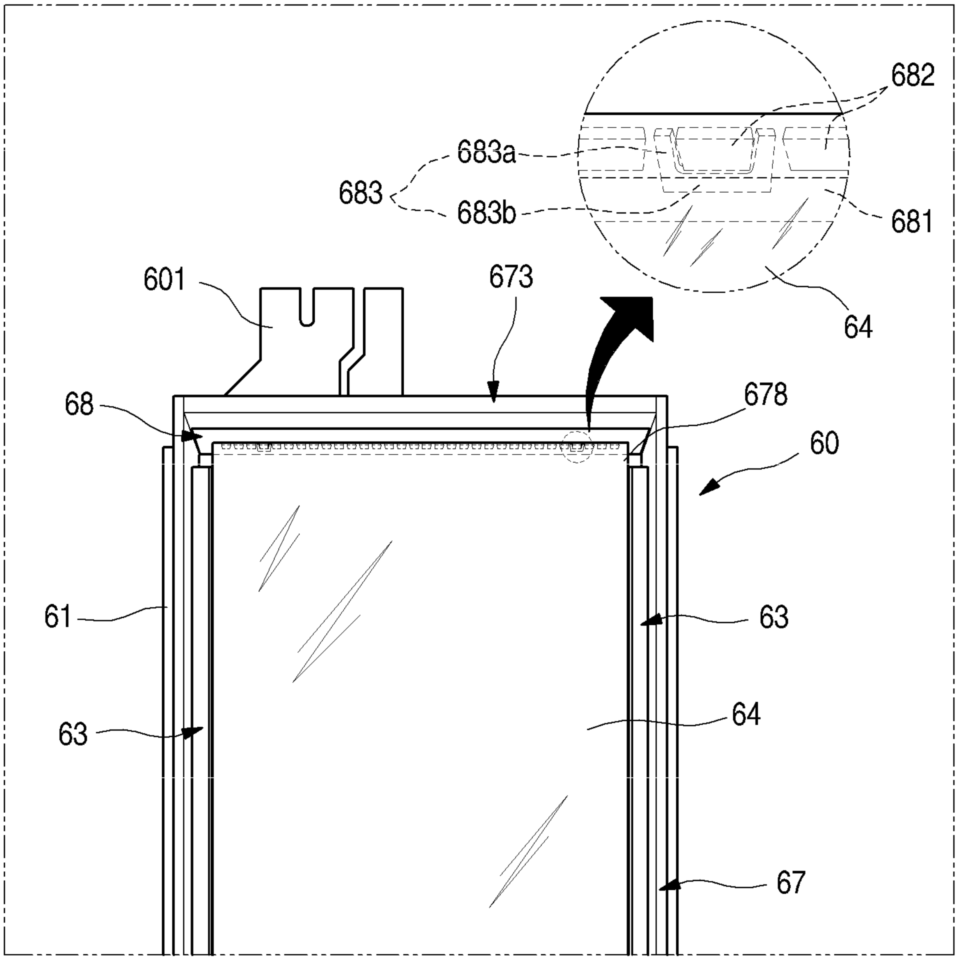
FIG. 23 is a partial perspective view illustrating a state in which the light guide plate is mounted on the transparent display assembly.
Figure 24:
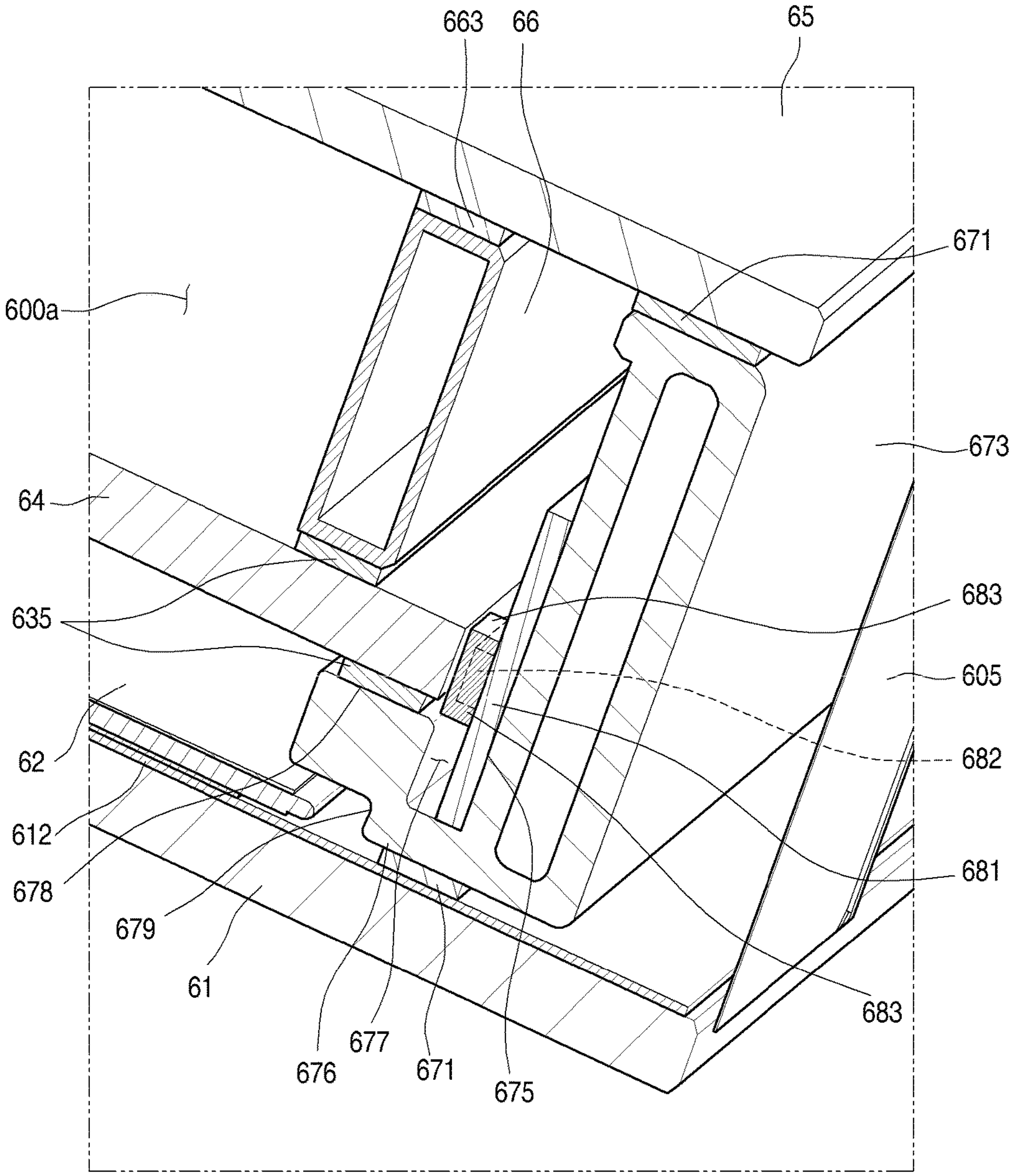
FIG. 24 is a cutaway perspective view taken along line 24-24' of FIG. 8.

FIG. 22 is a partial perspective view illustrating a state before the light guide plate is mounted on the transparent display assembly. Also, FIG. 23 is a partial perspective view illustrating a state in which the light guide plate is mounted on the transparent display assembly. Also, FIG. 24 is a cutaway perspective view taken along line 24-24' of FIG. 8.

As illustrated in the drawings, the outer spacer 67 may be mounted on the rear surface of the front panel 61, and the display 62 may be mounted on the front panel 61 in an inner region of the outer spacer 67. Also, the display light 68 may be mounted on an inner surface of the frame upper 673.

Also, the first spacer 63 may be mounted on each of both sides of the display 62 in the inner region of the outer spacer

67, and the support member 635 may adhere to the light guide plate seating part 633 of the first spacer 63. Also, the support member 635 may also adhere to the light guide plate support part 678 of the frame upper 673.

In this state, as illustrated in FIG. 22, the light guide plate 64 may be seated on the light guide plate seating part 633 of the first spacer 63 and the light guide plate support part 678 of the frame upper 673. The light guide plate 64 may be in the state of being supported by the support member 635 and mounted inside a space defined by the first spacer 63 and the upper and lower portions of the outer spacer 67.

In the state in which the light guide plate 64 is fixed and mounted, as illustrated in FIGS. 23 and 24, the end of the light guide plate 64 may be disposed in the same extension line as the LED 682 of the display light 68. Thus, light emitted from the display light 68 may be emitted to the light guide plate 64 to brighten up the light guide plate 64.

Also, when the light guide plate 64 is mounted, the light guide plate stopper 683 may also be disposed on the same extension line as the end of the light guide plate 64. Thus, although the light guide plate 64 moves when the sub door 50 is opened and closed, or when an impact is applied to the sub door 50, the end of the light guide plate 64 may not come into contact with the LED 682, but come into contact with the light guide plate stopper 683 to prevent the LED 682 from being damaged.

Hereinafter, an assembly of the transparent display assembly having the above-described structure will be described.

Figure 25:
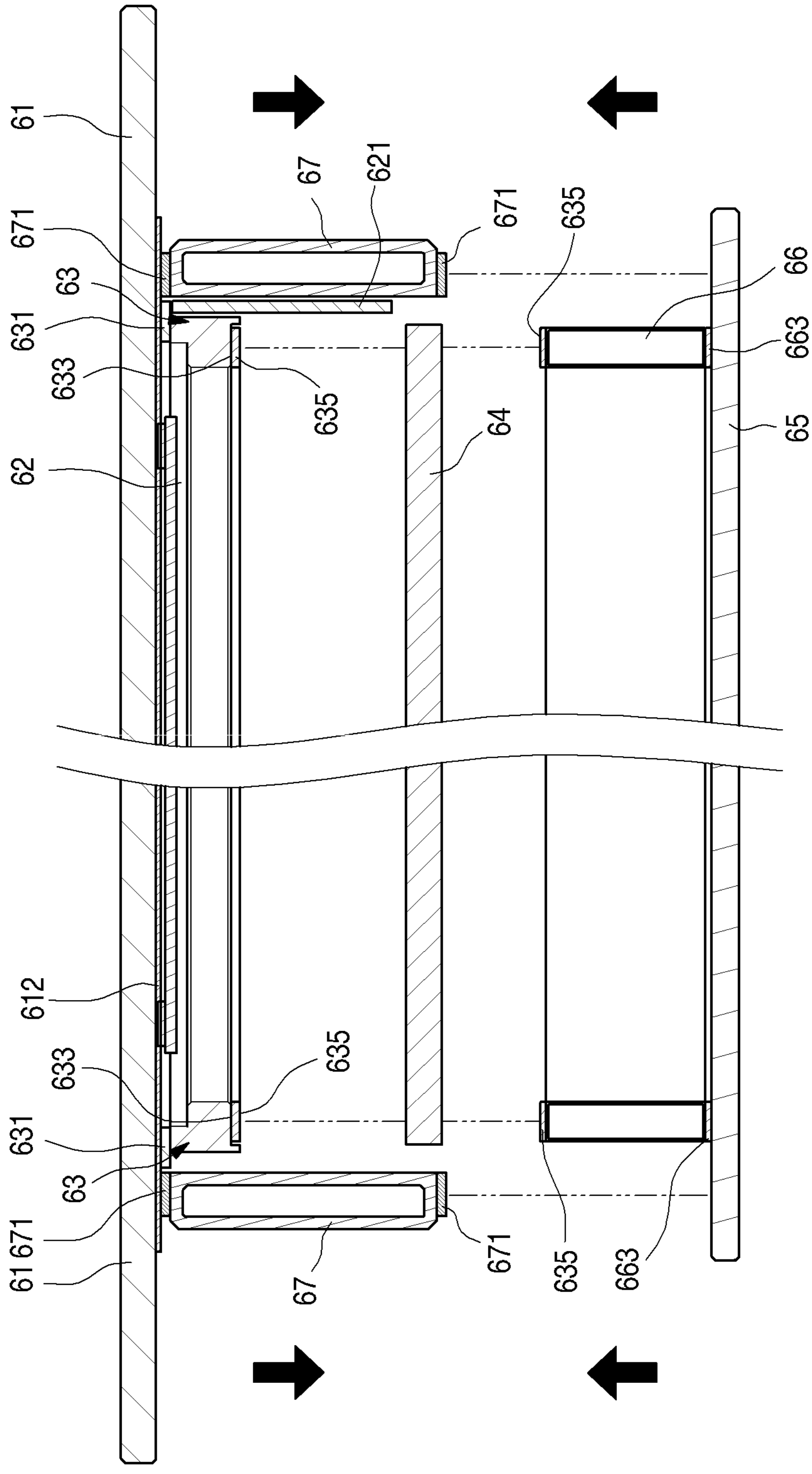
FIG. 25 is a view illustrating an assembly process of the transparent display assembly.
Figure 26:
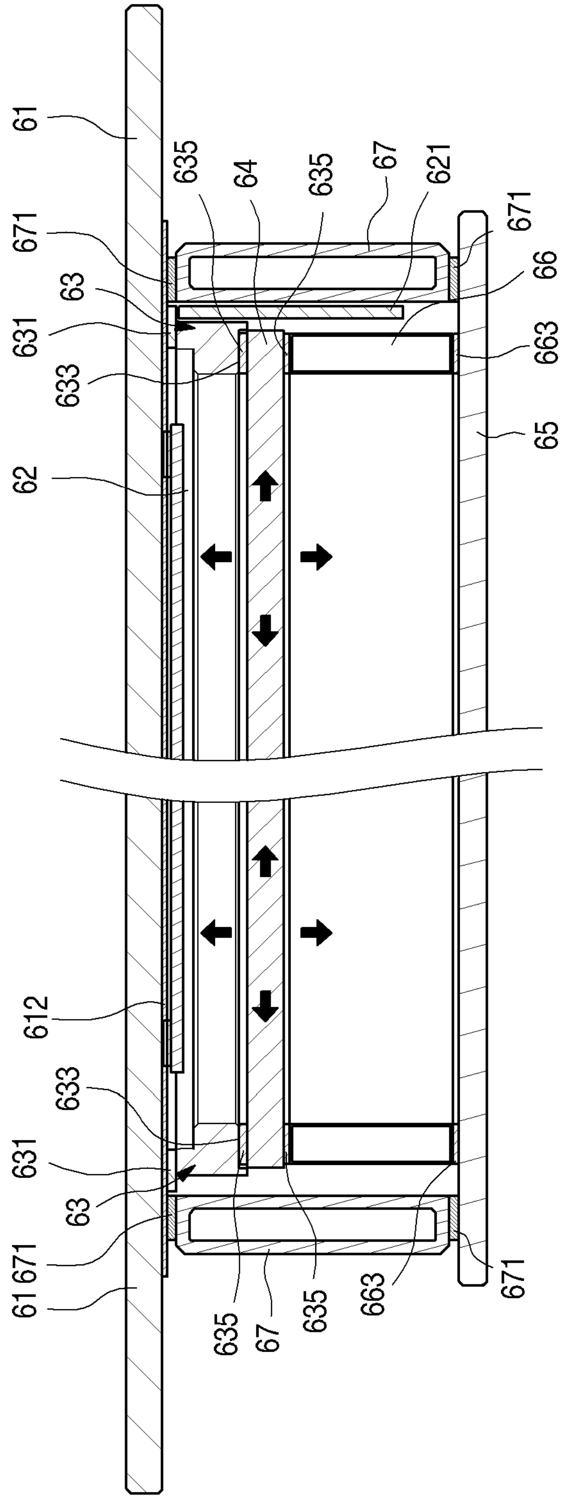
FIG. 26 is a cross-sectional view illustrating a state in which the transparent display assembly is assembled.

FIG. 25 is a view illustrating an assembly process of the transparent display assembly. Also, FIG. 26 is a cross-sectional view illustrating a state in which the transparent display assembly is assembled.

As illustrated in the drawings, to assemble the transparent display assembly 60, the touch sensor 612 is disposed on the front panel 61, and then the display 62 is mounted. Also, the outer spacer 67 may be attached to the circumference of the front panel outside the display by using the adhesion member 671.

The first spacer 63 may be attached to both the left and right sides of the display 62 inside the outer spacer 67 by using the adhesion member 636.

The second spacer 66 may adhere to the rear panel 65 by the adhesion member 663. Also, the support member 635 is attached to the upper end of the second spacer 66 coming into contact with the light guide plate 64.

As illustrated in the drawings, the front panel 61 on which the display 62, the first spacer 63, and the outer spacer 67 are mounted and the rear panel 65 on which the second spacer 66 is mounted may be assembled with the light guide plate 64 therebetween.

That is, the light guide plate 64 may be seated on the light guide plate 64 of the first spacer 63 mounted on the front panel 61. Here, the first light guide plate 64 may come into contact with the light guide plate seating part 633 and the support member 635 disposed on the light guide plate support part 678 of the outer spacer 67.

In this state, the rear panel 65 mounted on the second spacer 66 may be coupled to the front panel 61. The adhesion member 671 disposed on the lower end of the outer spacer 67 may adhere to the rear panel 65. Thus, the front panel 61 and the rear panel 65 may be connected to each other by the outer spacer 67. Also, when the rear panel 65 is coupled, the support member 635 disposed on the upper end of the second spacer 66 may come into contact with the bottom surface of the light guide plate 64.

In the state in which both ends of the outer spacer 67 are fixed to both sides of the front panel 61 and the rear panel 65, as illustrated in FIG. 22, all of the top and bottom surfaces of the light guide plate 64 may be supported by the support member 635. Here, the support member 635 may support the light guide plate 64 in a pressing state, and thus, the light guide plate 64 may be stably maintained in the mounted state.

In this state, when the sub door 50 is opened and closed, an impact may be applied to the sub door 50. In addition, the light guide plate 64 may somewhat move in the mounted state due to the characteristics of the light guide plate 64 in which the light guide plate 64 is not completely adhered and fixed so that the light guide plate 64 is expandable or contractible by heat.

Also, while the transparent display assembly 60 and the sub door 50 are manufactured and carried, an impact may be applied, and thus, the light guide plate 64 may move. Here, the light guide plate 64 may finely move.

The light guide plate 64 may be pressed and fixed by the support member 635, and the support member 635 may be made of a material such as silicon to protect the surface of the light guide plate 64.

In detail, when the sub door 50 operates to be opened and closed, or when the sub door 50 or the transparent display assembly 60, which is in assembled state, is assembled or carried, even though the light guide plate 64 moves, the scratches may not occur in the surface of the light guide plate by the support member 635. Also, when the sub door 50 is opened and close, the support member 635 may buffer the impact applied to the light guide plate 64 to prevent the impact from being applied to the light guide plate 64 as it is.

Also, although heat is generated from the display light 68, the display 62, and the PCB connected to the display 62, the support member 635 may be made of a thermal insulation material to block heat transfer. That is, the support member 635 may prevent heat from being directly transferred to the light guide plate 64 through the first spacer 63, thereby preventing the light guide plate 64 from being excessively bent or deformed by the directly transferred heat.

Figure 27:
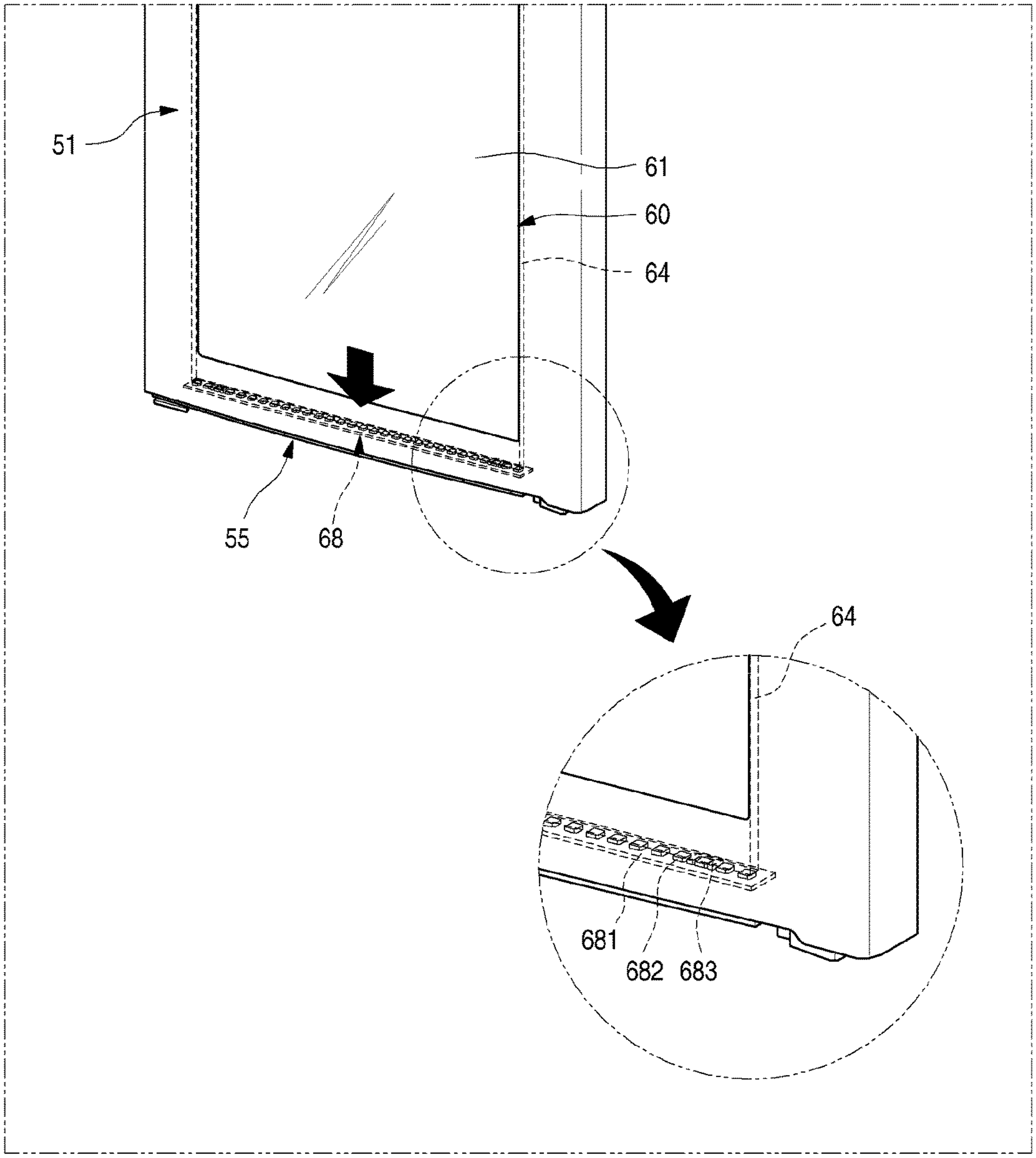
FIG. 27 is a view illustrating a state in which the display light supports the light guide plate.

FIG. 27 is a view illustrating a state in which the display light supports the light guide plate.

As illustrated in the drawing, in the state in which the sub door 50 is assembled, the transparent display assembly 60 is mounted on the sub door 50. The transparent display assembly 60 may be maintained in a stand-up state, and thus, the light guide plate 64 may also be maintained in a stand-up state.

Also, the display light 68 may emit light to the lower end of the sub door 50, and the LED 682 may be turned on vertically below the light guide plate 64 to emit light to the end of the light guide plate 64, thereby brightening up the light guide plate 64.

In this state, the light guide plate 64 may droop downward or move downward by the continuous opening/closing impact or the self-weight of the sub door 50. Here, the light guide plate stopper 683 may come into contact with the light guide plate 64 to prevent the light guide plate 64 from further moving downward. Thus, the contact between the lower end of the light guide plate 64 and the LED 682 may be fundamentally prevented to prevent the LED 682 from being damaged.

Hereinafter, turn-on/off states of the display light and the door light will be described in more detail with reference to the accompanying drawings.

Figure 28:
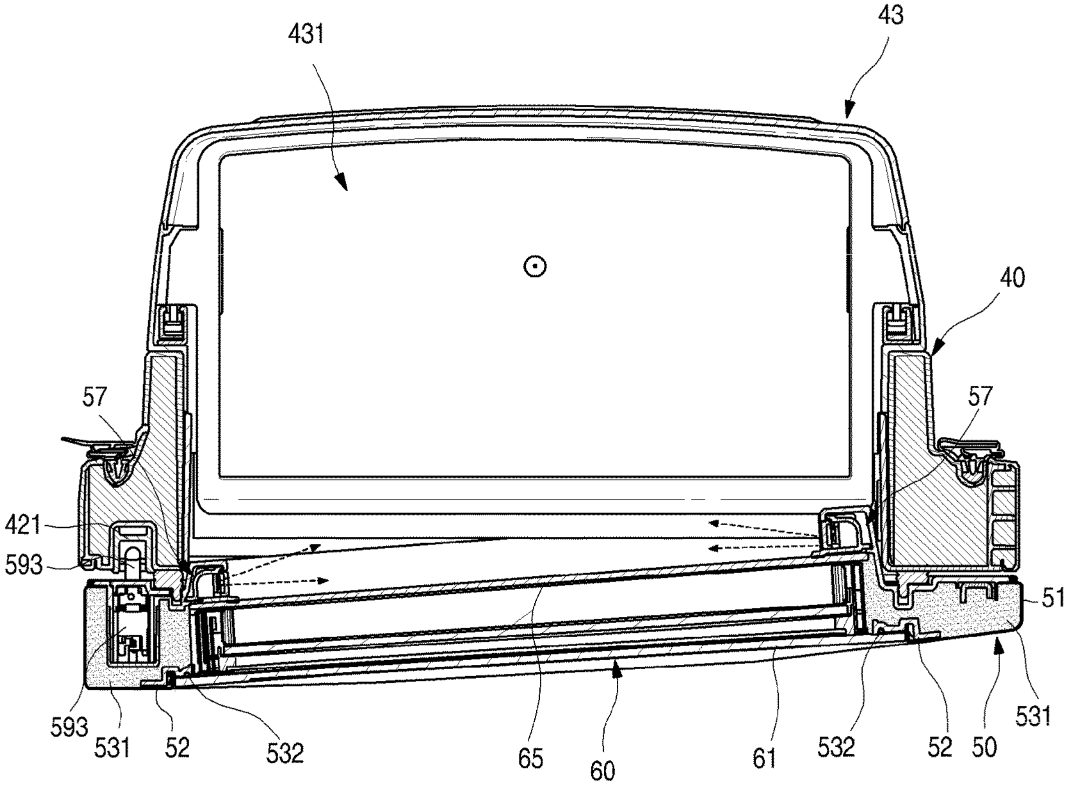
FIG. 28 is a transversal cross-sectional view of the main door and the sub door.
Figure 29:
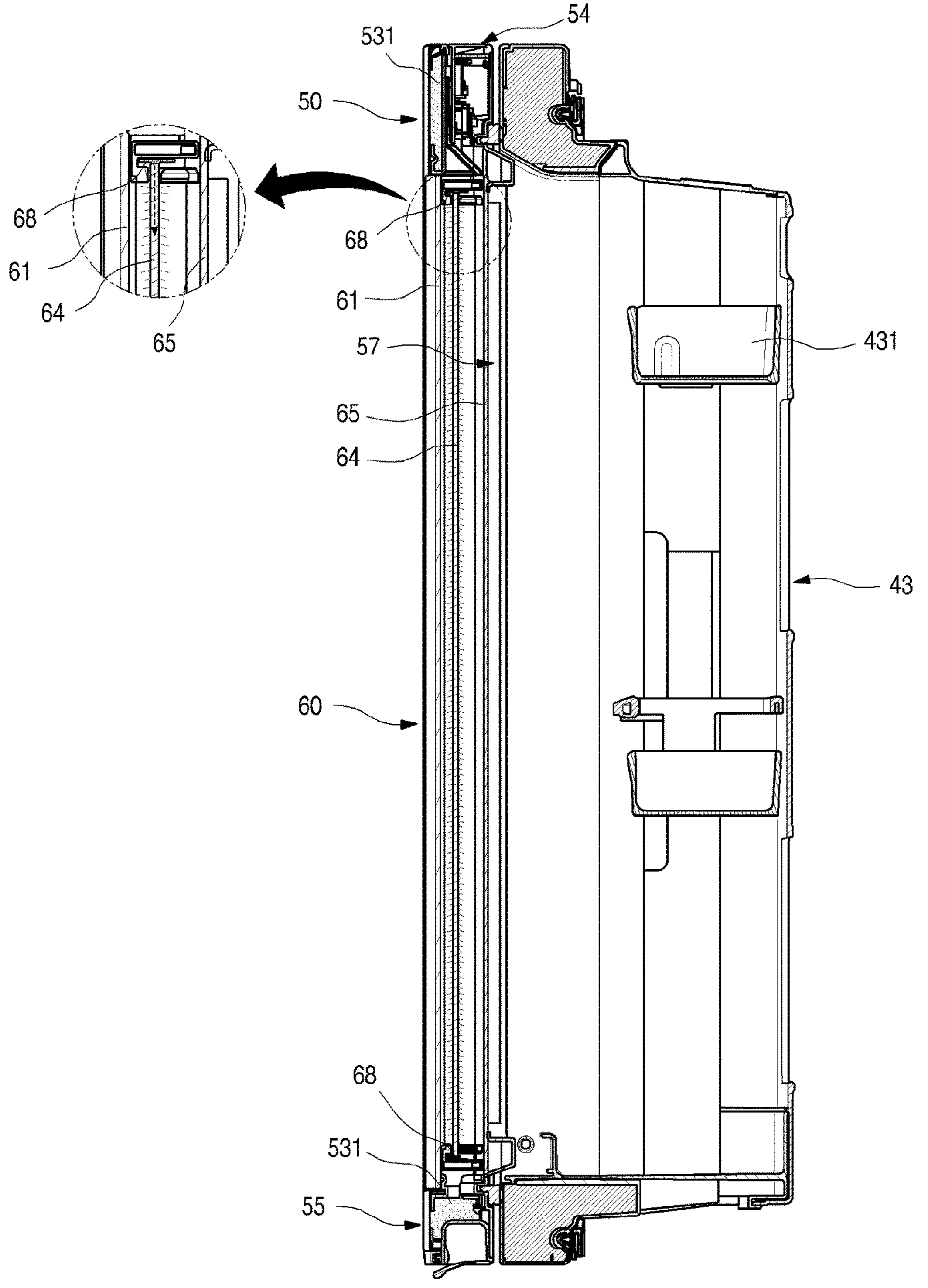
FIG. 29 is a transversal cross-sectional view of the main door and the sub door.
Figure 30:
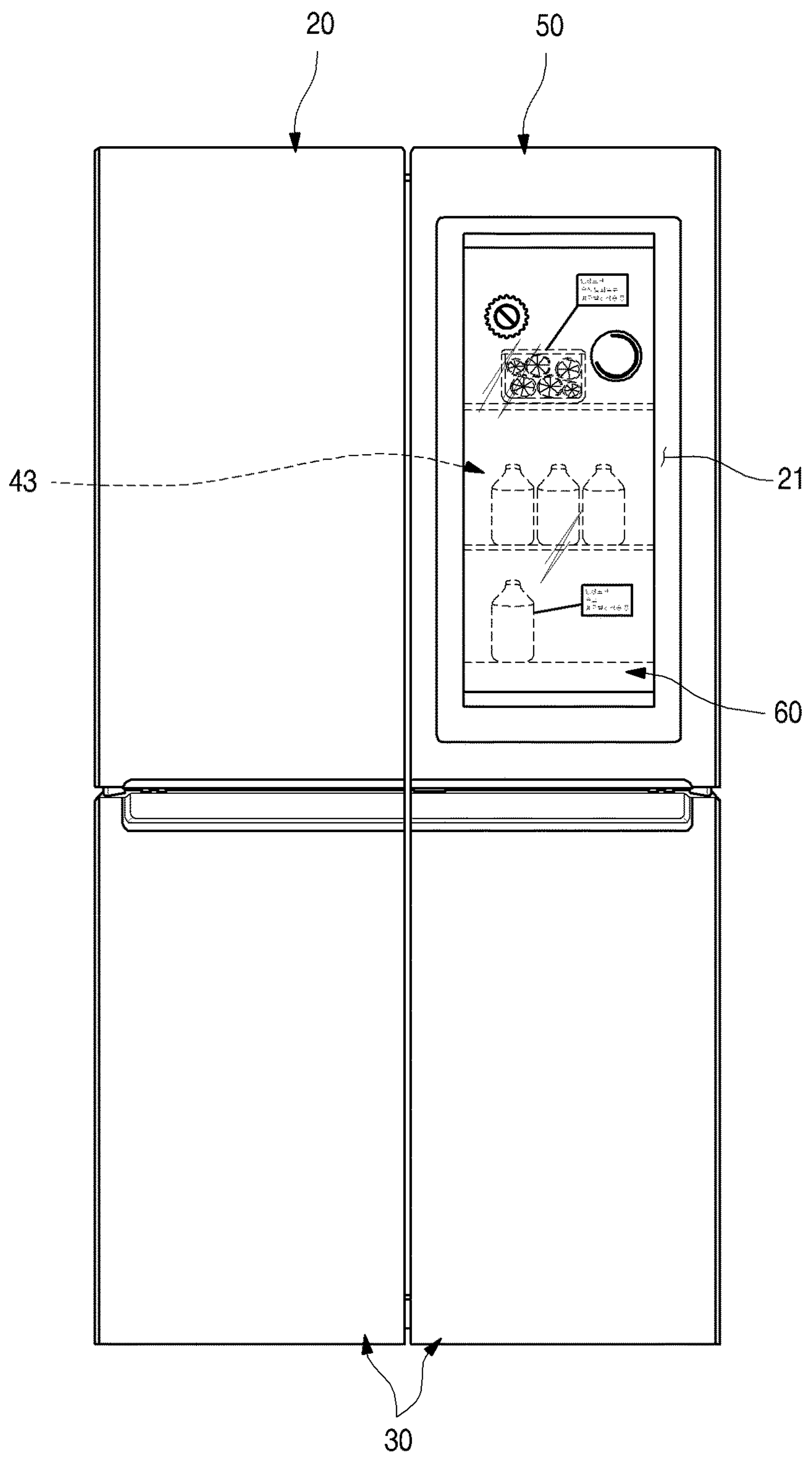
FIG. 30 is a view illustrating a state in which the inside of the refrigerator is seen through the transparent display assembly.
Figure 31:
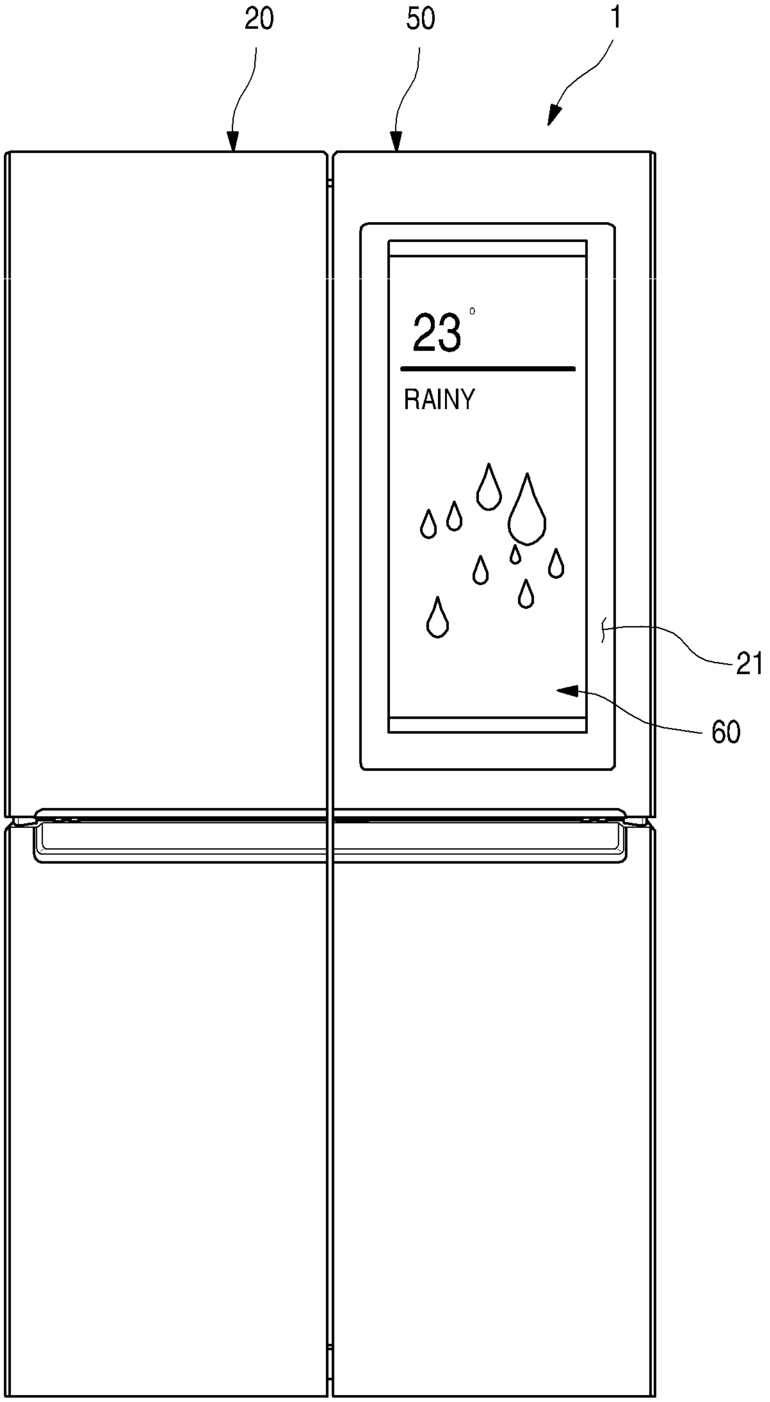
FIG. 31 is a view illustrating a state in which a screen is outputted through the transparent display assembly.

FIG. 28 is a transverse cross-sectional view of the main door and the sub door. Also, FIG. 29 is a longitudinal cross-sectional view of the main door and the sub door. Also, FIG. 30 is a view illustrating a state in which the inside of the refrigerator is seen through the transparent display assembly. Also, FIG. 31 is a view illustrating a state in which a screen is outputted through the transparent display assembly.

As illustrated in the drawings, in a state in which a locking member 593 of the opening device 59 is inserted into a latch hole 421, the sub door 50 may be maintained in a closes state. In this state, the door light 57 may be maintained in a turn-off state. An opened or closed state of the sub door 50 may be detected through a door switch that is separately provided.

In the turn-off state of the door light 57, as illustrated in FIG. 1, the rear space of the sub door 50 may be dark, and thus, the inside of the refrigerator 1 may not be seen through the see-through part 21. Thus, in the closed state of the sub door 50, if separate manipulation is not performed, the door light 57 may be maintained in the turn-off state, and the inside of the refrigerator 1 may not be seen through the see-through part 21.

In this state, the user may manipulate the front panel 61 to turn on the door light 57. When the door light 57 is turned on, light emitted from a lighting module may be emitted to positions of both rear left and right sides of the rear panel 65, which face each other.

The door light 57 may extend from the upper end to the lower end of the rear panel 65. That is, the light emitted by the door light 57 may illuminate the entire rear region of the rear panel 65 from both the left and right sides of the rear panel 65.

Here, when the display light 68 is in the turn-on state together with the door light 57, light may be emitted upward and downward by the display light 68, and thus the light may be emitted from left and right sides by the door light 57. As a result, the light may be emitted to the see-through part 21 in all directions to maximally brighten up an area of the see-through part 21.

The door light 57 may emit light in directions facing each other in a state of being close to the rear panel 65. The light emitted by the door light 57 may brighten up an inner case of the accommodation case 43 and also brighten up the front region over the rear panel 65. Thus, as illustrated in FIG. 30, the door light 57 may serve as a lighting for brightening up the inner space of the refrigerator 1, which is seen through the see-through part 21 and also serve as an auxiliary backlight for allow the display 62 to be more clearly displayed.

That is, in a state in which a screen is being outputted through the display 62, the inner space of the refrigerator 1, i.e., the rear space of the sub door 50 may be selectively seen through the see-through part 21. To allow the rear space of the sub door 50 to be seen through the see-through part 21, the door light 57 may be turned on.

A turn on/off combination of the display light 68 and the door light 57 may be variously realized according to a degree of seeing of the inside of the accommodation case 43 through the see-through part 21.

Also, when the user manipulates the front panel 61 disposed on the front surface of the refrigerator 1, the display light 68 may be turned on to turn on the display 62. Thus, the transparent display assembly 60 may output a screen as illustrated in FIG. 31. Here, the manipulation of the front panel 61 may be inputted as one of a specific position, the touch number, or a pattern. As occasion demands, a separate physical button or sensor may be used to detect the user's manipulation.

A screen for displaying a state of the refrigerator 1 and manipulating may be outputted on the display 62. Here, various screens for information with respect to accommodated foods may be outputted by using Internet, image output external input devices, or the like.

In detail, the display light 68 disposed on each of the upper and lower ends of the light guide plate 64 may be turned on together with the display 62 by the user's manipulation. The light guide plate 64 may irregularly reflect and diffuse light of the display light 68 by the turn-on of the display light 68 to emit light having generally uniform brightness to the front display 62.

Also, light may be emitted to the display 62 from the rear side of the display 62 by the light guide plate 64, and simultaneously, a screen based on inputted image information may be outputted on the display 62. Thus, the user may confirm the clearly outputted screen through the see-through part 21.

In addition to the foregoing embodiment, a refrigerator according to various embodiments may be exemplified.

According to a second embodiment, a first space supporting a light guide plate supports the entire circumference of one surface of the light guide plate. Thus, the second embodiment is the same as the first embodiment except for structures of the first spacer and an outer spacer, and thus, other constituents are the same as those of the foregoing embodiment. Also, in the current embodiment, the same constituent as those of the abovementioned embodiments will be denoted by the same reference numeral, and its detailed description will be omitted.

Figure 32:
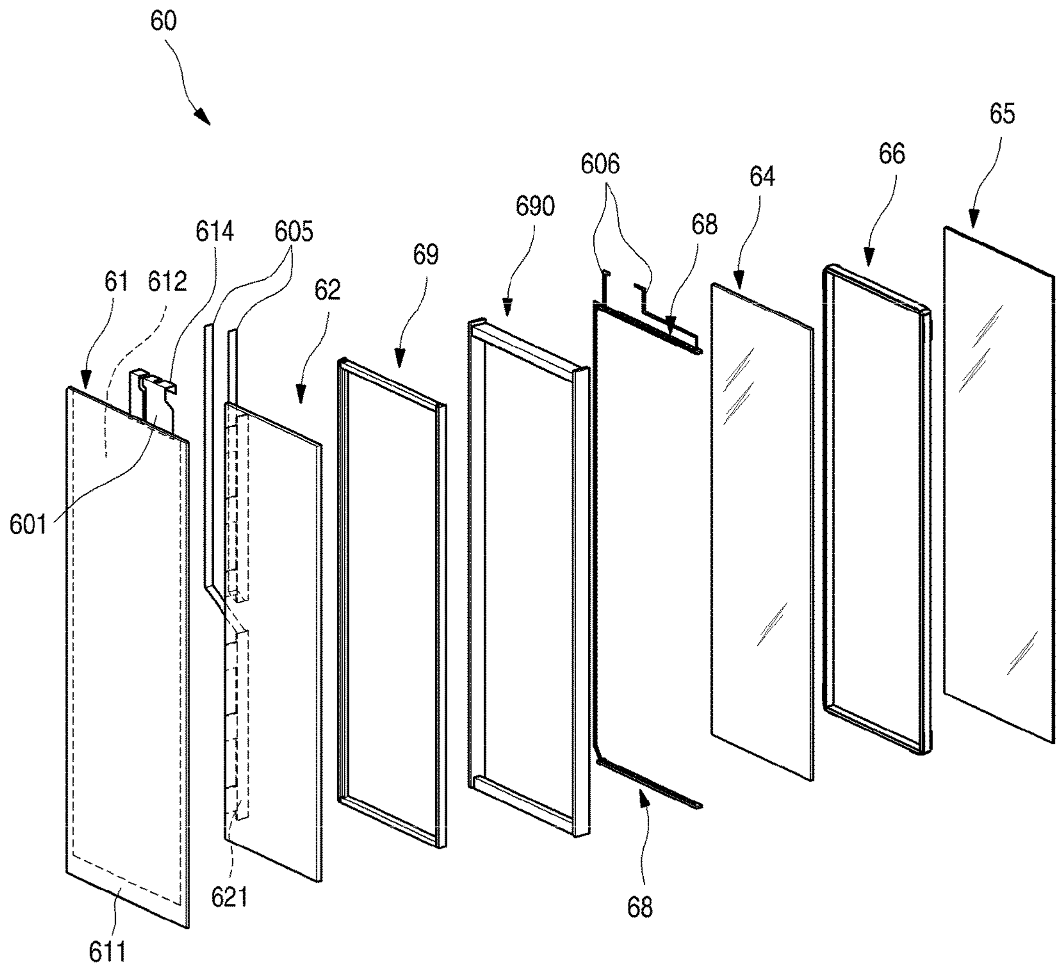
FIG. 32 is an exploded perspective view of a transparent display assembly according to a second embodiment.
Figure 33:
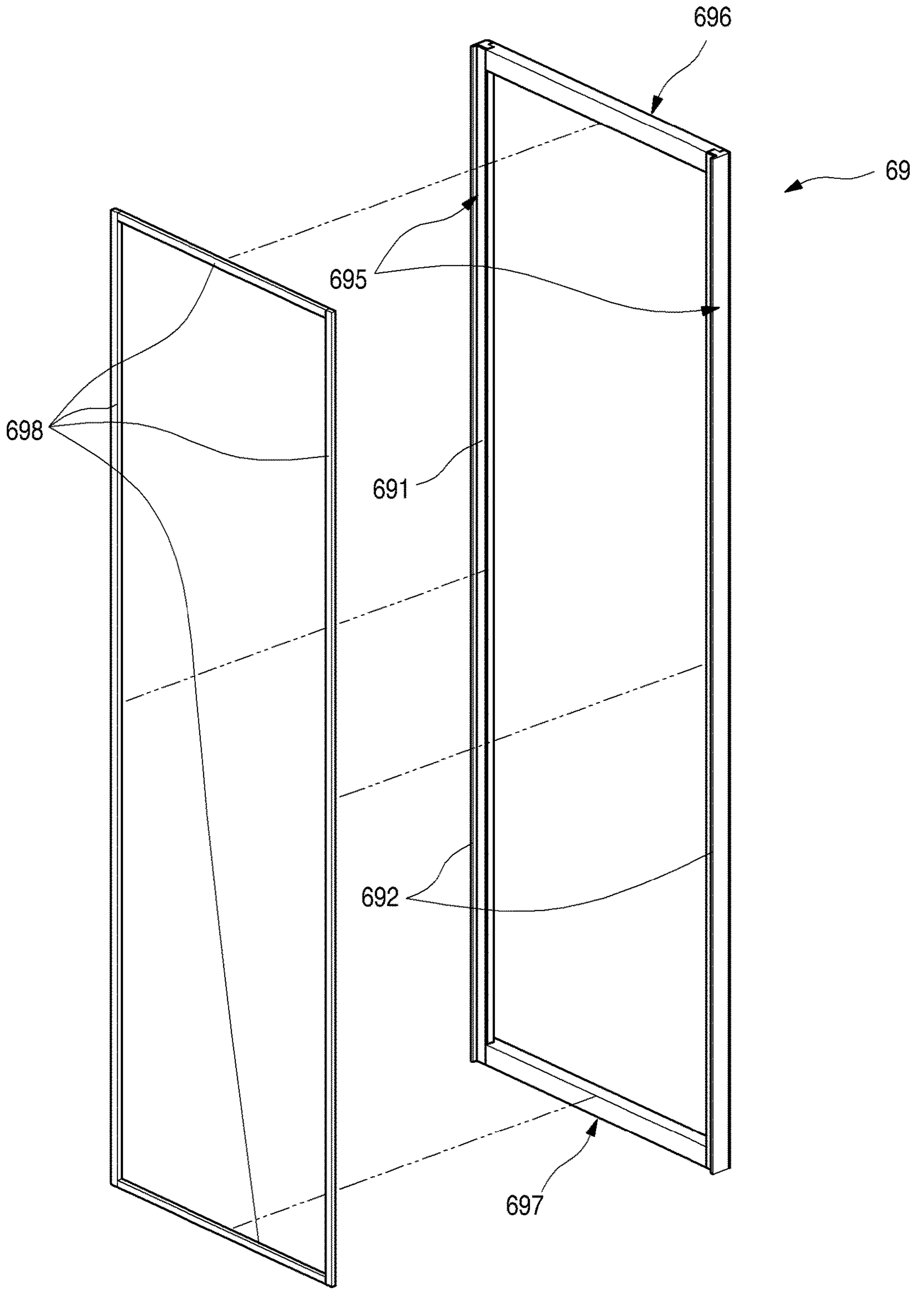
FIG. 33 is a perspective view illustrating a first spacer and a support member of the transparent display assembly.
Figure 34:
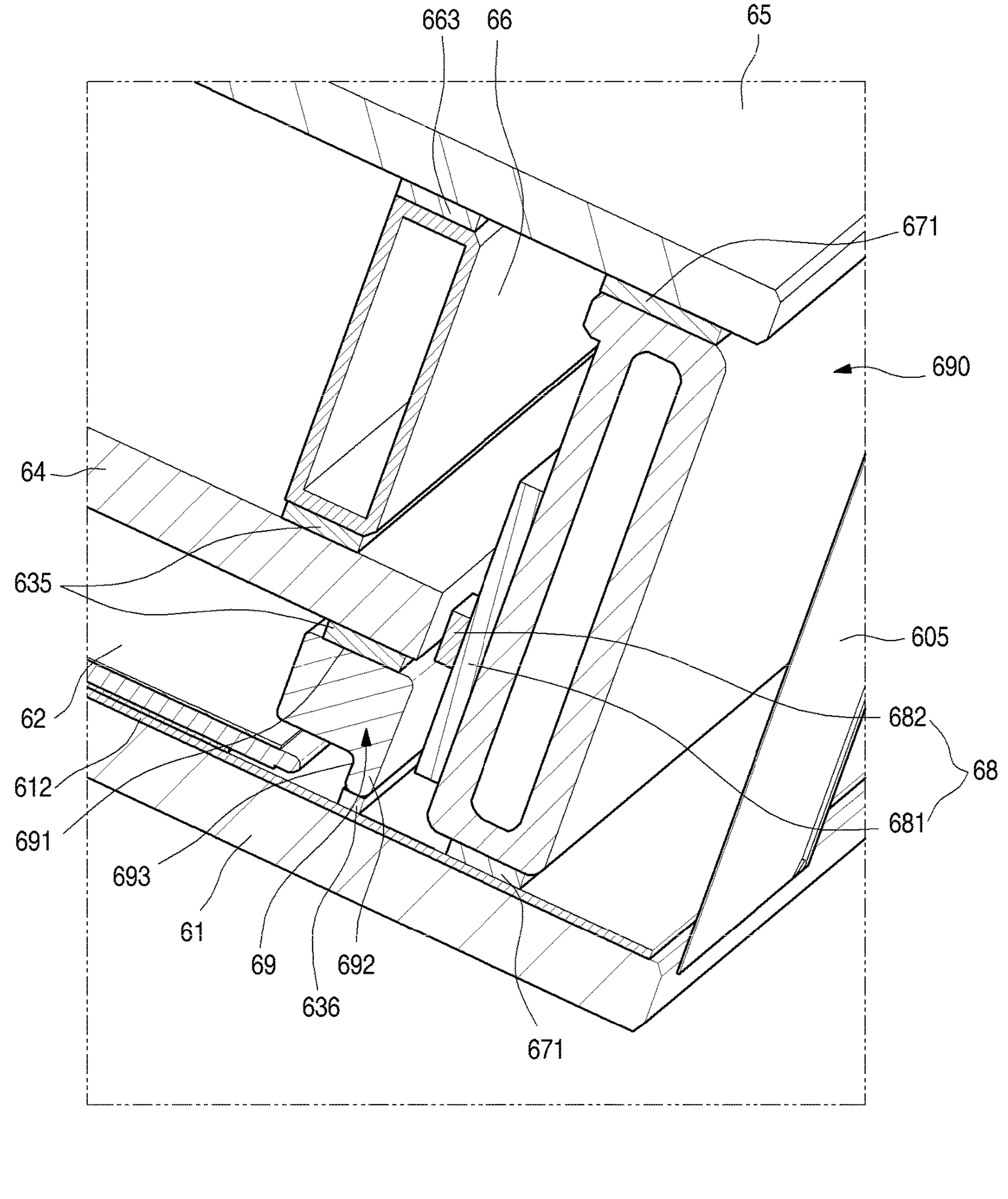
FIG. 34 is a cutaway perspective view illustrating a lower portion of the transparent display assembly.

FIG. 32 is an exploded perspective view of the transparent display assembly according to a second embodiment. Also, FIG. 33 is a perspective view illustrating the first spacer of the transparent display assembly. Also, FIG. 34 is a cutaway perspective view of the transparent display assembly.

As illustrated in the drawings, a transparent display assembly 60 according to the second embodiment may have an outer appearance defined by a front panel 61, and a touch sensor 612 is disposed on a rear surface of the front panel 61. A touch cable 601 may extend upward on an upper end of the touch sensor 612.

Also, the outer spacer 67 may be mounted around a rear surface of the front panel 61. The outer spacer may have a rectangular frame shape and define a space for accommodating the first spacer 69 in a state of being spaced apart from the first spacer 69. A display 62 may be disposed on the rear surface of the front panel 61 inside the outer spacer 690. Also, a display light 68 may be disposed on each of upper and lower ends of the outer spacer 690 to emit light to upper and lower ends of the light guide plate 64.

Also, the first spacer 69 may be disposed around the outside of the display 62. The first spacer 69 may have a rectangular frame shape and adhere to the rear surface of the front panel 61 inside the outer spacer 67. The first spacer 69 may include a pair of side parts 695 and upper and lower parts 696 and 697 connecting upper and lower ends of the pair of side parts 695 to each other.

Also, a light guide plate seating part 691 that is stepped to allow the light guide plate 64 to be seated thereon may be disposed on an inner surface of the first spacer 69. The light guide plate seating part 691 may be disposed on the pair of side parts 695 of the first spacer 69 to support both ends of the light guide plate 64. The light guide plate 691 may be disposed around the entire circumference of the first spacer 69 to support the entire circumference of the light guide plate 64.

The support member 698 may be attached to all of the side parts 692, the upper part 696, and the lower part 697. That is, the support member 698 may adhere to the light guide plate seating part 691 disposed on the side part 692 and the upper and lower parts 696 and 697 coming into contact with the upper and lower ends of the light guide plate 64. Also, the support member 698 may have a rectangular frame shape like the shape of the first spacer 69.

Also, a stop rib 692 vertically protruding may be disposed on an outer end of the light guide plate seating part 691. The stop rib 692 may extend to support the both ends of the light guide plate 64 from the outside. Also, a surface opposite to the light guide plate seating part 691 may be fixed and mounted on the front panel 61 by an adhesion member 636. Also, a display accommodation groove 693 in which an end of a display 62 is accommodated may be defined in the surface opposite to the light guide plate 64.

A source board 621 laterally protrudes from one end of the display 62 to pass between the first spacer 69 and the front panel 61 and protrude outward. The source board 621 may be bent between the first spacer 69 and the outer spacer 67 and disposed perpendicular to the front panel 61 and then connected to a display cable 605.

A rear panel 65 may adhere to the outer spacer 67 by the adhesion member 671 and then be fixed while being maintained at a predetermined distance with respect to the front panel 61. Also, a second spacer 66 may be fixed to the rear panel 65 by using the adhesion member 663. The support member 635 coming into contact with the light guide plate 64 may be attached to the other side of the second spacer 66.

Thus, when the rear panel 65 and the front panel 61 are coupled to each other, the support member 635 of the second spacer 66 may push and support one surface of the light guide plate 64. Also, the support member 635 attached to the first spacer 69 may also push and fix the other surface of the light guide plate 64.

That is, the light guide plate 64 may be fixed and mounted on the transparent display assembly 60, and a circumferential surface of the light guide plate 64 may be closely attached by the support member 635. Thus, the light guide plate may be finely movable. Also, the support member 635 may be made of a silicon material having a soft surface to prevent scratches from occurring in a surface of the light guide plate 64 when the light guide plate 64 moves.

Also, although not shown in detail, a light guide plate stopper **675*a* may be further disposed on the display light 68 like the foregoing embodiment. The light guide plate stopper 683 may support an end of the light guide plate 64 when the light guide plate 64 moves. Thus, an LED 682 or an LED board 681 may come into contact with the light guide plate 64 to prevent the LED 682** from being damaged.

In addition to the foregoing embodiment, a refrigerator according to various embodiments may be exemplified.

According to a third embodiment, an insulation panel is further provided between a light guide plate and a rear panel. Thus, the third embodiment is the same as the foregoing embodiments except for an insulation panel and a structure of a spacer supporting the insulation panel, and thus, other constituents are the same as those of the foregoing embodiments. Also, in the current embodiment, the same constituent as those of the abovementioned embodiments will be denoted by the same reference numeral, and its detailed description will be omitted.

Figure 35:
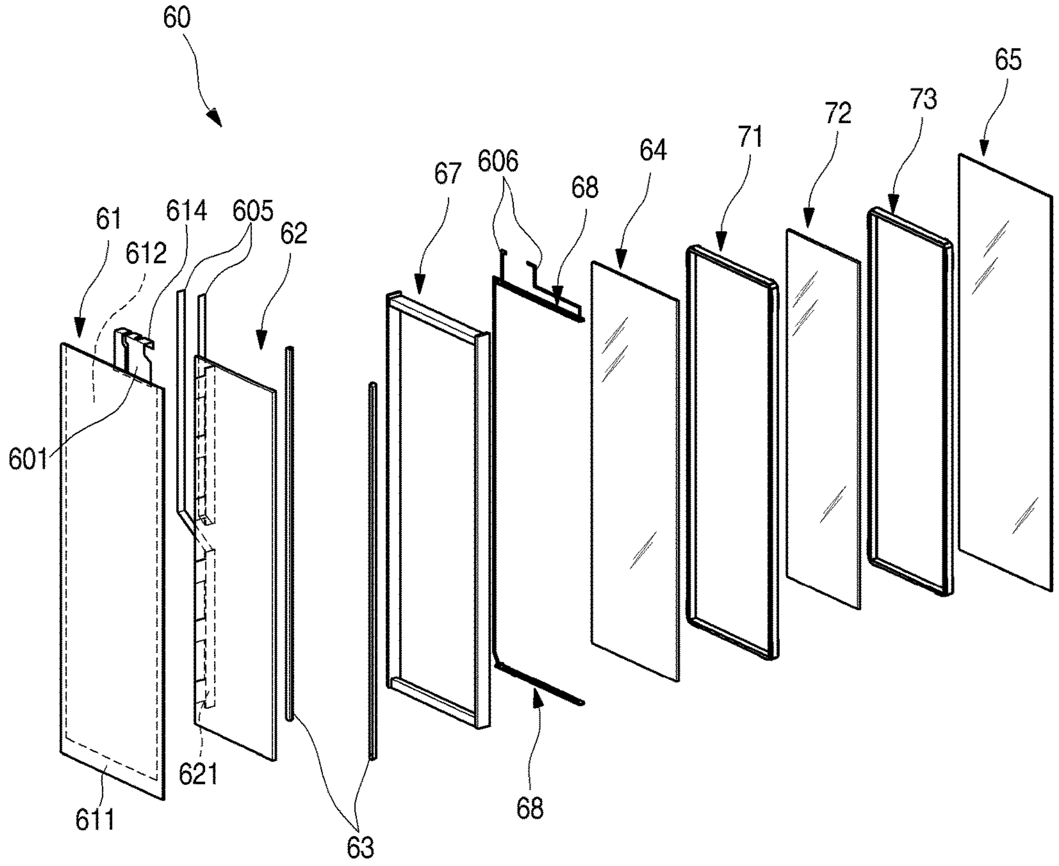
FIG. 35 is an exploded perspective view of a transparent display assembly according to a third embodiment.
Figure 36:
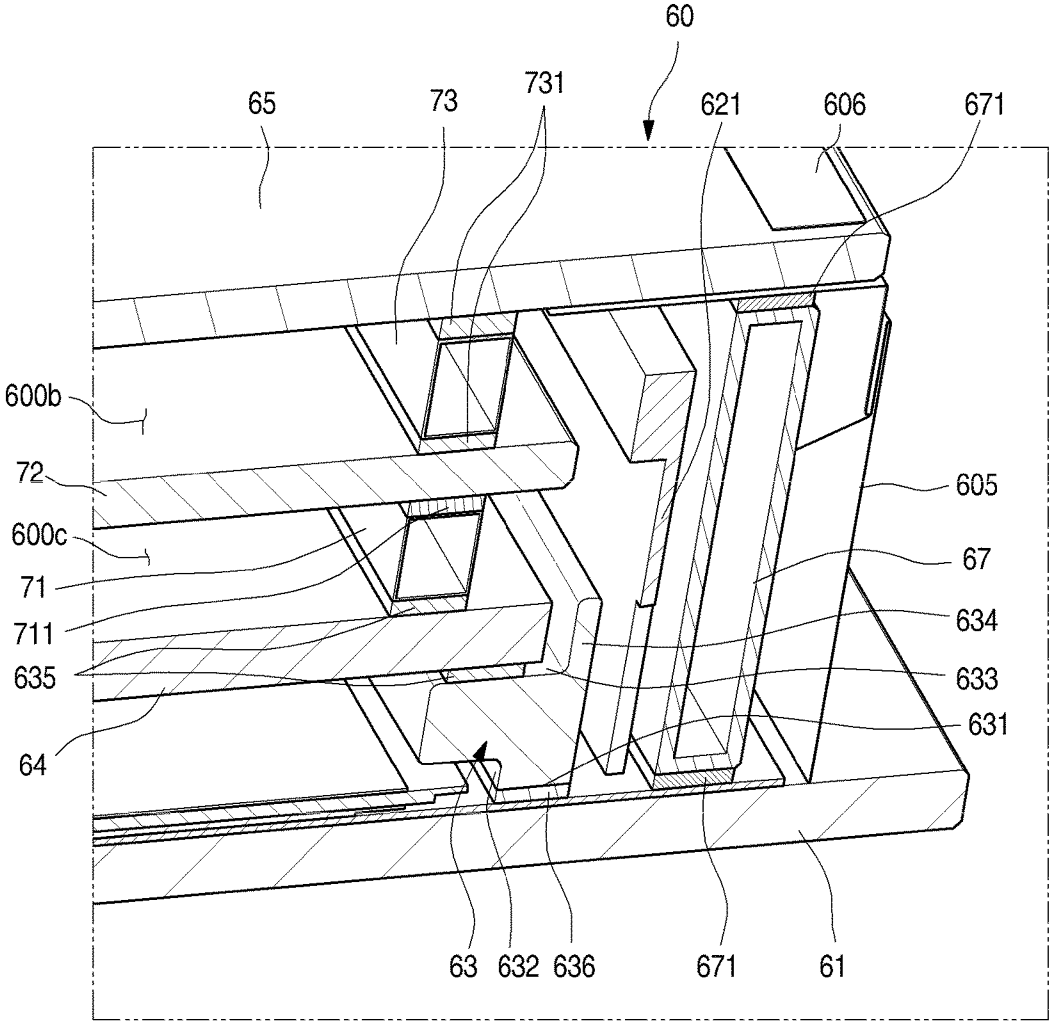
FIG. 36 is a cutaway perspective view illustrating a side end of the transparent display assembly.

FIG. 35 is an exploded perspective view of a transparent display assembly according to a third embodiment. Also, FIG. 36 is a cutaway perspective view of the transparent display assembly.

As illustrated in the drawings, a transparent display assembly 60 according to the third embodiment may have an outer appearance defined by a front panel 61, and a touch sensor 612 is disposed on a rear surface of the front panel 61. A touch cable 601 may extend upward on an upper end of the touch sensor 612.

Also, a display 62 is disposed on a rear surface of the touch sensor 612, and a first spacer 63 is disposed on each of both left and right sides of the display 62. The first spacer 63 may support both ends of a light guide plate 64, and the light guide plate 64 and the display 62 may be maintained to be spaced a predetermined distance from each other.

Here, since the light guide plate 64 is expanded or contracted by heat generated by a display light 68, a display 62, or a wire or PCB connected to the display 62, an end of a circumference of the light guide plate 64 may not be completely fixed, but is supported to come into contact with the support member 635 provided on the first spacer 63. Also, a surface opposite to one surface of the light guide plate 64 supported by the first spacer 63 may be supported by a third spacer. Thus, the light guide plate 64 may be supported by the support member 635 disposed on one surface of the third spacer 71 to come into contact with the light guide plate 64.

A source board 621 laterally protrudes from one end of the display 62 to pass between the first spacer 63 and the front panel 61 and protrude outward. The source board 621 may be bent between the first spacer 63 and the outer spacer 67 and disposed perpendicular to the front panel 61 and then connected to a display cable 605.

The outer spacer 67 is disposed outside the first spacer 63. Also, the outer spacer 67 may support upper and lower ends of the light guide plate 64. Also, a display light 68 mounted on each of upper and lower ends of and inner surface of the outer spacer 67 may emit light to upper and lower ends of the light guide plate 64. A display light cable 606 is connected to the display light 68.

A third spacer 71 having a rectangular frame shape is disposed on a rear surface of the light guide plate 64. An insulation panel 72 may be fixed to be maintained at a predetermined distance with respect to the light guide plate 84 by the spacer 71. In detail, the third spacer 71 may have the same structure as the second spacer 66 according to the foregoing embodiment except for a thickness of the third spacer 71. That is, since an insulation panel 72 has to be added while maintaining the total thickness of the transparent display assembly 60, the third spacer 71 may have a thickness less than that of the second spacer 66.

Also, the insulation panel 72 may have the same structure as the rear panel 65 and include a separate insulation coating layer on a glass layer to improve thermal insulation performance. Thus, the transparent display assembly 60 according to the third embodiment may be improved in thermal insulation performance. An insulation coating layer may be further disposed on the rear panel to more improve the thermal insulation performance.

A fourth spacer 73 may be disposed on a rear surface of the insulation panel 72. The rear panel 65 may adhere to a rear surface of the fourth spacer 73 to maintain a preset distance between the insulation panel 72 and the rear panel 65. The fourth spacer 73 may be adequately designed according to a thickness of the third spacer 71. That is, the fourth spacer 73 may have a thickness at which the rear panel 65 adheres to the fourth spacer 73 and the rear surface of the outer spacer 67 when the rear panel 65 is mounted.

The rear panel 65 may adhere to the outer spacer 67 and then be fixed while being maintained at a predetermined distance with respect to the front panel 61. Also, the display 62, the first spacer 63, the light guide plate 64, the third spacer 71, the insulation panel 72, and the fourth spacer 73 may be successively disposed in an inner region of the outer spacer 67 between the front panel 61 and the rear panel 65.

Also, a third insulation layer 600*c* may be provided by the third spacer 71 between the light guide plate 64 and the insulation panel 72. Also, a fourth insulation layer 600*b* may be provided by the insulation panel 72 and the fourth spacer 73. An inert gas such as an argon gas may be injected into the third and fourth insulation layers 600*c* and 600*b* to improve the thermal insulation performance.

Also, the whole space inside the outer spacer 67 may be seated to form the insulation layer. Substantially, the entire area of the transparent display assembly 60 may be thermally insulated to significantly improve the thermal insulation performance of the transparent display assembly 60. If the thermal insulation performance of the transparent display assembly 60 is satisfied, one of the third and fourth insulation layers 600*c* and 600*b* may be omitted.

In addition to the foregoing embodiment, a refrigerator according to various embodiments may be exemplified.

According to a fourth embodiment, a light guide plate stopper supporting a light guide plate protrudes from an outer spacer. Thus, the fourth embodiment is the same as the foregoing embodiments except for structures of the outer spacer and a display light, and thus, other constituents are the same as those of the foregoing embodiments. Also, in the current embodiment, the same constituent as those of the abovementioned embodiments will be denoted by the same reference numeral, and its detailed description will be omitted.

Figure 37:
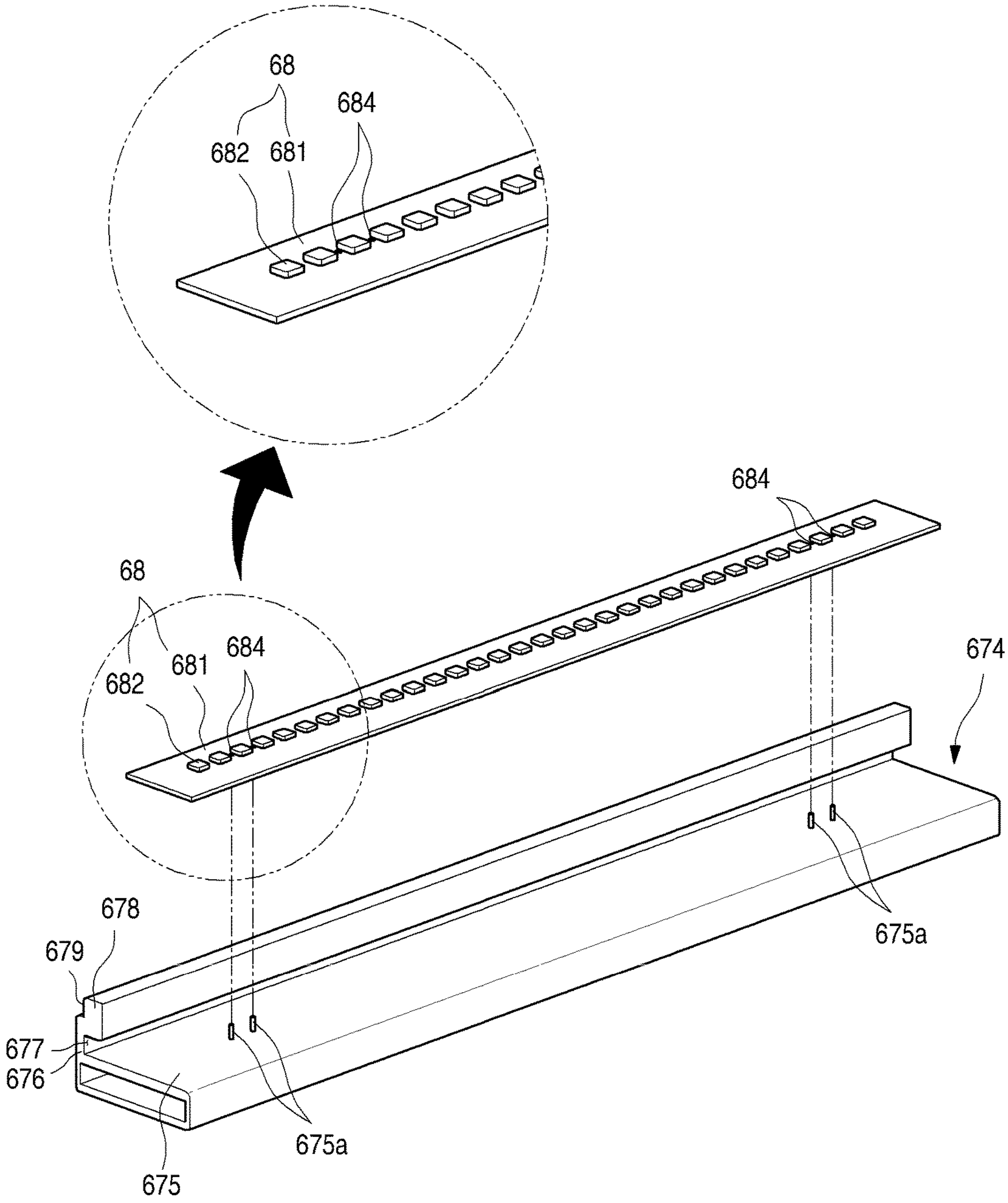
FIG. 37 is an exploded perspective view of an outer spacer according to a fourth embodiment.
Figure 38:
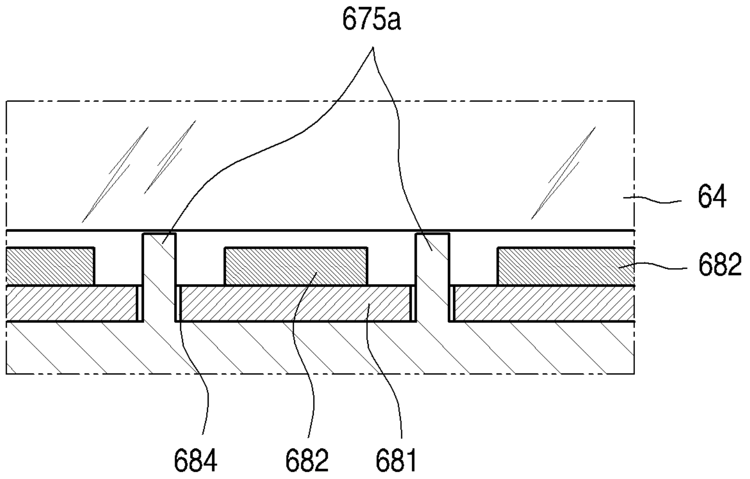
FIG. 38 is a cross-sectional view illustrating a lower portion of a transparent display assembly according to the fourth embodiment.

FIG. 37 is an exploded perspective view of an outer spacer according to a fourth embodiment. Also, FIG. 38 is a cross-sectional view illustrating a lower portion of a transparent display assembly according to the fourth embodiment.

As illustrated in the drawings, the outer spacer 67 according to the fourth embodiment may include a frame side 672, a frame upper 673, and a frame lower 674 like the first embodiment. Also, a display light 68 emitting light to an end of the light guide plate 64 may be mounted on the frame lower 674.

In more detail, the display light 68 may include a plurality of LEDs 682 and an LED board 681 on which the plurality of LEDs 682 are mounted. The LEDs 682 may be disposed to face a lower end of the light guide plate 64 and successively disposed at a predetermined interval along the end of the light guide plate 64. Also, a stopper hole 684 may be further defined in the LED board 681 within a space between the plurality of LEDs 682. A light guide plate stopper 685*a* that will be described below may pass through the stopper hole 684 and then be exposed.

Also, both ends of a frame lower 674 constituting the outer spacer 67 may be mounted on a front panel 61 and a rear panel 65 and include a display mounting part 675, on which the display light 68 is mounted, therein. The display mounting part 675 may define top and bottom surfaces of the transparent display assembly 60 and have an inner surface with a plane shape.

Also, a light guide plate stopper 675*a* protruding upward may be further disposed on the light mounting part 675. The light guide plate stopper 675*a* may protrude upward from one side of the light mounting part 675 to correspond to the stopper hole 684. Also, the light guide plate stopper 675*a* may be integrally molded with the frame lower 674.

The light guide plate stopper 675*a* may pass through the stopper hole 684. In a state in which the LED board 681 is mounted, the light guide plate stopper 675*a* may further protrude upward than the LED 682. Thus, in the state in which the light guide plate 64 is mounted, when the light guide plate 64 moves, the lower end of the light guide plate 64 may be folded and supported by the light guide plate stopper 675*a*.

When the display light 68 is mounted, the LED board 681 may be disposed on the light mounting part 675. When the light guide plate stopper 675*a* is mounted to pass through the stopper hole 684, the display light 68 may be arranged and mounted in a fixed position, and the LEDs 682 may be disposed under the light guide plate 84 to emit light to the end of the light guide plate 64.

A connection part 676 connected to the light guide support part 678 spaced apart from the connection part 676 may be disposed at a rear end of the light mounting part 675. Also, the light mounting part 675 and the light guide plate support part 678 may be spaced apart from each other by the connection part 676 to provide a light accommodation part 677. Also, a stepped part 679 may be stepped on an end facing the light guide support part 678.

A frame upper 673 defining an upper end of the outer spacer 67 may have the same structure as the frame lower 674.

In addition to the foregoing embodiment, a refrigerator according to various embodiments may be exemplified.

According to a fifth embodiment, a light guide plate stopper supporting a light guide plate is inserted into and mounted on an LED board. Thus, the fifth embodiment is the same as the foregoing embodiments except for a structure of a display light, and thus, other constituents are the same as those of the foregoing embodiments. Also, in the current embodiment, the same constituent as those of the abovementioned embodiments will be denoted by the same reference numeral, and its detailed description will be omitted.

Figure 39:
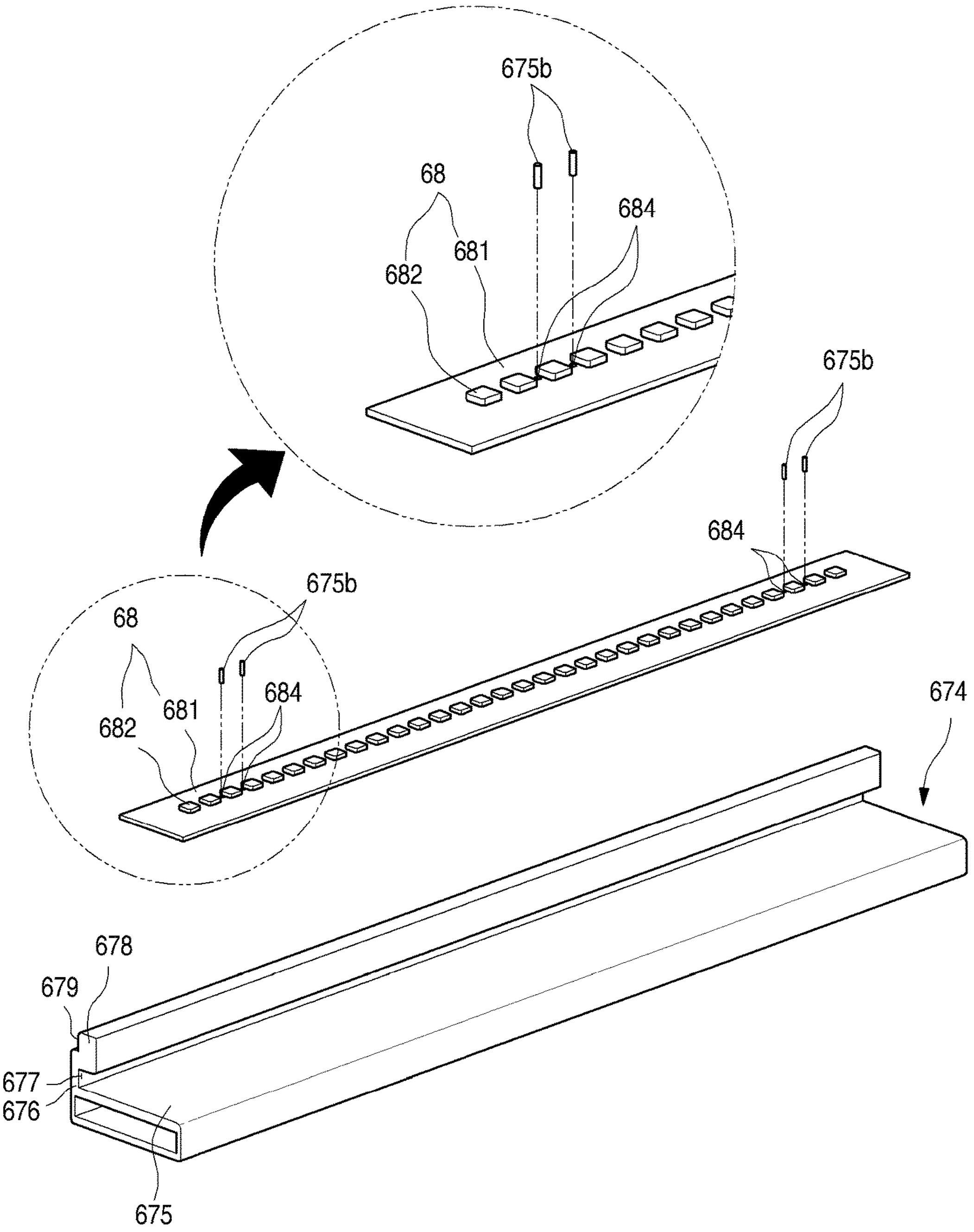
FIG. 39 is an exploded perspective view of an outer spacer according to a fifth embodiment.
Figure 40:
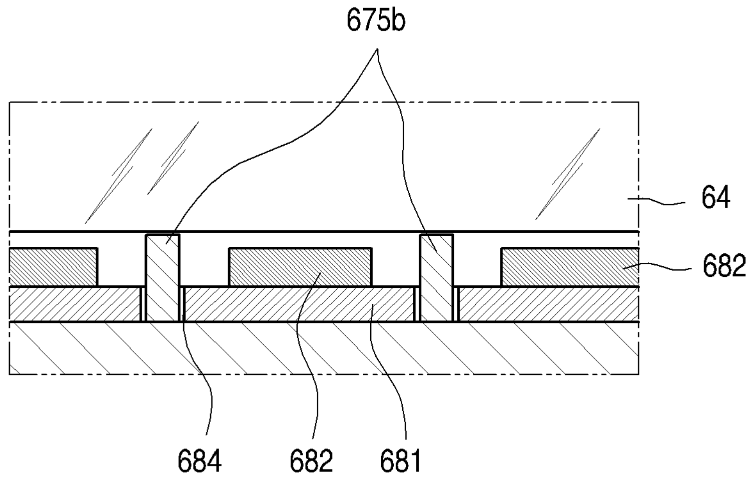
FIG. 40 is a cross-sectional view illustrating a lower portion of a transparent display assembly according to the fifth embodiment.

FIG. 39 is an exploded perspective view of an outer spacer according to a fifth embodiment. Also, FIG. 40 is a cross-sectional view illustrating a lower portion of a transparent display assembly according to the fifth embodiment.

As illustrated in the drawings, a display light 68 emitting light to an end of the light guide plate 64 may be mounted on a frame lower 674 of an outer spacer 67 according to the fifth embodiment.

In more detail, the display light 68 may include a plurality of LEDs 682 and an LED board 681 on which the plurality of LEDs 682 are mounted. The LEDs 682 may be disposed to face a lower end of the light guide plate 64 and successively disposed at a predetermined interval along the end of the light guide plate 64. Also, a stopper hole 684 may be further defined in the LED board 681 within a space between the plurality of LEDs 682. A light guide plate stopper 685*a* may pass through the stopper hole 684 and then be exposed. Also, the stopper hole 684 may be defined between the LEDs 682.

The light guide plate stopper 675*b* may come into contact with the lower end of the light guide plate 64 to support the light guide plate 64 upward. The light guide plate stopper 675*b* may be provided as a rod or block shape having a predetermined height and have a shape that is inserted into the stopper hole 684.

The light guide plate stopper 675*b* may be inserted and mounted into the stopper hole 684 in a state in which the display light 68 is mounted. Here, a protruding height of the light guide plate stopper 675*b* may be greater than a height of the LED 682. Also, the light guide plate stopper 675*b* may be provided in plurality, and the plurality of light guide plate stoppers 675*b* may be respectively disposed on both left and right sides of the LED board 681.

Also, both ends of a frame lower 674 constituting the outer spacer 67 may be mounted on a front panel 61 and a rear panel 65 and include a display mounting part 675, on which the display light 68 is mounted, therein. The display mounting part 675 may define top and bottom surfaces of the transparent display assembly 60 and have an inner surface with a plane shape.

When the display light 68 is mounted, the LED board 681 may be mounted on a light mounting part 675. The display light 68 may be aligned and mounted at a fixed position, and the LEDs 682 may be disposed below the light guide plate 64 to emit light to the end of the light guide plate 64. Also, the light guide plate stopper 675*a* may be inserted into the stopper hole defined in the LED board 681 to further protrude from the LED 682.

A connection part 676 connected to the light guide support part 678 spaced apart from the connection part 676 may be disposed at a rear end of the light mounting part 675. Also, the light mounting part 675 and the light guide plate support part 678 may be spaced apart from each other by the connection part 676 to provide a light accommodation part 677. Also, a stepped part 679 may be stepped on an end facing the light guide support part 678.

A frame upper 673 defining an upper end of the outer spacer 67 may have the same structure as the frame lower 674.

The following effects may be expected in the refrigerator according to the proposed embodiments.

In the refrigerator according to the embodiments, the see-through part that sees the accommodation space may be provided in the door. The see-through part may include the transparent display and be selectively transparent or opaque according to the turn-on/off of the door light and the display light. Thus, the user may confirm the accommodation space through the see-through part by the user's manipulation without opening the door to improve the user's convenience and reduce the power consumption.

Also, in the see-through part, the display may operate according to the user's manipulation to display various screens and thereby to provide various pieces of information for the user's convenience and allow the user to input the manipulation thereof, thereby improving the user's convenience.

Also, the cables connected to the electric components of the transparent display assembly may have the flexible structure as the flat type cable. Thus, the cables may easily access between the transparent display assembly having the structure in which the plurality of panels are laminated, and the sealed state may be maintained.

Also, the cables may be bent and thus closely attached to the circumference of the transparent display assembly. Thus, the door may have the compact structure, and the interface with the insulation material may be minimized.

Also, the PCB for controlling the electric components of the transparent display assembly may be disposed at the upper, lower, or left/right sides of the transparent display assembly. In addition, since the cables connected to the PCB are also disposed along the circumference of the transparent display assembly, the PCB or the cables may not be exposed to the outside through the transparent display assembly. That is, the inside of the refrigerator may be seen through the transparent display assembly that is capable of outputting the screen. Here, the interference with the PCB or the cables may be prevented.

Also, the sealed space may be defined between the front panel and the rear panel by the outer spacer connecting the front panel to the rear panel of the transparent display assembly. Here, the insulation layer may be provided by the sealed space to insulate the inner space of the refrigerator from the outside of the refrigerator and prevent the dew condensation from being generated on the surface and the inside of the transparent display assembly.

Also, the first spacer supporting the light guide plate may be disposed on each of both left and right surfaces of the light guide plate, and the outer spacer in which the display light is provided may be disposed above and below the light guide plate to support the upper and lower ends of the light guide plate. Thus, the light guide plate may be stably supported, and also, the display light may emit light to the end of the light guide plate.

Also, the stop rib that vertically protrudes may be disposed on each of both left and right ends of the first spacer to maintain the light guide plate to the predetermined mounted state without going out of the space between the first spacers even though the door is opened and closed.

Also, the support member made of the silicon material may be disposed on the first and second spacers supporting the light guide plate to support and fix the light guide plate to both surfaces by using the support member. Thus, the light guide plate may be disposed inside the fixed position without completely adhering and fixing the circumferential portion of the light guide plate due to the characteristics of the light guide plate that is expandable and contractible according to the temperature.

Also, the switching impact of the door may occur due to the structural characteristics of the light guide plate provided in the door. In addition, an impact may be applied when the door or the transparent display assembly is manufactured and carried. However, the impact may be buffered by the support member supporting the light guide plate to prevent the light guide plate from being damaged.

Particularly, the occurrence of the scratches in the surface of the light guide plate may be prevented by supporting the light guide plate through the support member when the light guide plate moves. Thus, the light guided through the light guide plate may be prevented from being irregularly reflected by the scratches to prevent the defects from occurring.

Also, the heat of the display light or the display may be prevented from being directly transferred through the spacer due to the support member to prevent the light guide plate from being deformed by the transferred heat.

Also, the transparent display assembly may have the sealed space therein by the outer spacer connecting the front panel to the rear panel. Also, the display and the light guide plate may be accommodated in the inner space of the outer spacer to provide the multilayered panel structure.

As described above, in the multilayered panel structure, the multilayered inner space may be sealed by the sealing structure due to the outer spacer may be naturally realized. In addition, although the multilayered panel structure is further provided in the inner space of the outer spacer, the entire sealing of the transparent display assembly may be achieved by only the sealing of the outer spacer to improve the thermal insulation performance and the assemblability.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A refrigerator comprising:

a cabinet defining a storage space;

a door configured to open and close at least a portion of the cabinet, the door defining an opening; and a transparent display assembly that covers the opening of the door and that allows an inner space behind the transparent display assembly of the refrigerator to be visible through the transparent display assembly, wherein the transparent display assembly comprises:

a front panel defining at least a portion of a front surface of the door, a rear panel defining at least a portion of a rear surface of the door, an outer spacer defining a circumferential surface of the transparent display assembly, the outer spacer having first and second ends that contact the front panel and the rear panel, respectively, and that define a sealed space between the front panel and the rear panel, a display disposed inside the sealed space, a light guide plate disposed inside the sealed space and spaced apart from the display, a display light configured to emit light to an end of the light guide plate, a first spacer mounted on a rear surface of the front panel, and configured to support the light guide plate and maintain a predetermined distance between the light guide plate and the front panel, an insulation panel disposed between the light guide plate and the rear panel; and an inner spacer adhered to the insulation panel and the rear panel by adhesion members and configured to define an insulation space between the insulation panel and the rear panel, wherein the insulation space is provided inside of the sealed space.

2. The refrigerator according to claim 1, further comprising a support member provided on the first spacer, the support member defining a surface that contacts the light guide plate.

3. The refrigerator according to claim 2, wherein the support member comprises a material that has a hardness less than a hardness of the light guide plate.

4. The refrigerator according to claim 2, wherein the support member comprises a thermal insulation material.

5. The refrigerator according to claim 2, wherein the first spacer includes a pair of spacers located at both sides of the light guide plate, wherein the pair of spacers include a light guide plate seating part that is configured to seat the support member and thereby support first and second ends of the light guide plate, and wherein the outer spacer includes a light guide plate support part that is disposed on upper and lower ends of the outer spacer, that protrudes rearward, and that is configured to support upper and lower ends of the light guide plate.

6. The refrigerator according to claim 5, wherein the light guide plate support part has a height equal to a height of the light guide plate seating part, and wherein the light guide plate support part and the light guide plate seating part are configured to support a circumference of the light guide plate.

7. The refrigerator according to claim 5, wherein the display light is disposed on an inner surface of the outer spacer, and wherein the display light is disposed on an extension line of the upper end or the lower end of the light guide plate based on the light guide plate support part supporting the light guide plate.

8. The refrigerator according to claim 5, wherein the support member includes the light guide plate support part.

9. The refrigerator according to claim 5, wherein the first spacer extends from an upper end to a lower end of an inside of the outer spacer.

10. The refrigerator according to claim 1, wherein the first spacer is spaced apart from the outer spacer, and wherein the refrigerator further comprises a source board connected to the display and disposed between the first spacer and the outer spacer, the source board having a surface oriented perpendicular to the front panel.

11. The refrigerator according to claim 10, further comprising a wire connecting the display to the source board, the wire passing between the front panel and an adhesion member of the outer spacer.

12. The refrigerator according to claim 1, wherein the first spacer comprises:

a light guide plate seating part configured to seat the end of the light guide plate; and a stop rib protruding from an outer end of the light guide plate seating part in a direction crossing the light guide plate, the stop rib being configured to restrict a transverse movement of the light guide plate.

13. The refrigerator according to claim 12, wherein the stop rib protrudes from a position spaced apart from the end of the light guide plate, and wherein the stop rib is configured to deform based on deformation of the light guide plate.

14. The refrigerator according to claim 12, further comprising a display accommodation groove defined between the front panel and a stepped surface of the first spacer, the display accommodation groove being configured to receive an outer end of the display.

15. The refrigerator according to claim 1, wherein the first spacer comprises:

a side part configured to support each of first and second ends of the light guide plate;

upper and lower parts that are configured to connect an upper end of the side part to a lower end of the side part and support upper and lower ends of the light guide plate, respectively; and a support member disposed along the side part and the upper and lower parts, the support member having a surface configured to contact the light guide plate.

16. The refrigerator according to claim 15, wherein the display light is mounted on one surface of the outer spacer and spaced apart from the upper and lower parts of the first spacer, and wherein the display light faces the upper end or the lower end of the light guide plate based on the upper and lower parts of the first spacer supporting the guide plate.

17. The refrigerator according to claim 1, further comprising a second spacer that is disposed between the rear panel and the light guide plate along a circumference of the light guide plate, and that is configured to maintain a distance between the rear panel and the light guide plate.

18. The refrigerator according to claim 17, further comprising:

a first support member disposed on one end of the first spacer and configured to contact a first side of the light guide plate;

a second support member disposed on one end of the second spacer and configured to contact a second side of the light guide plate; and an adhesion member disposed on the other end of the second spacer and configured to attach the second spacer to the rear panel.

19. The refrigerator according to claim 18, wherein both ends of the outer spacer are mounted on the front panel and the rear panel, respectively, and wherein the first support member is configured to press and support the light guide plate in a first direction, and wherein the second support member is configured to press and support the light guide plate in a second direction opposite the first direction.

20. The refrigerator according to claim 17, wherein the second spacer is configured to seal a space defined between the rear panel and the light guide plate.

* * * * *